US008704209B2

(12) United States Patent
Choi

(10) Patent No.: US 8,704,209 B2
(45) Date of Patent: Apr. 22, 2014

(54) PHOTODETECTORS USING RESONANCE AND METHOD OF MAKING

(75) Inventor: Kwong-Kit Choi, Brookeville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 12 days.

(21) Appl. No.: 13/240,125

(22) Filed: Sep. 22, 2011

(65) Prior Publication Data

US 2012/0012816 A1     Jan. 19, 2012

Related U.S. Application Data

(63) Continuation-in-part of application No. 13/082,945, filed on Apr. 8, 2011, now abandoned, which is a continuation-in-part of application No. 12/543,121, filed on Aug. 18, 2009, now abandoned.

(51) Int. Cl.
*H01L 31/0232*     (2006.01)
*G06F 9/455*     (2006.01)

(52) U.S. Cl.
USPC ............................................. 257/14; 716/106

(58) Field of Classification Search
USPC .............................................. 716/106; 257/14
See application file for complete search history.

(56) References Cited

U.S. PATENT DOCUMENTS

| 5,485,015 | A | 1/1996 | Choi |
| 6,469,358 | B1 | 10/2002 | Martin |
| 7,217,926 | B1 | 5/2007 | Choi |
| 2006/0009956 | A1* | 1/2006 | Winckel et al. .................. 703/2 |

OTHER PUBLICATIONS

Wilson, "Electromagnetic modeling of multi-wavelength QWIP optical coupling structures," Jun. 6, 2009, Infrared Physics & Technology, 52 (2009), pp. 224-228.*
K. K. Choi, et al. "Detection wavelength of InGaAs/AlGaAs quantum wells and superlattices," J. Appl. Phys., vol. 91, No. 2, pp. 551-564, Jan. 2002.
M. Sundaram, et al. "Two-color quantum well infrared photodetector focal plane arrays," Infrared Phys. Technol., vol. 42, No. 3-5, pp. 301-308, Jun. 2001.
O. Schreer, et al. "Dual-band camera system with advanced image processing capability," Proc. SPIE, vol. 6542, pp. 654 21C 1-654 21C 7, 2006.
E. Costard,et al. "Two color QWIP and extended wavebands," Proc. SPIE, vol. 6542, p. 654 20X, 2007.

(Continued)

*Primary Examiner* — Matthew W Such
*Assistant Examiner* — Robert Carpenter
(74) *Attorney, Agent, or Firm* — Lawrence E. Anderson

(57) ABSTRACT

An infrared photodetector comprising: a thin contact layer substantially transparent to infrared light; an absorption layer positioned such that light admitted through the substantially transparent thin contact area passes through the absorption layer; the absorption layer being configured to utilize resonance to increase absorption efficiency; at least one reflective side wall adjacent to the absorption layer being substantially non-parallel to the incident light operating to reflect light into the absorption layer for absorption of infrared radiation; and a top contact layer positioned adjacent to the active layer. A method of designing a photodetector comprising selecting a type of material based upon the wavelength range to be detected; determining a configuration geometry; calculating the electromagnetic field distributions using a computer simulated design of the configuration geometry, and determining a quantum efficiency spectrum at the desired wavelength or wavelength range; whereby the effectiveness of the photodetector is simulated prior to fabrication.

11 Claims, 68 Drawing Sheets
(60 of 68 Drawing Sheet(s) Filed in Color)

(56) References Cited

OTHER PUBLICATIONS

M. Kaldirim, et al. "Largeformat voltage-tunable dual-color midwavelength infrared quantum-well infrared photodetector focal plane array," IEEE Photon. Technol. Lett., vol. 20, No. 9, pp. 709-711, May 2008.

C. C. Chen, et al. "Multicolor infrared detection realized with two distinct superlattices separated by a blocking barrier," Appl. Phys. Lett., vol. 80, No. 13, pp. 2251-2253, Apr. 2002.

A. Majumdar, et al. "Voltage tunable twocolor infrared detection using semiconductor superlattices," Appl. Phys. Lett., vol. 83, No. 25, pp. 5130-5132, Dec. 2003.

K. K. Choi, et al. "C-QWIP material design and growth," in Proc. SPIE, vol. 6542, 2007, pp. 654 20S 1-654 20S 11.

M. D. Jhabvala, et al., "Development of a 1 megapixel far-IR QWIP focal plane array," in Proc. SPIE, vol. 6542, 2006, pp. 654 20T 1-654 20T 11.

De Rossi, et al. "Effects of finite pixel size on optical coupling in QWIPs," Inf. Phys. and Tech., vol. 44, pp. 325-330, 2003.

Andersson, et al., "Near-unity quantum efficiency of AlGaAs/GaAs quantum well infrared detectors using a waveguide with a doubly periodic grating coupler," Appl. Phys. Lett., vol. 59, pp. 857-859, (1991).

Chen, et al. "Corrugated quantum well infrared photodetectors for normal incident light coupling," Appl. Phys. Lett., vol. 69, pp. 1446-1448 (1996).

Choi, et al., "Corrugated quantum well infrared photodetectors for material characterization." J. Appl. Phys., vol. 88, pp. 1612-1623 (2000).

Yan, et al., "Electromagnetic modeling of quantum-well photodetectors containing diffractive elements," IEEE J. Quantum Electron., vol. 35, pp. 1870-1877 (1999).

Choi, et al., "Light coupling characteristics of corrugated quantum well infrared photodetectors," IEEE J. of Quan. Electr., vol. 40, pp. 130-142 (2004).

K. K. Choi, et al. "Detection Wavelength of InGaAs/AlGaAs quantum wells and superlattices," J. Appl. Phys., vol. 91, 551-564 (2002).

N. C. Das and K. K. Choi, "Enhanced corrugated QWIP performance using dielectric coverage," IEEE Trans. Elect. Dev., vol. 47, No. 3, pp. 653-655 (2000).

Choi, K.K., et al. "Optimization of corrugated-QWIPs for large format, high quantum efficiency, and multi-color FPAs," Infrared Physics & Technology 50 (2007) 124-135.

Choi, K.K., "Voltage-Tunable Two-Color Corrugated-QWIP Focal Plane Arrays," IEEE Electron Device Letters, vol. 29, No. 9, p. 1011, et seq., Sep. 2008.

Choi, K.K., et al. "Performance of corrugated quantum well infrared photodetectors," Proceedings vol. 3379 Infrared Detectors and Focal Plane Arrays V, Eustace L. Dereniak; Robert E. Sampson, Editors, pp. 441-452 (Jul. 22, 1998).

Forai, D.P., "Characterization of a C-QWIP LWIR Camera," Proceedings vol. 6543 Infrared Imaging Systems: Design, Analysis, Modeling, and Testing XVIII, Gerald C. Hoist, Editors, 654317, (Apr. 30, 2007).

Goldberg, et al., "Large Format and Multi-Spectral Qwip Infrared Focal Plane Arrays," Proc. SPIE 5014, Aerosense, Orlando, FL. Apr. 21-25, 2003.

Jhabvala, et al., "Development of a 1K x 1K GaAs QWIP Far IR Imaging Array," Proc. SPIE 5167, SPIE's 48th Annual Meeting, San Diego, CA Aug. 3-8, 2003.

\* cited by examiner

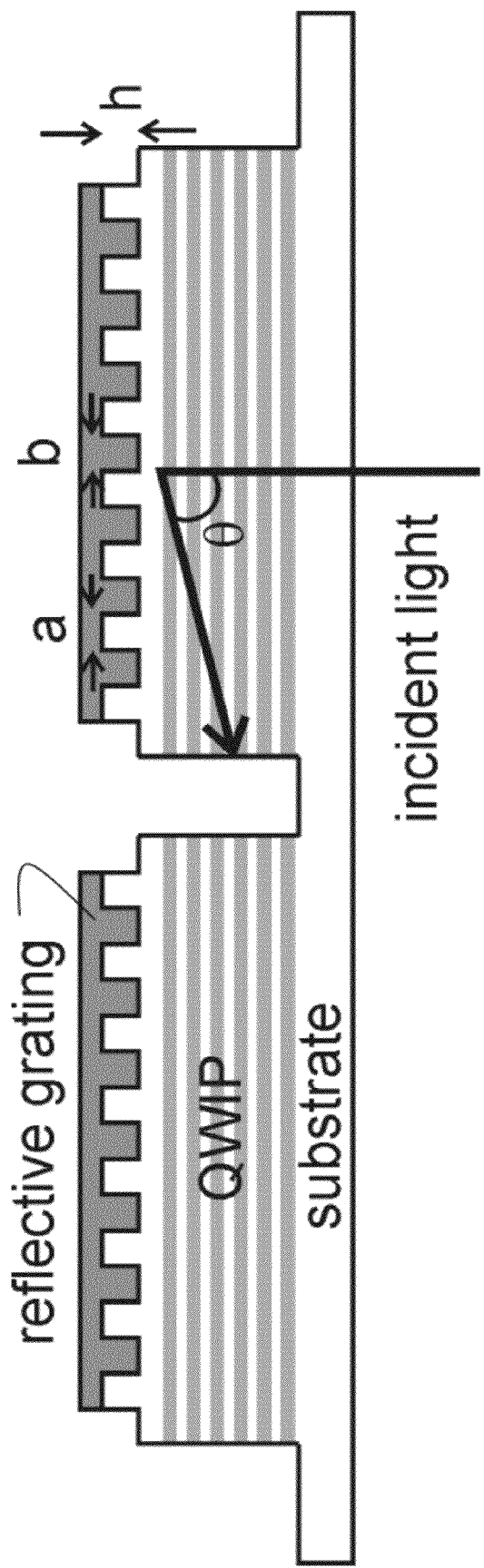
Fig.1 Grated coupled QWIP (PRIOR ART)

Schematic C-QWIP geometry with period p and common contact layer $t_g$. Wave interference is depicted for two C-QWIP pixels shown in cross-section.

The contour pattern shows the $E_z$ distribution of the optical field.

The contour pattern shows the $E_z$ distribution of the optical field.

Geometry of a PR-QWIP with an air cover and AR substrate coating. The $E_z$ distribution is shown at $\lambda = 9.0$ μm.

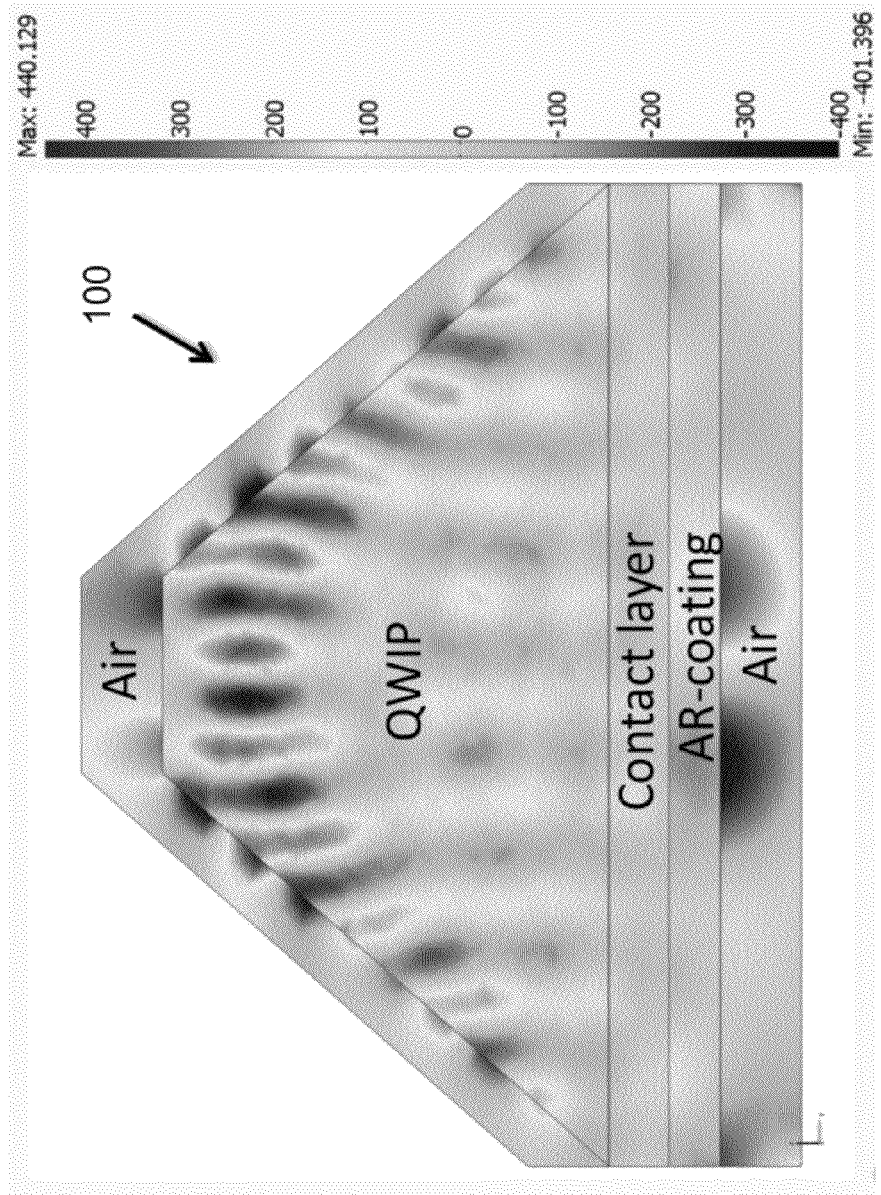
FIG. 6B Cross-section of $E_z$ distribution at $\lambda = 9.0$ μm for a PR-QWIP with air cover and AR substrate coating.

External unpolarized QE (for unity pixel fill factor) of a PR-QWIP (PRISM) for different pixel geometries.

External unpolarized QE (for unity pixel fill factor) of a PY-QWIP (Pyramid) for different pixel geometries.

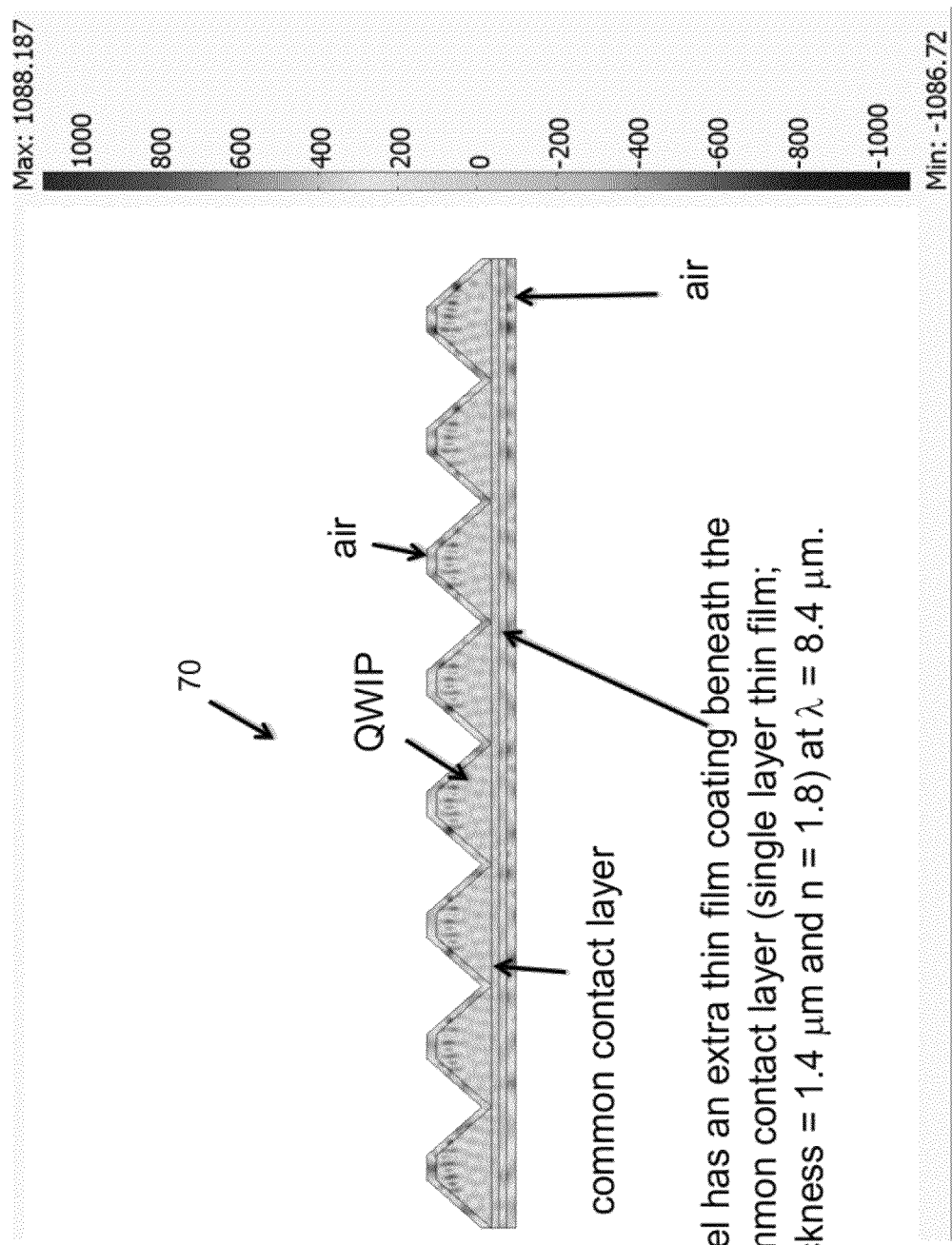
FIG. 8 $E_z$ distribution in PR-QWIPs with air cover.

Average magnification factor $M \equiv I_z/I_{inc}$ inside the C-QWIP with a thin film coating as a function of $\lambda$.

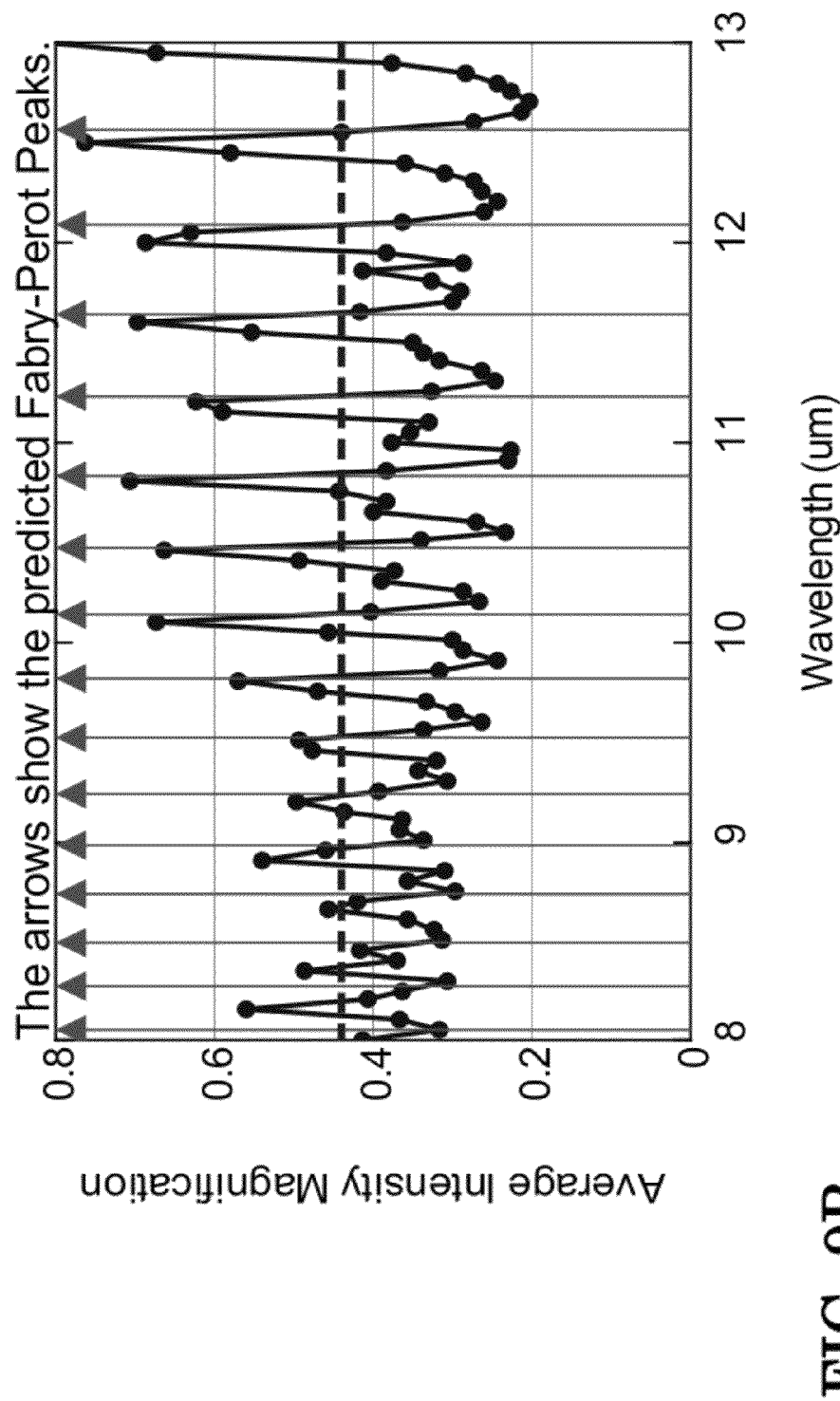
FIG. 9B Average magnification factor $M \equiv I_z/I_{inc}$ inside the PR-QWIP with reflecting layers and 36 μm common contact layer.

QE of a PR-QWIP with a 9 μm AR-coating.

The geometry of a PY-QWIP with air cover and AR substrate coating. The $E_z$ distribution is shown at $\lambda = 9.0$ μm.

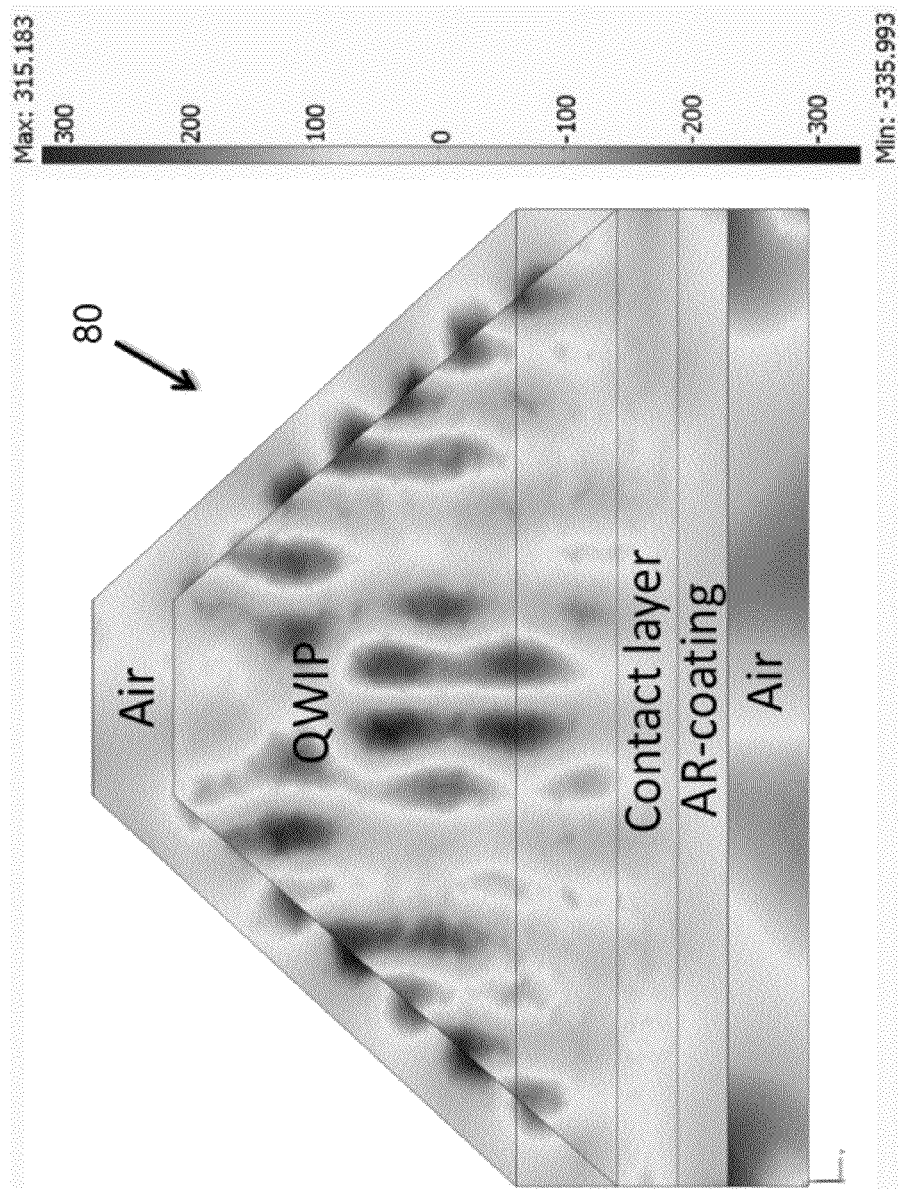
FIG. 13  Cross-section $E_z$ distribution at $\lambda = 9.0$ μm of the embodiment of FIG. 12.

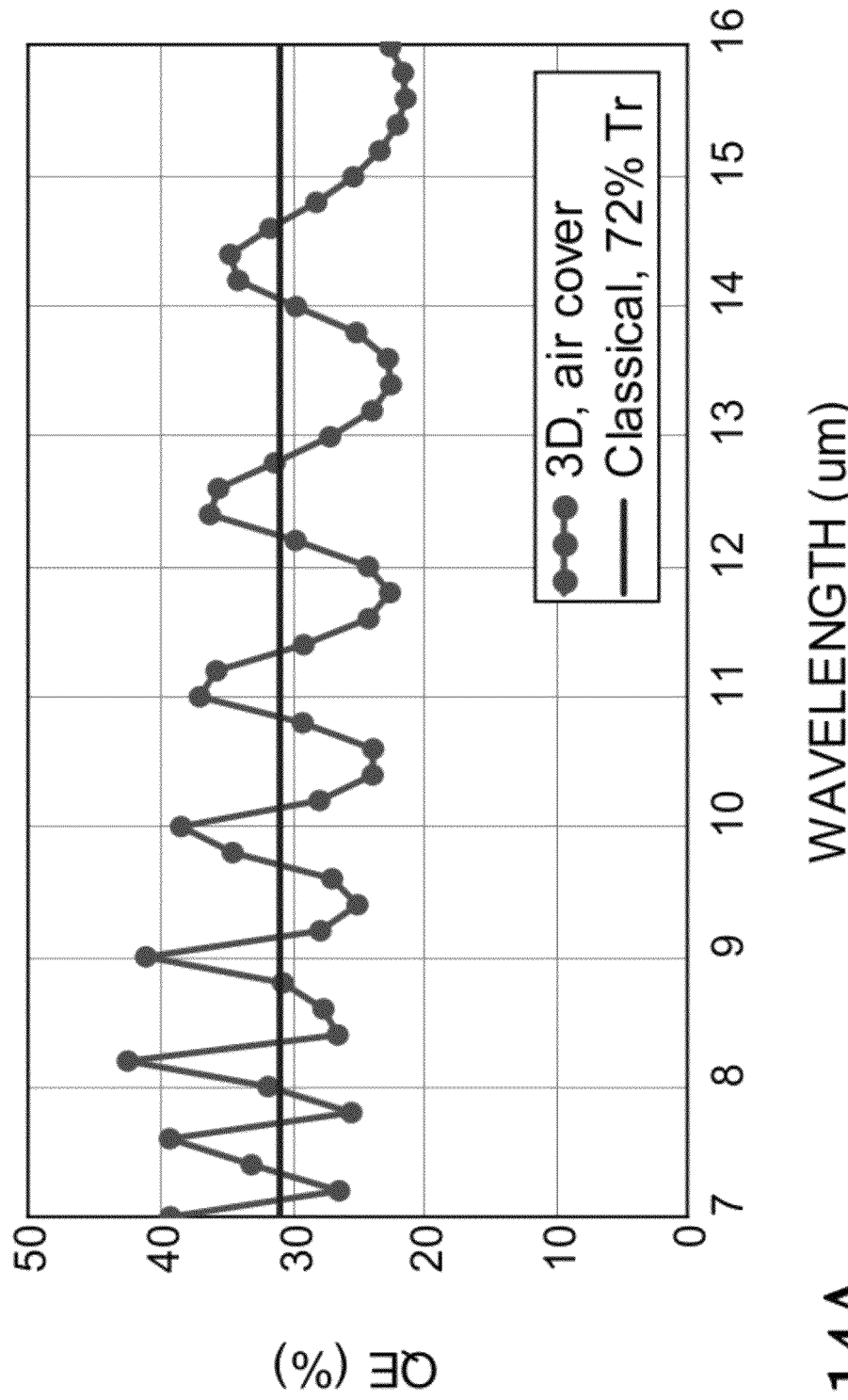
FIG. 14A  QE of a PY-QWIP without an AR-coating.

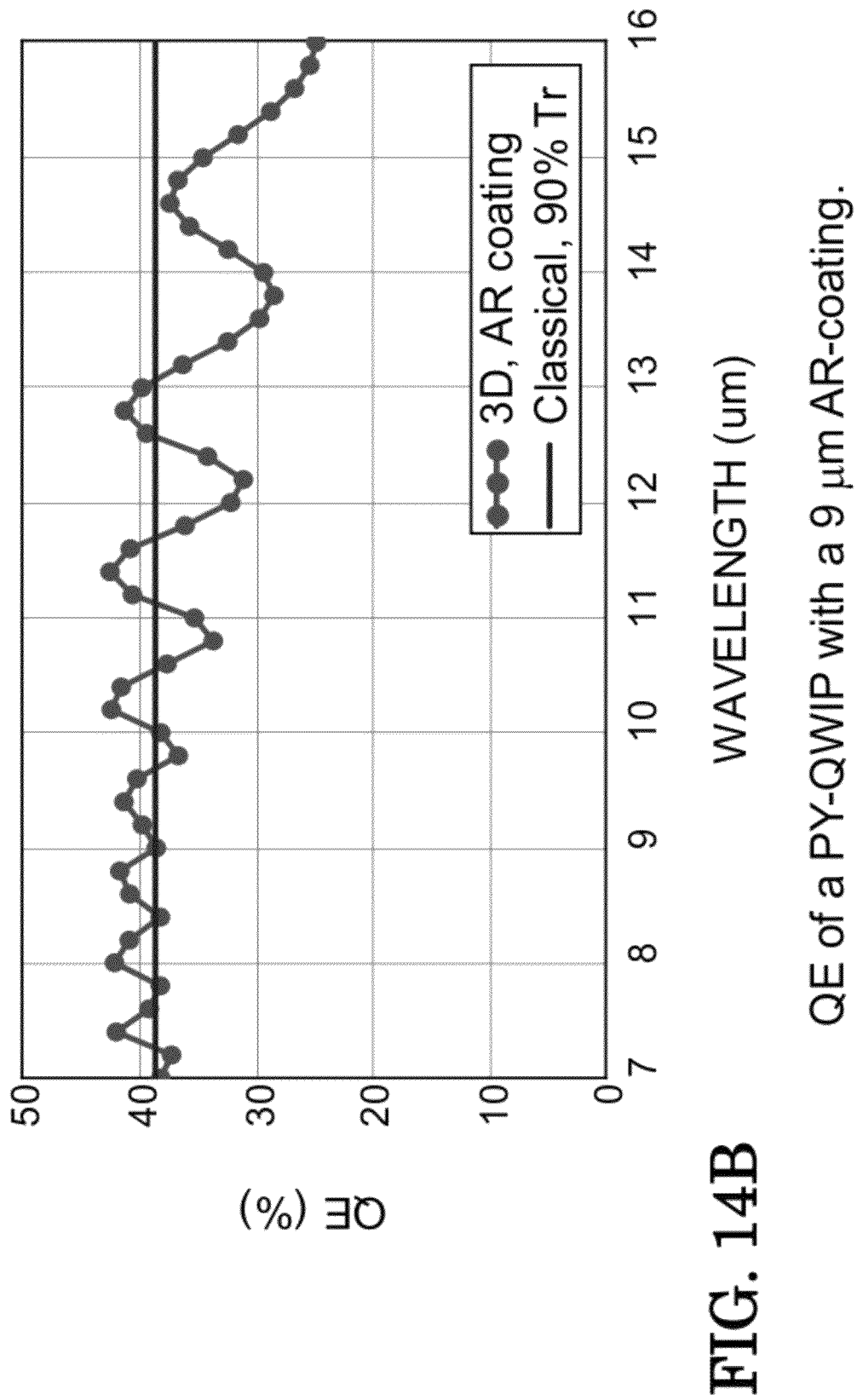
FIG. 14B QE of a PY-QWIP with a 9 μm AR-coating.

FIG. 15A illustrates the 3-D geometry of a CC-QWIP with air cover and AR substrate coating. The $E_z$ distribution is shown at $\lambda = 9.0$ μm.

FIG. 15 B illustrates in cross section of FIG. 15A illustrating the $E_z$ distribution at $\lambda = 9.0$ μm.

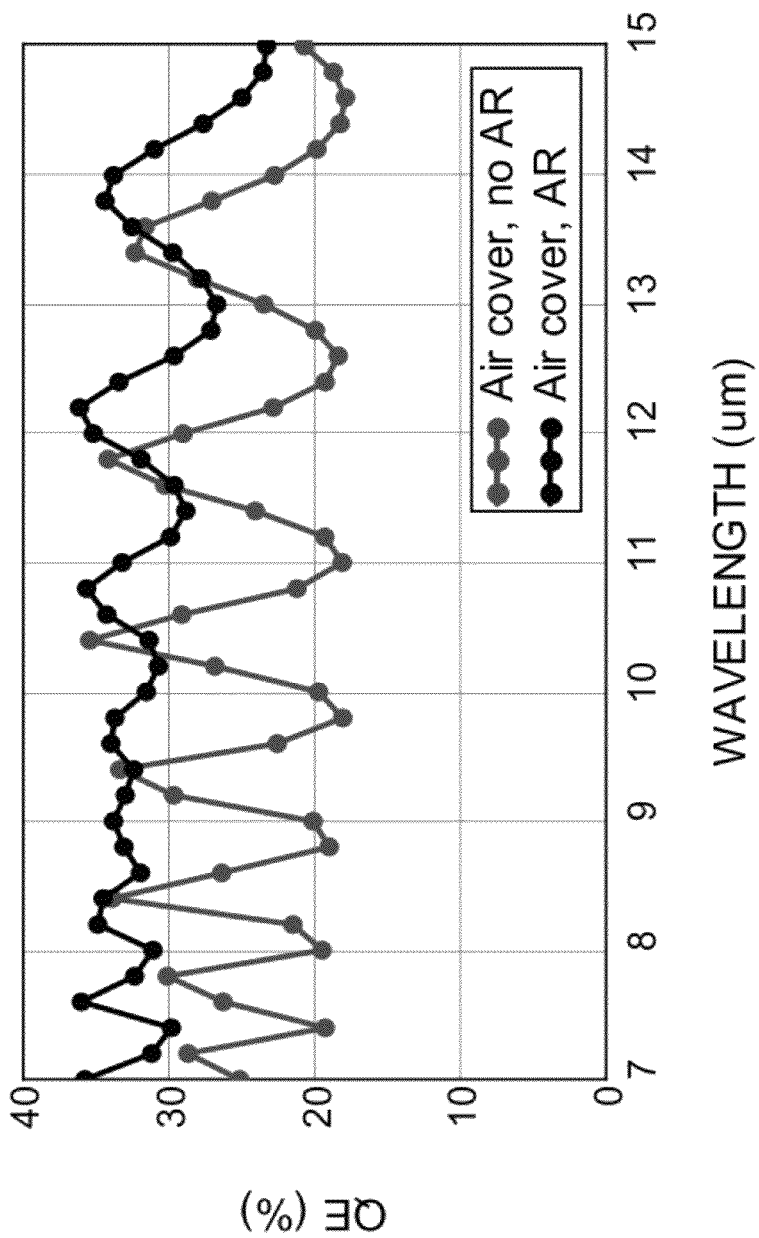
FIG. 16 The QE of a CC-QWIP with and without a 9 μm AR-coating.

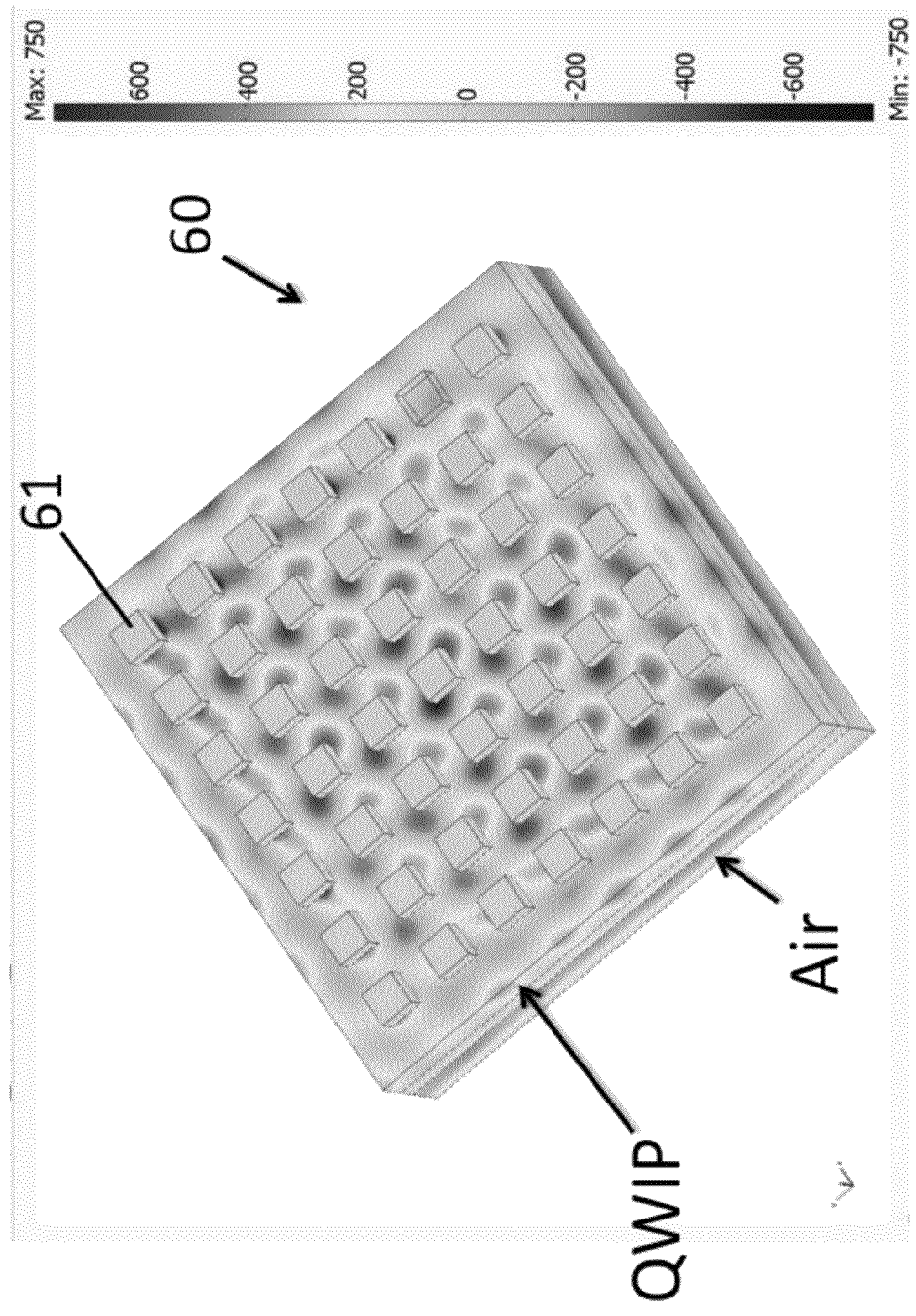
FIG. 17A illustrates the 3D geometry of a GR-QWIP with the $E_z$ distribution shown at $\lambda = 9.7$ μm.

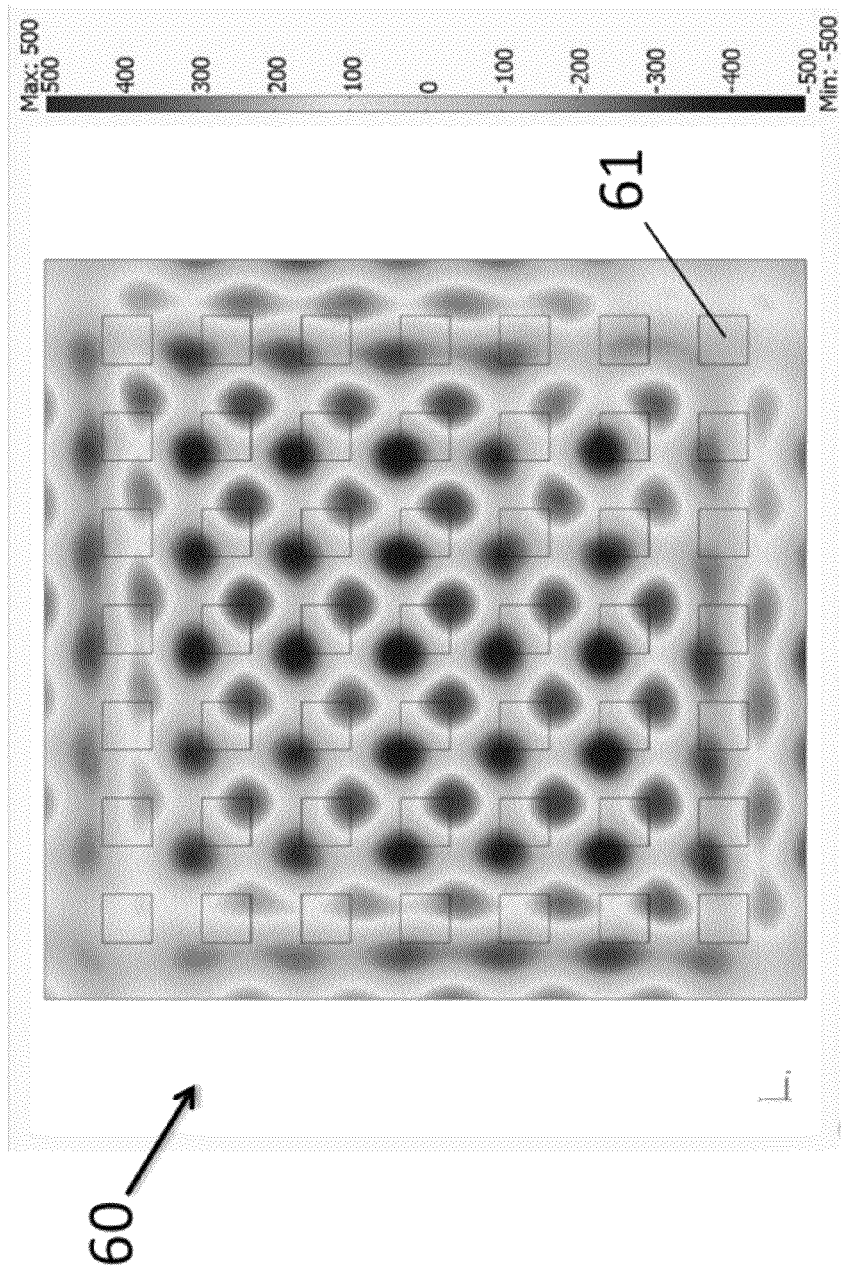
FIG. 17B illustrates the $E_z$ distribution at $\lambda = 9.7$ μm at the center plane of the active material of the embodiment of FIG. 17A.

The QE of three GR-QWIPs having different pixel size and common contact layer thickness. The grating period is 3.0 μm, the grating height is 0.75 μm, and the active layer thickness is 1.5 μm.

Difference between a fully occupied C-QWIP and a partially filled 60 QW C-QWIP.

The calculated α of focal plane array (FPA) #1.

The measured noise gain of FPA#1.

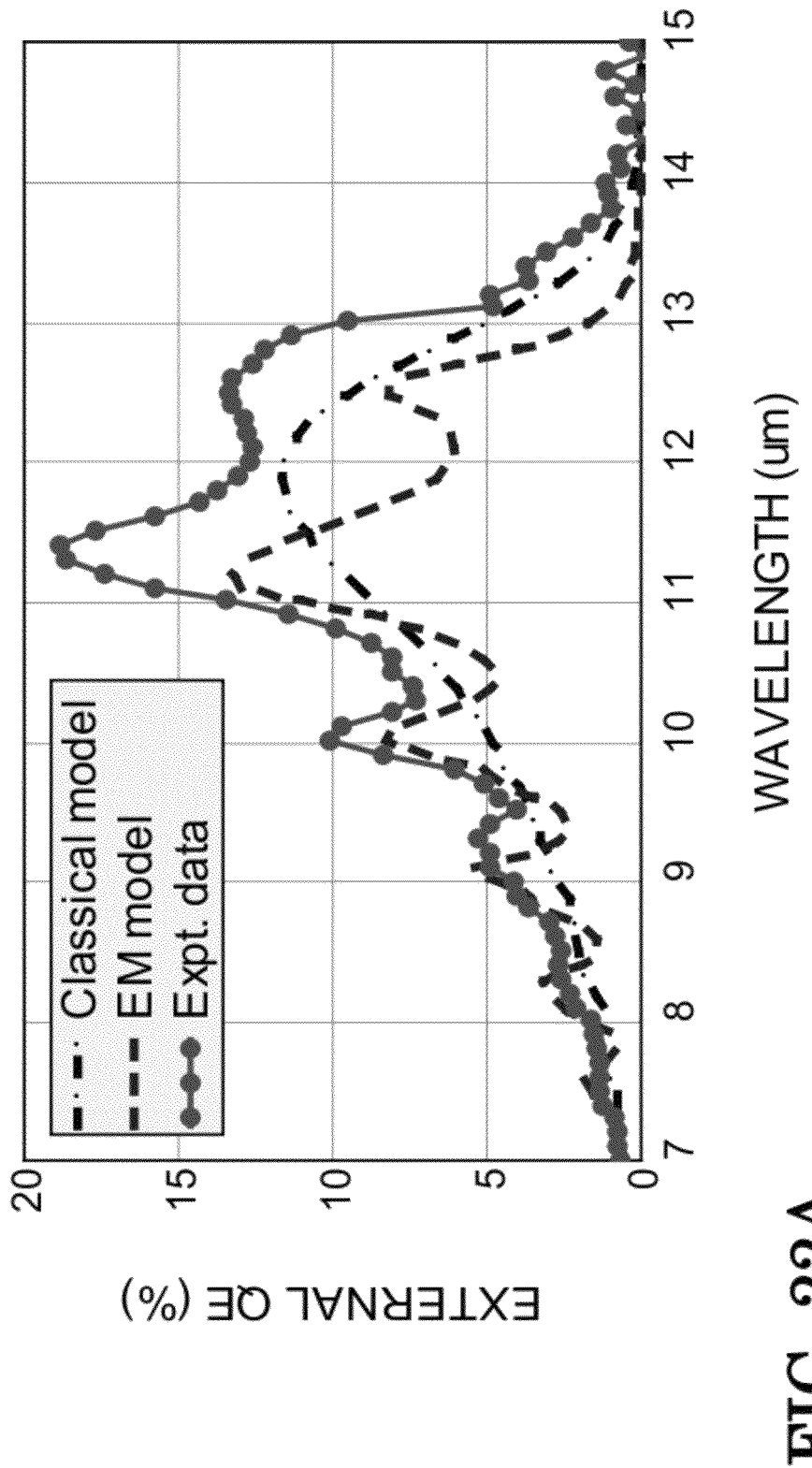
FIG. 22A  Calculated and measured external QE of PR-QWIP FPA#1.

Calculated and measured external QE of PR-QWIP FPA#1 multiplied by 0.7 to fit the predicted QE.

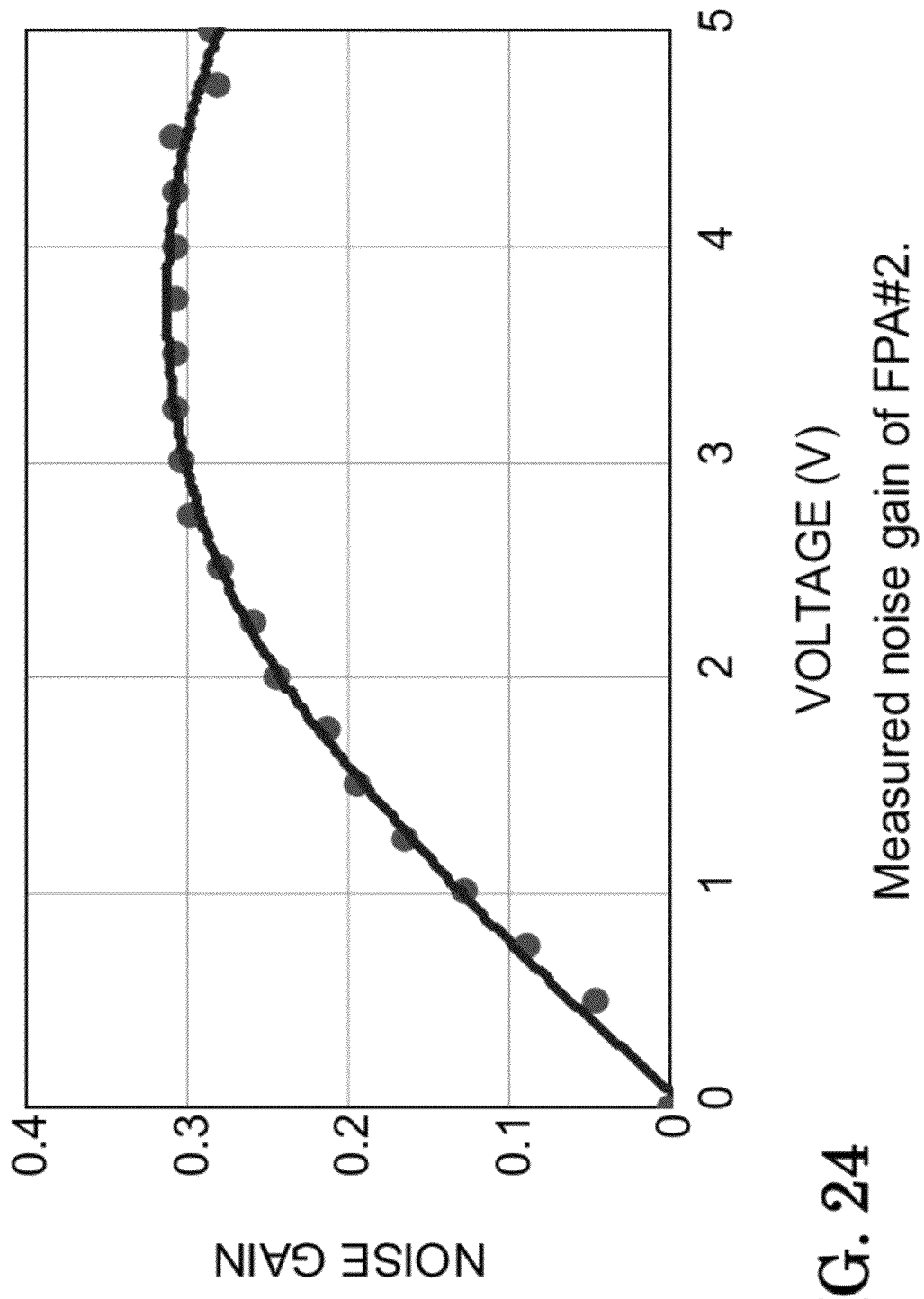
FIG. 24 Measured noise gain of FPA#2.

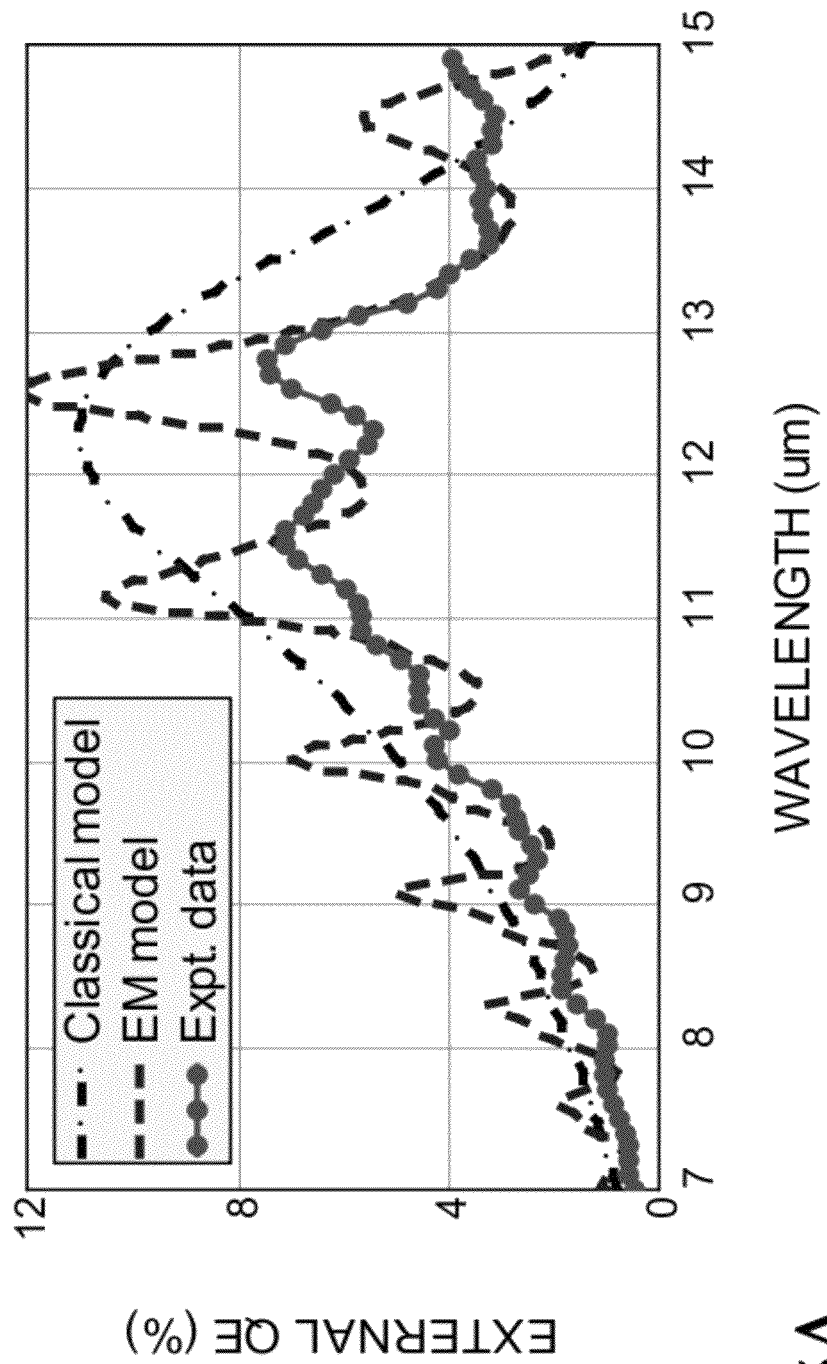
FIG. 25A Calculated and measured external QE of PR-QWIP FPA#2.

Calculated and measured external QE of PR-QWIP FPA#2 multiplied by 1.4 to fit the predicted QE.

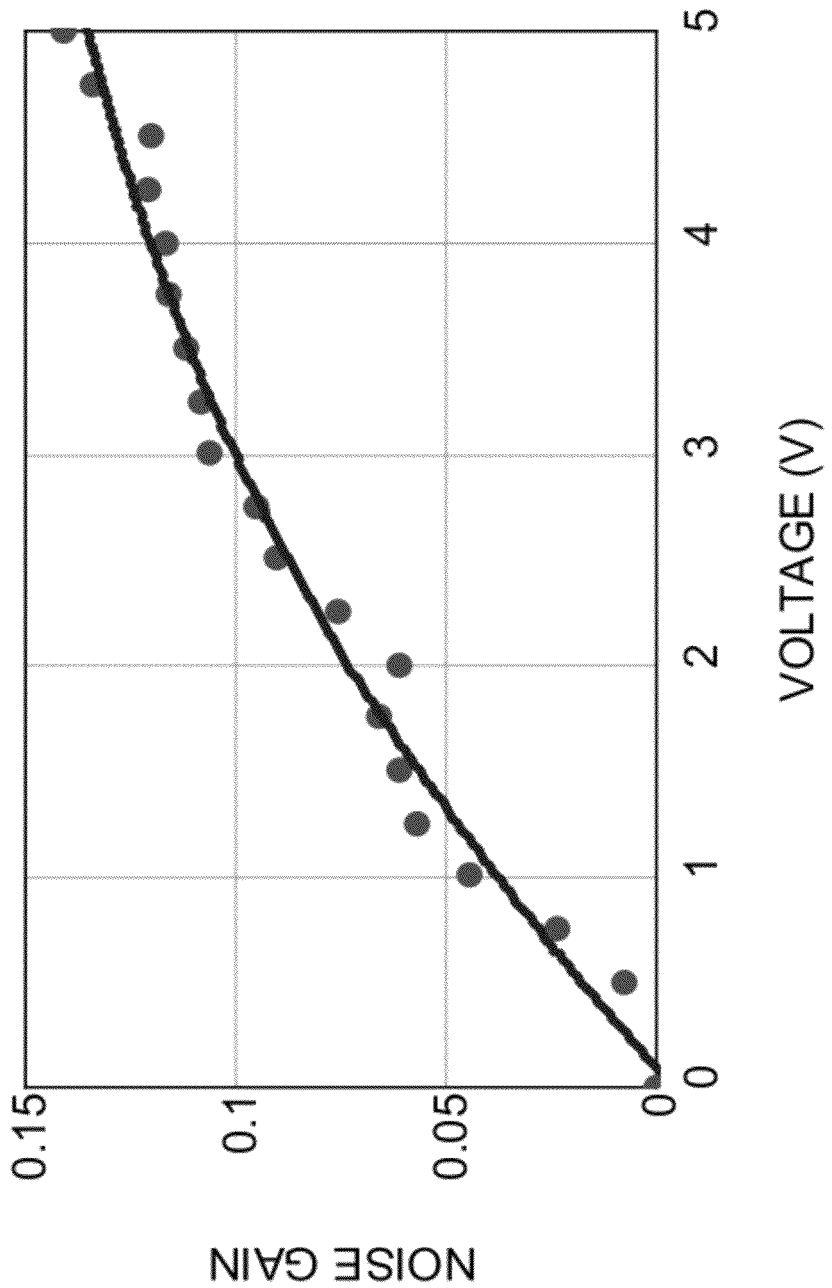
FIG. 27 Measured noise gain of FPA#3.

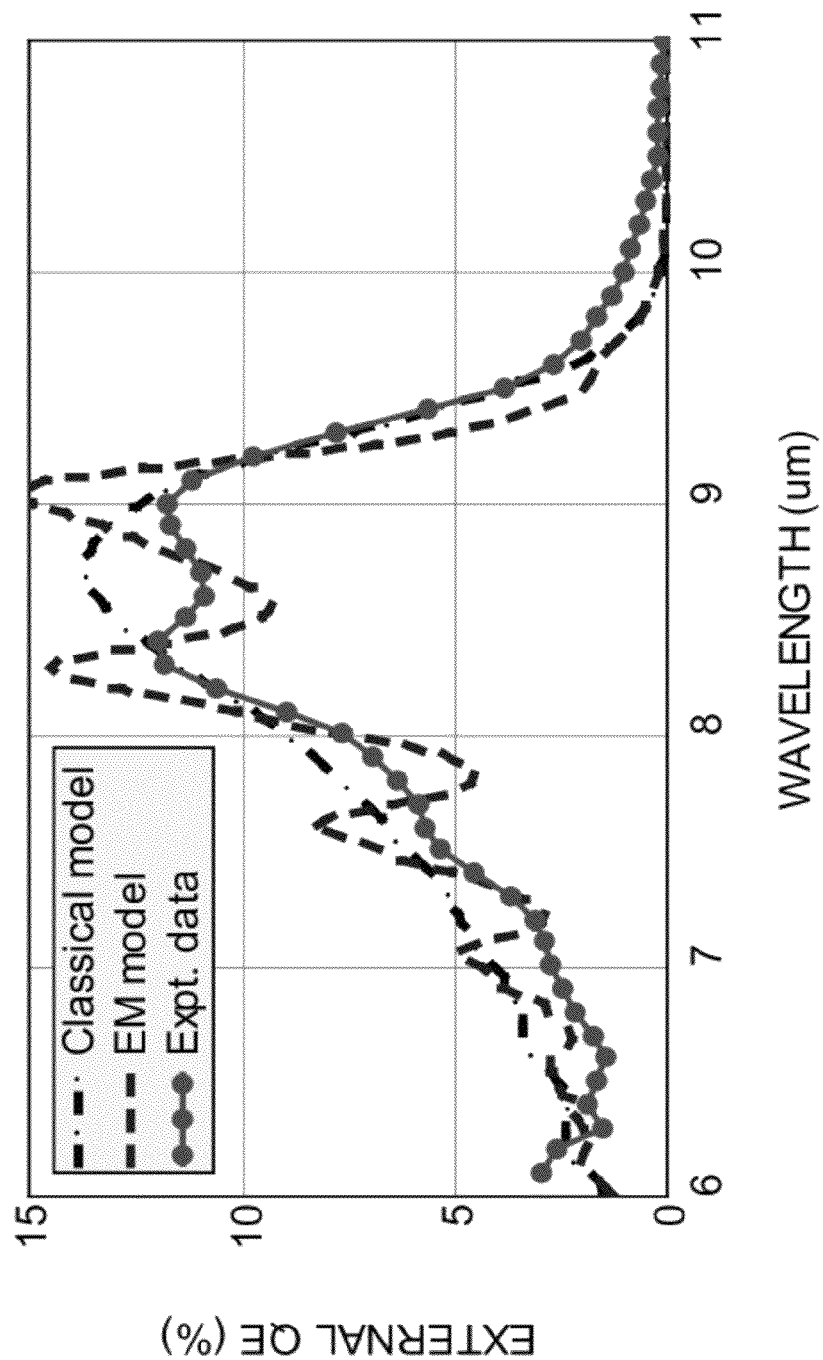
FIG. 28A  Calculated and measured external QE of PR-QWIP FPA#3.

Mmeasured QE (of FIG. 28A) multiplied by 1.12 to fit the predicted QE.

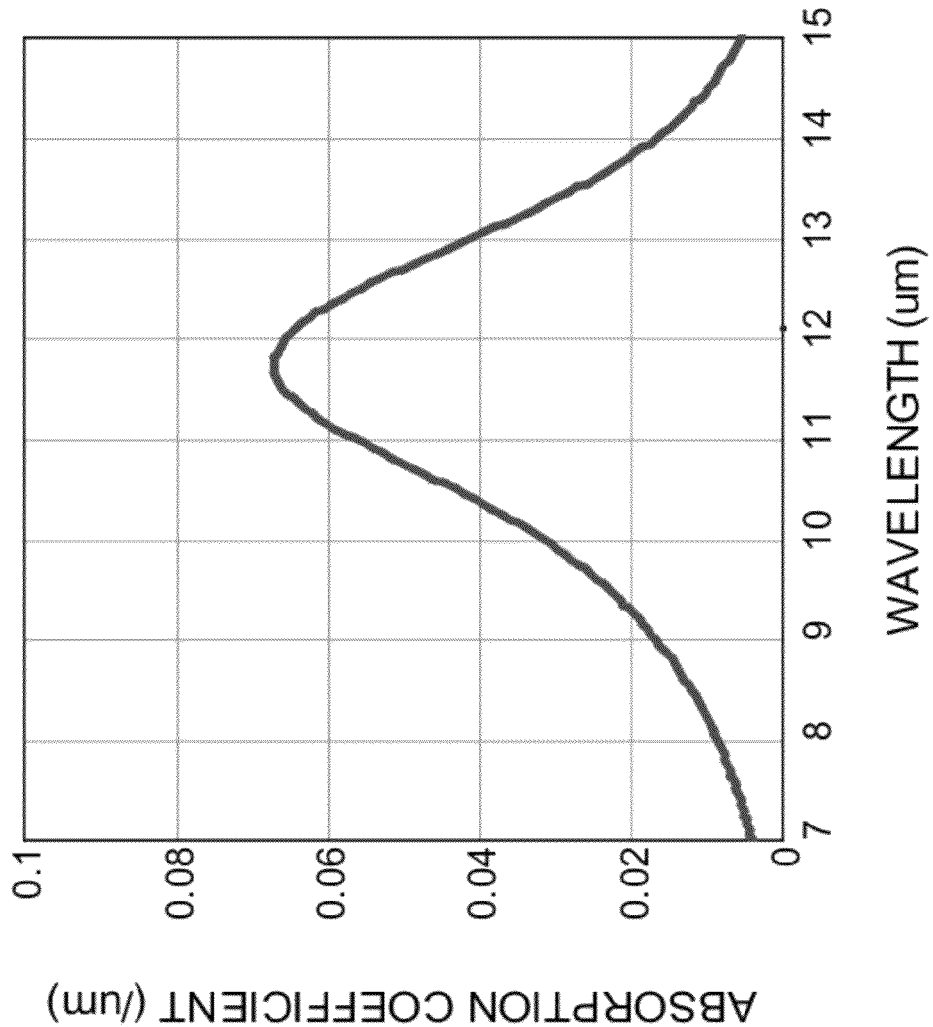
FIG. 29 Calculated α of the GR-QWIP FPA.

Projected gain and the measured CE of the GR-QWIP FPA.

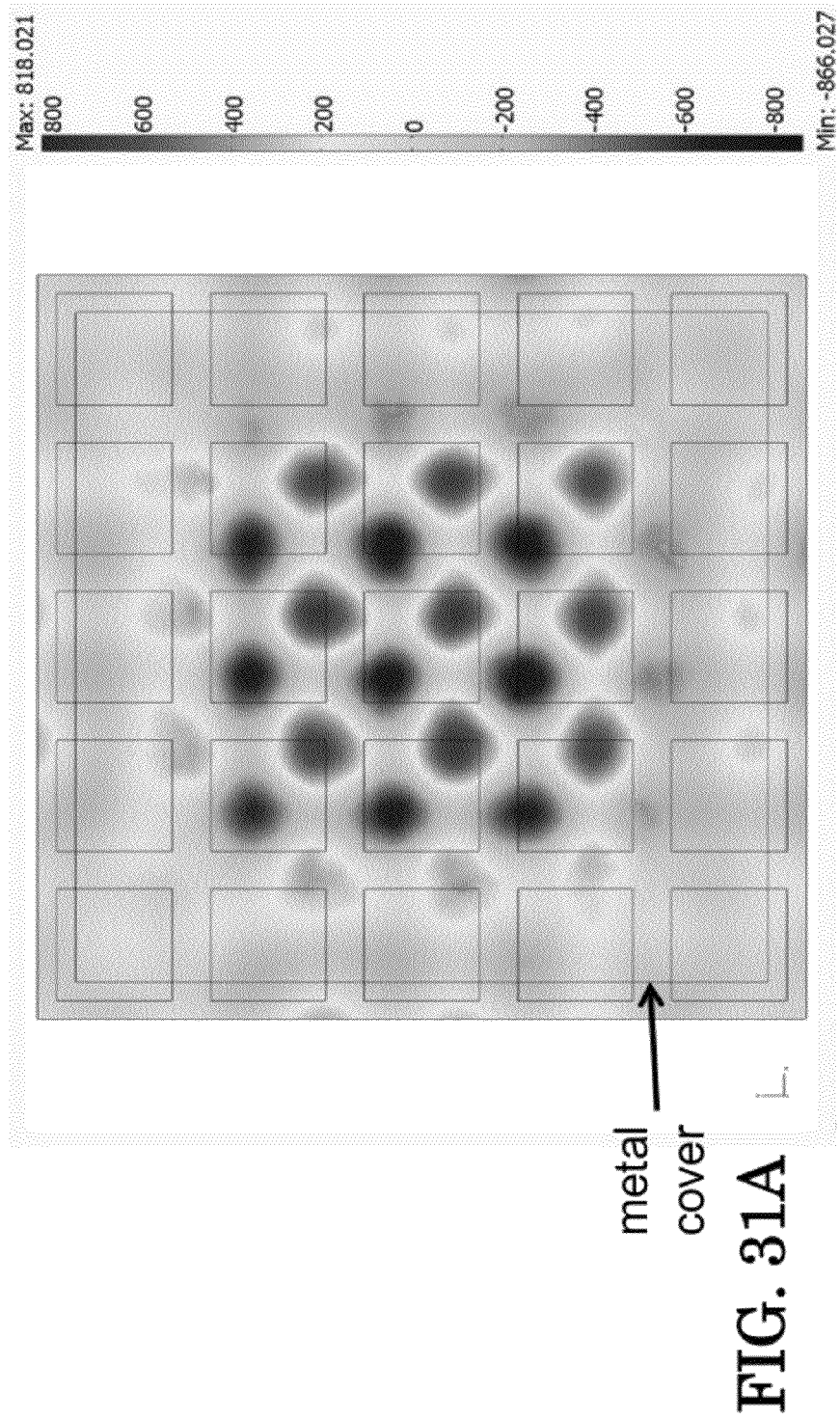
FIG. 31A Top view of the modeled grating structure and the $E_z$ distribution on the center plane of the active layer at $\lambda = 10.6$ μm.

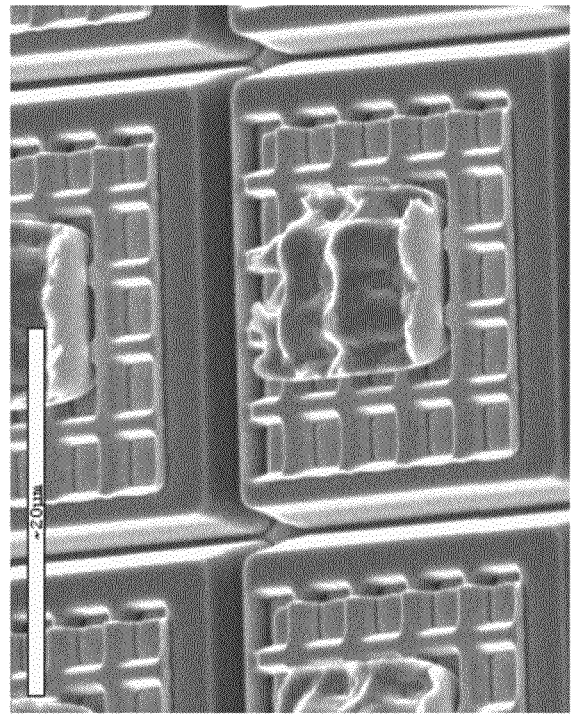
FIG. 31B  Experimental grating structure.

The theoretical QE is scaled by a factor of 0.3 to fit the experiment.

Plot of predicted QE versus measured QE for thinned PR-QWIPs (squares) and thick substrate PR-QWIPs (circles).

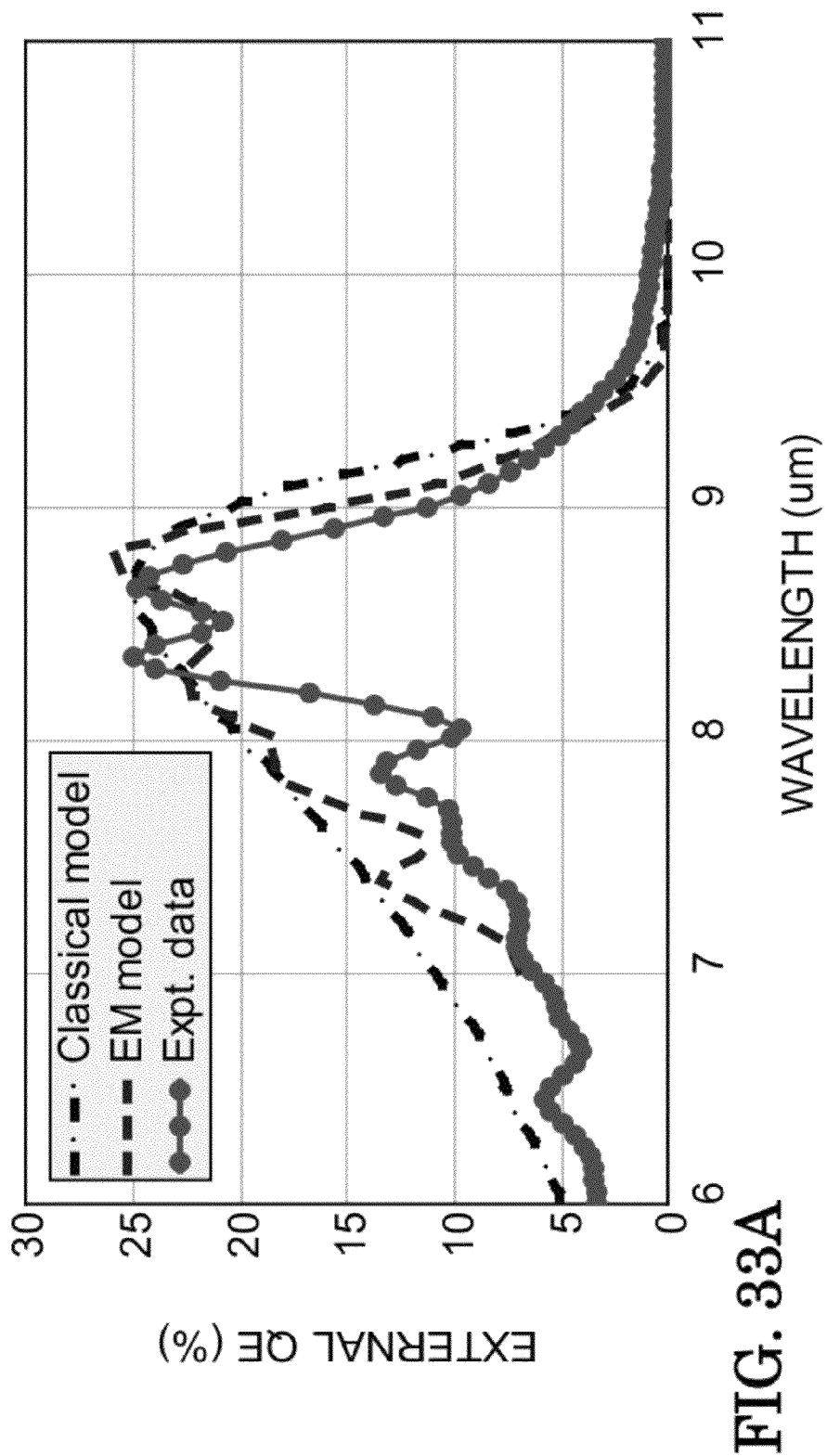
FIG. 33A Calculated and measured external QE spectra of a PY-QWIP FPA. The absolute QE value of the FPA has not been determined.

FIG. 33B  Infrared image taken by the 1-megapixel PY-QWIP FPA.

3D geometry of a resonator-QWIP with square ring unit cells.

Calculated QE of the prism-shaped and pyramid-shaped C-QWIPs for a material with α spectrum shown in FIG. 20 and the R-QWIPs with the same α spectral lineshape but with a peak value of 0.20 μm⁻¹.

$E_z$ distribution at the center plane of the active layer at $\lambda = 7.0$ μm with the incident $E_0 = 377\sqrt{2}$.

$E_z$ distribution at the center plane of the active layer at $\lambda = 8.0$ μm.

$\lambda = 8.0$ μm $E_z$ distribution at the center plane of the active layer at $\lambda = 8.8$ μm.

$E_z$ distribution at the center plane of the active layer at $\lambda = 10.0\ \mu m$.

The QE of different optimized detectors for 8 – 9.2 μm detection in a 12-μm pixel pitch array. The $\alpha$ value is assumed to be constant at 0.20 $\mu m^{-1}$.

STEP 1: SPECIFICATION OF MATERIAL STRUCTURE

| Thickness | Material | Doping |
|---|---|---|
| 30000 Å | GaAs | $1 \times 10^{18}$ cm$^{-3}$ |
| 50 Å | AlGaAs (x = 0.230) | undoped |
| 19 Å | GaAs | undoped |
| 24 Å | GaAs | $2 \times 10^{18}$ cm$^{-3}$ |
| 5 Å | GaAs | undoped |
| 700 Å | AlGaAs (x = 0.230) | undoped |
| 19 Å | GaAs | undoped |
| 24 Å | GaAs | $2 \times 10^{18}$ cm$^{-3}$ |
| 5 Å | GaAs | undoped |
| 50 Å | AlGaAs (x = 0.230) | undoped |
| 49200 Å | GaAs | $1 \times 10^{18}$ cm$^{-3}$ |
| 1000 Å | AlGaAs (x = 0.3) | undoped |
| 2500 Å | GaAs | undoped |
| | GaAs | S.I. - SUBSTRATE |

(middle group × 60)

FIG. 39

An example of material structure selection for 9 μm detection.

FIG. 40
STEP 2: Calculation of eigen functions and eigen energies of the material structure Express Eigen functions in material layer n as:

$$\Psi = A_n e^{ik_n z} + B_n e^{-ik_n z}$$

where $A_n$ and $B_n$ are two constants to be determined.

$A_n$ and $B_n$ of layer n are related to $A_{n+1}$ and $B_{n+1}$ of the next layer by:

$$\begin{bmatrix} A_n \\ B_n \end{bmatrix} = \frac{1}{2} \begin{bmatrix} (1+\gamma_{n,n+1})e^{i(k_{n+1}-k_n)d_{n,n+1}} & (1-\gamma_{n,n+1})e^{-i(k_{n+1}+k_n)d_{n,n+1}} \\ (1-\gamma_{n,n+1})e^{i(k_{n+1}+k_n)d_{n,n+1}} & (1+\gamma_{n,n+1})e^{-i(k_{n+1}-k_n)d_{n,n+1}} \end{bmatrix} \begin{bmatrix} A_{n+1} \\ B_{n+1} \end{bmatrix} = \frac{1}{2} M_{n,n+1} \begin{bmatrix} A_{n+1} \\ B_{n+1} \end{bmatrix}$$

where $\gamma_{n,n+1} = \dfrac{m_n^* k_{n+1}}{m_{n+1}^* k_n}$

At an eigen energy, the electron transmission coefficient $T_G(E)$ through all the layers has a local maximum, where $$T_G(E) = \frac{1}{|A_1(E)|^2} \frac{v_p(E)}{v_1(E)} = \frac{2^{2p-2}}{|a_{11}(E)|^2} \frac{m_1^*(E)}{m_p^*(E)} \frac{k_p(E)}{k_1(E)}$$

After identifying all the eigen energies, the corresponding eigen functions can be obtained by putting the energy values back into the second equation.

FIG. 41

STEP 3: Calculation of absorption coefficient of material based on step 2

DETERMINE $f_n$ --- After obtaining $\Psi(E_n)$ in terms of A and B for the nth eigen energy $E_n$ (in Step 2) the oscillator strength $f_n$ is given by $$f_n = \frac{2\hbar}{m^*\omega}\left|\left\langle\Psi_n\left|\frac{\partial}{\partial z}\right|\Psi_1\right\rangle\right|^2, \quad n = 2,3...$$

DETERMINE $\rho_n(\lambda)$

Due to the layer thickness fluctuation in actual material, the eigen energies have finite energy distributions, which lead to finite energy distribution for each optical transition.

$$\rho_n(\lambda) = \frac{1}{\sqrt{2\pi}\,\sigma}\exp\left[-\frac{1}{2\sigma^2}\left(\frac{hc}{\lambda} - E_n + E_1\right)^2\right]$$

where $\sigma$ is a linewidth parameter depending on the material quality.

DETERMINE $\alpha(\lambda)$

After knowing $f_n$ and $\rho_n$, $\alpha(\lambda)$ is given by $$\alpha(\lambda) = \sum_n \frac{N_D W}{L} \frac{\pi e^2 \hbar}{2\sqrt{\varepsilon_h}\,\varepsilon_0 m^* c} f_n \rho_n(\lambda),$$

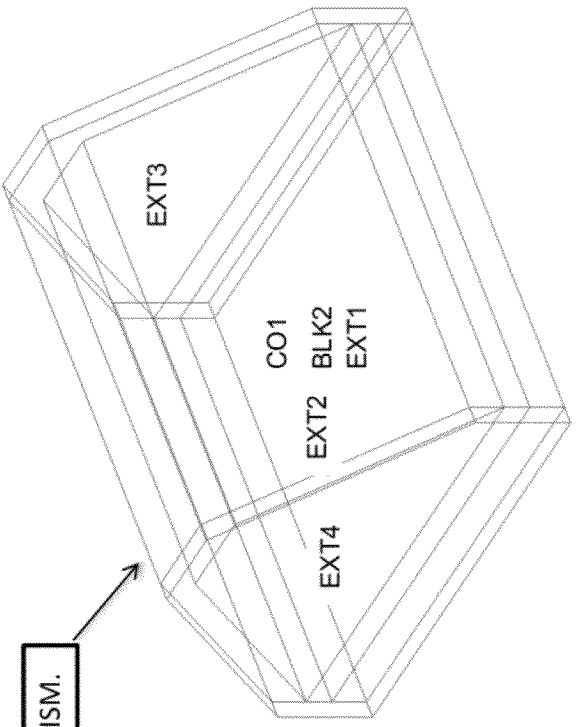
FIG. 42 STEP 4: Design the detector physical geometry and construct computer aided design drawing in COMSOL
Using the drawing tools in COMSOL, the physical geometry of a detector can be laid out.
Choice of geometry depends on the application requirement and insight into possible solutions.
EXAMPLE: PRISM.

FIG. 43
STEP 5: Input parameters for all materials used in the EM model

INPUT OF PARAMETERS INTO THE MODEL - The material properties such as the relative permittivity $\varepsilon_r$, which is related to $\alpha$, the conductivity $\sigma$ and the relative permeability $\mu_r$ of each geometrical subdomain can be input into the model.

For example, in the air domain, $(\varepsilon_r, \sigma, \mu_r)$ is $(1, 0, 1)$.

For example, in the substrate and contact domains, $(\varepsilon_r, \sigma, \mu_r)$ is $(10.49, 0, 1)$.

For example, in the QWIP material domain, the diagonal $\varepsilon_r$ tensor is $(10.49, 10.49, 10.49 - j*n\lambda\alpha/(2\pi))$, and $(\sigma, \mu_r)$ is $(0, 1)$.

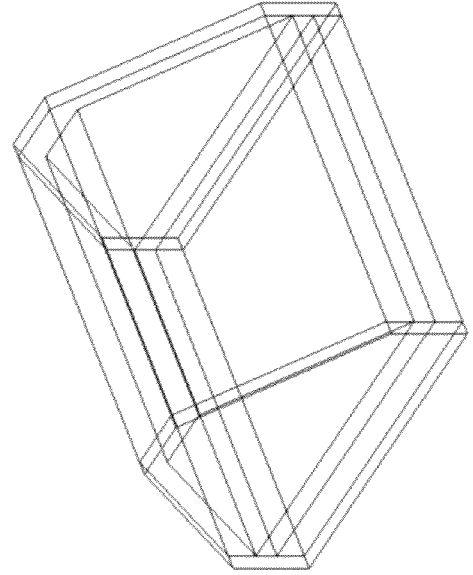

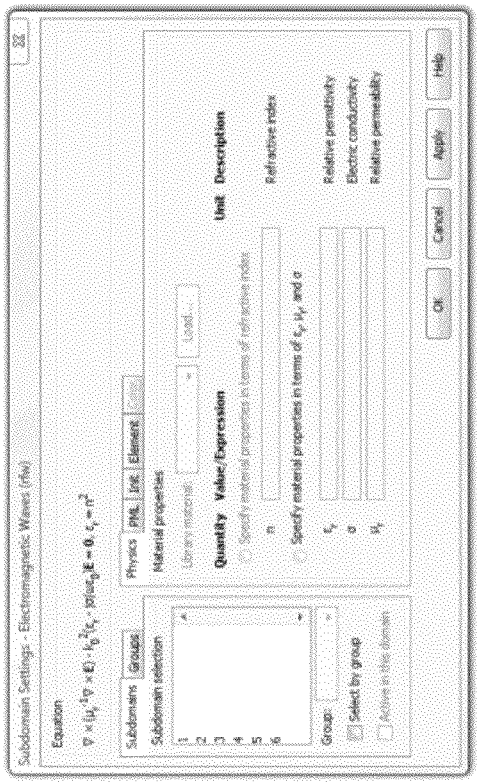

FIG. 44  STEP 6- Define material properties of all geometrical objects
DEFINE OF MATERIAL PROERTIES – Other than the absorption properties of the QWIP material, the properties of other geometrical objects, such as the conductivity of the gold metal, can be loaded from the material library in the subdomain setting page.
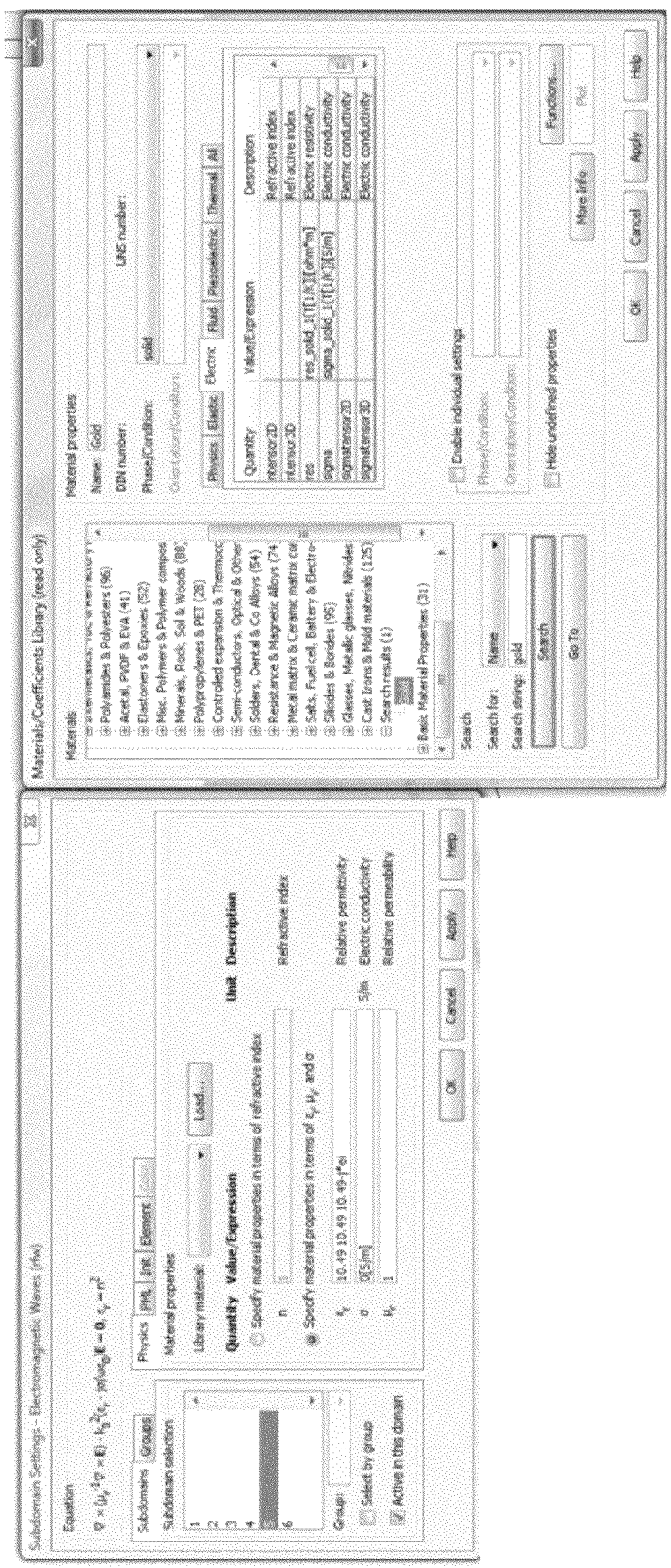

STEP 7: Define physical relations among all geometrical boundaries

Define all the internal and external boundaries in the geometry based on the known physical principles and symmetries.

For example, if the detectors are arranged in a regular array, certain boundaries are in periodic condition.

If the wave is expected to propagate out to infinity after leaving the detector material and into top air layer, one should select scattering boundary condition at the top air boundary, which artificially deletes any reflecting waves at that boundary.

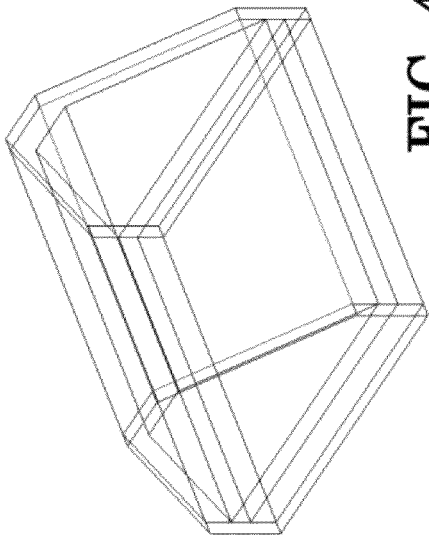

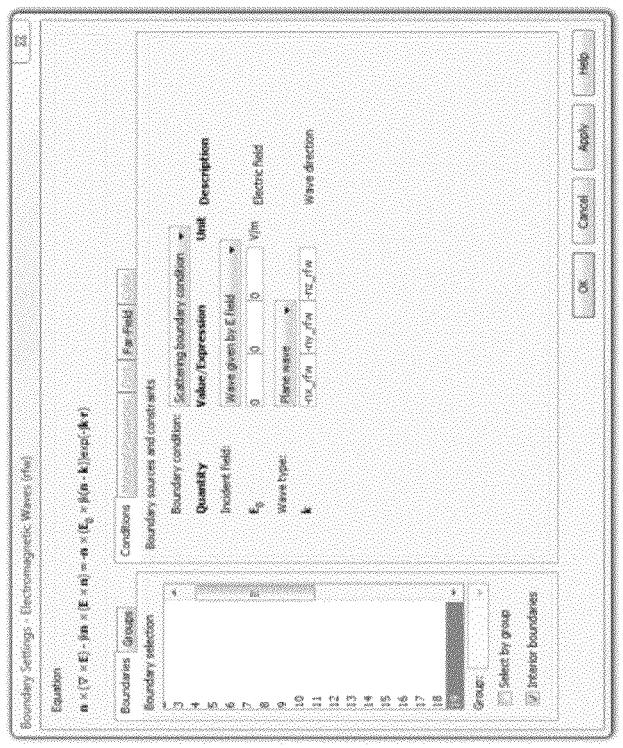

FIG. 45

STEP 8: Define density of nodes for numerical computation

*Define the maximum element size and other factors that control the density of the mesh.*

*Define the maximum element size and other factors that control the density of the mesh.*

*The shorter the optical wavelengths are, the higher the frequency of the spatial variations will be, and the denser the mesh should be.*

*If the mesh is too coarse, a self consistent solution can never be reached or the solution is not accurate enough.*

*If mesh is too dense, there will be too many computations and too much required memory.*

*Optimum density is determined by trial and error.*

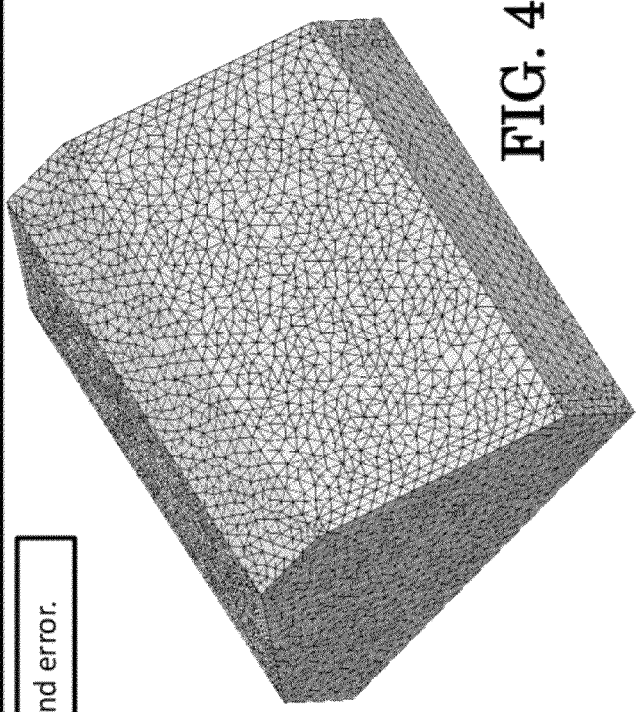
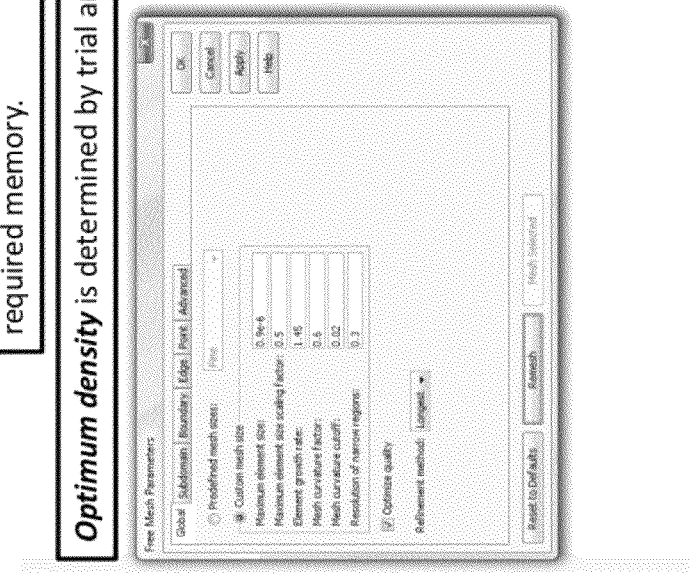

FIG. 46

FIG. 47 STEP 9: Define EM wave incident condition
At the bottom air layer, define the incident wave to be traveling normally to that surface.
$E_x$ and $E_y$ are defined as 377 V/m
$E_z$ is defined as 0 V/m.
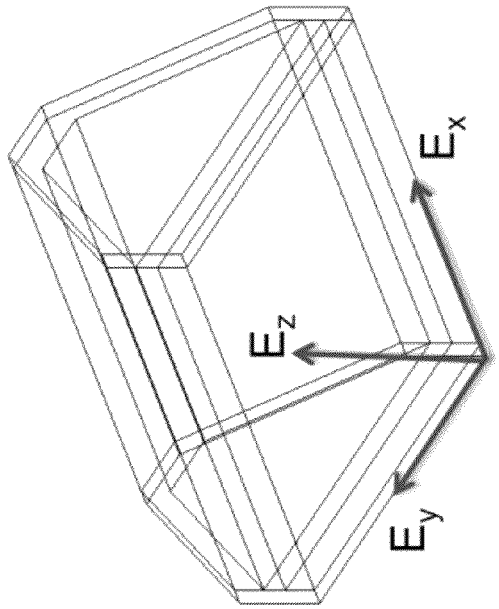

FIG. 48 STEP 10: Define numerical solver

DEFINE SOLVER PARAMETERS

EXAMPLE: IF harmonic propagating wave, using wavelength as a parameter in the range of 8 to 10.8 μm in the step of 0.2 μm. It also contains several other pages of settings related to how the numerical computation is proceeded, such as using progressing multi-grids to improve accuracy in each iteration, the maximum number of iterations and the maximum accuracy tolerance, etc.

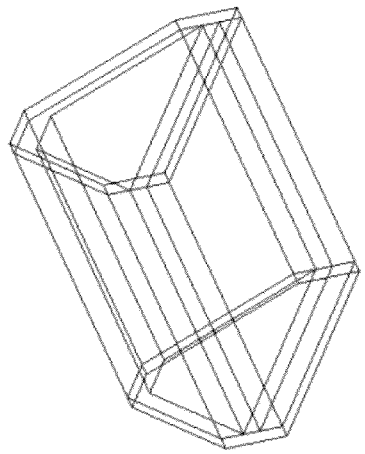

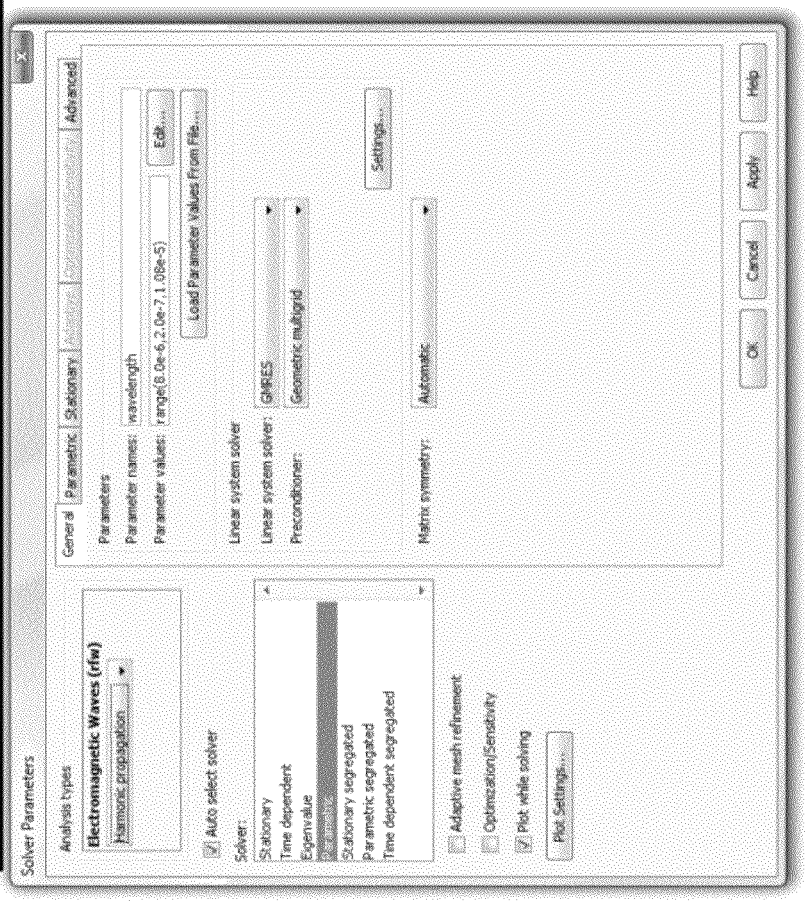

STEP 11: Based on the output $E_z$ distribution, compute QE

Integration of the scattered $E_z$ expression within the detector material subdomain according to the formula $$\eta = \frac{n\alpha}{AE_0^2} \int_V \left| E_z(\vec{r}) \right|^2 d^3r$$

EQUATION 1

PHOTODETECTORS USING RESONANCE AND METHOD OF MAKING

CROSS REFERENCE TO RELATED APPLICATIONS

This application is a continuation-in-part and claims priority to U.S. application Ser. No. 13/082945 entitled "Photodetectors Using Resonance and Method of Making" filed Apr. 8, 2011, which is a continuation-in-part and claims priority to U.S. application Ser. No. 12/543,121 entitled "Corrugated-Quantum Well Infrared Photodetector with Reflective Sidewall and Method," both of which are hereby incorporated by reference.

GOVERNMENT INTEREST

The invention described herein may be manufactured, used, and/or licensed by or for the United States Government.

FIELD OF THE INVENTION

The present invention relates to quantum well infrared photodetectors (QWIPs) for infrared detection.

BACKGROUND OF THE INVENTION

The quantum well infrared photodetector (QWIP) has emerged as a mainstream technology for long wavelength infrared detection. Quantum Well Infrared Photodetectors (QWIPs) are infrared detectors that are made of layers of quantum well (QW) materials. These QW materials have a unique property that they are sensitive to light only when the light is propagating parallel to these layers, with which one of the electric polarizations $E_z$ is pointing perpendicular to the layers. In other words, the QWIP material absorbs light only when the optical electric field is vertical to the material layers. The detector structure may be arranged in the form of large focal plane arrays (FPAs) of pixels.

Utilizing gallium arsenide material technology, QWIP focal plane array cameras are amenable for low cost and high volume production. QWIP cameras with resolution as high as 640×512 pixels are available in the commercial market. InGaAs/AlGaAs materials have proved to be useful in Quantum Well Infrared Photodetectors (QWIPs). InGaAs/AlGaAs materials have material properties that are highly reproducible and predictable by fundamental physical laws. For example, the observed material's absorption coefficient α for parallel propagating light is found to be in precise agreement with that calculated from quantum mechanics. Free from extrinsic factors such as material imperfection and surface leakage, the observed dark current also obeys the well-known thermionic emission model. With this simple and well-behaved material system, QWIP technology could have been developed and applied in a rapid pace. Unfortunately, the unique requirement for vertically polarized light has greatly impeded its development. Being sensitive only to the vertical polarization, $E_z$, the quantum efficiency (QE) of the detector is dependent on the pixel geometry, apart from its material properties.

When the QWIP is detecting light from a target area, light from the target area enters into the detector pixels normally (i.e., at a 90° angle). Because the QWIPs are sensitive to light only when the light is propagating parallel to the layers of the QWIPs, a reflective grating is conventionally placed on top of the pixels to scatter light, as shown in FIG. 1. In the presence of a grating with a particular period, the light with certain wavelengths will diffract at a large angle. Travelling at an oblique angle, the light can be partially absorbed by the material which generates photocurrent inside the pixel. The design of an optimal grating was described by J. Y. Anderson and L. Lundqvist in the article entitled "Grating-coupled quantum-well infrared detectors: Theory and performance", J. Appl. Phys. vol. 71, pp. 3600-3610, 1992. Nevertheless, the general approach of using reflective gratings to couple light has achieved only very limited success so far, which precludes its application in demanding situations. To broaden its utility, a more efficient light coupling scheme is needed.

As reported in A. De Rossi et al., "Effects of finite pixel size on optical coupling in QWIPs," Inf. Phys. and Tech., vol. 44, pp. 325-330, 2003, showed that when the pixel size is very small, diffraction from edges, rather than from the grating, dominates the optical coupling. The spectral response appears noticeably different from the ideal infinite grating, indicating a Fabry-Perot resonance between the pixel walls and between the grating and the air-substrate interface. Although large QE using the grating approach has been reported in J. Y. Andersson and L. Lundqvist, "Near-unity quantum efficiency of AlGaAs/GaAs quantum well infrared detectors using a waveguide with a doubly periodic grating coupler," Appl. Phys. Lett., vol. 59, pp. 857-859, (1991), there is little evidence that high performance can be achieved in the high density, small pixel FPAs.

To improve the optical coupling in QWIPs, corrugated-quantum well infrared photodetector (C-QWIP) have been developed, as described in C. J. Chen et al., "Corrugated quantum well infrared photodetectors for normal incident light coupling," Appl. Phys. Lett., vol. 69, pp. 1446-1448, 1996; K. K. Choi et al., "Corrugated quantum well infrared photodetectors for material characterization." J. Appl. Phys., vol. 88, pp. 1612-1623, 2000. The "corrugated" terminology relates to using a number of V-grooves etched into the layered material to create angled mesa sidewalls for light coupling. Corrugated-QWIP utilizes optical reflections to change the direction of light inside the pixel. A C-QWIP pixel structure is shown in FIGS. 2A and 2B. In the C-QWIP structure shown in FIG. 2B, the inclined sidewalls reflect normal incident light into large angle propagation. The inclined sidewalls reflect light into parallel propagation and create the vertical field. The detector has a constant coupling efficiency when the detector substrate is thick. See, for example L. Yan et al., "Electromagnetic modeling of quantum-well photodetectors containing diffractive elements," IEEE J. Quantum Electron., vol. 35, pp. 1870.1877, 1999; K. K. Choi et al., "Light coupling characteristics of corrugated quantum well infrared photodetectors," IEEE J. of Quan. Electr., vol. 40, pp. 130-142, 2004. Corrugated Quantum Well Infrared Photodetectors (C-QWIP) cameras, for example, can be made in higher resolution, in larger production volume, at a lower cost, in higher sensitivity, in broadband and multi-color detection. The structure was patented by Choi in U.S. Pat. No. 5,485,015, hereby incorporated by reference, entitled "Quantum Grid Infrared Photodetector," which discloses a quantum grid infrared photodetector (QGIP) that includes a semiconductor substrate with a quantum well infrared photodetector (QWIP) mounted thereon. Moreover, U.S. Pat. No. 7,217,926, issued May 15, 2007, hereby incorporated by reference, discloses "Systems involving voltage-tunable quantum-well infrared photodetectors." For example, when using GaAs, having a refractive index is 3.34, the critical angle will be 17.4° when the GaAs material is in contact with air or vacuum. Since the sidewall angle is 50°, the angle of incidence for normal incident light will also be 50°, making it larger than the critical angle. The light will thus be totally internal reflected and be absorbed by the GaAs detector material.

By using C-QWIPs, because reflection is more effective in redirecting the light, the quantum efficiency (QE) is improved. Reflection is also independent of wavelength. This means that the detector will preserve the natural absorption spectrum of the material, which often can be much wider than the grating coupling bandwidth. Without the need for matching the material wavelength to the grating cavity modes in the detector, the same pixel geometry and production process are applicable to all QWIP material designs. This allows the simultaneous production of FPAs having a wide range of wavelength bands without jeopardizing QE. In the absence of the fine grating features, it also allows the use of standard photolithographic techniques for faster, less expensive and very large format production. However, there is a need for further improving QWIP technology in high-sensitivity and high-resolution imaging.

SUMMARY OF THE INVENTION

In accordance with the principles of the present invention the effect of resonance is used to enhance the detection capability. The principles are adaptable to a C-QWIP structure fabricated on top of a thin common contact layer with the wafer substrate substantially or entirely removed. This preferred embodiment structure enables the increase of the optical intensity inside the detector through optical coherent interference. Optionally, a thin composite layer may be placed external to the common contact layer to enhance or alter the resonances in the detector volume.

A preferred embodiment comprises a detector structure that is more sensitive than a regular C-QWIP because of resonance effects. As explained in above, the QWIP material does not absorb normal incident light. In contrast to commercial products that use gratings to diffract or scatter light inefficiently, resulting in low infrared absorption among other deficiencies, a C-QWIP utilizes total internal reflection to redirect light that leads to more sensitive, lower cost and higher definition products. However, C-QWIPs with thick substrates operate on incoherent light and any unabsorbed light will be lost to the surrounding after the first pass. In contrast, a preferred embodiment operates on, inter alia, coherent light, with which the light intensity can be intensified by resonances, with which the quantum efficiency can be larger across the spectrum. In accordance with the principles of the present invention, the substrate depicted (for example) in FIG. 2B, may be removed by using, for example, a simple selective etching step and the subsequent addition of a thin film coating is similar to applying an anti-reflection coating. By removal or fabrication without a substrate, a preferred embodiment improves the detector quantum efficiency without adding appreciable cost. This detector structure is thus ideal for many infrared applications, including infrared detection.

A preferred embodiment of the present invention comprises apparatus and methodology for increasing substrate internal reflectivity and, therefore, efficiency of a quantum well infrared photodetector. A preferred embodiment may also incorporate the principles of the composite layer encapsulated corrugated quantum well infrared photodetectors (CLE C-QWIPs). A composite layer having high sidewall reflectivity ensures the high η of the C-QWIP arrays, while the low leakage of a dielectric layer, which may be $MgF_2$, will not increase the detector dark current. For example, the reflective layer may comprise a high plasma energy layer of gold and the dielectric layer may comprises a material having low optical phonon energy such as $MgF_2$ in order to provide a large wavelength window for high reflectivity of the film.

A preferred methodology comprises a method for determining the efficiency of a photodetector configuration using a three-dimensional finite element electromagnetic computer simulation comprising: determining a design configuration geometry, calculating the electromagnetic field distributions, determining a quantum efficiency spectrum at the desired wavelength or wavelength range; whereby to determine the optical effectiveness, a 3-dimensional finite element electromagnetic simulation is carried out to calculate the quantum efficiency of the detector configuration geometry.

The thin contact layer may be initially formed on a substrate which is subsequently removed or thinned using a mechanical thinning technique. The mechanical thinning technique may be, for example, lapping or diamond turning and the thickness of the substrate is within a range of 30 μm to 50 μm thick.

The infrared photodetector may comprise a plurality of reflective sidewalls such that the roundtrip optical pathlength of the unabsorbed light reflecting from the 30- to 50-μm substrate is larger than 20 wavelengths and almost all reflected light from the substrate is not coherent within the active layer so that optical interference effects are negligible whereby the efficiency may be determined by $$\eta = t_s \eta_{int} = t_s \frac{1}{p}\left[t + \frac{e^{-\alpha p}}{2\alpha}(1 - e^{2\alpha t})\right]$$

for incoherent light with prism-QWIPs, where $t_s$ is the substrate transmission coefficient, p is the pixel pitch, α is the absorption coefficient, t is the material thickness.

The configuration of the surface of the absorption layer may be a series of circular discs, pyramidal, resembling a prism, or the like. The absorption layer may comprise a quantum well material having a thickness in the range of 1.5 μm-12 μm and be configured such that the absorption layer is sensitive to light only when the light is propagated parallel to the growth plane of the active layer, and where light entering the photodetector is normal to the active layer.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention can best be understood when reading the following specification with reference to the accompanying drawings, which are incorporated in and form a part of the specification, illustrate alternate embodiments of the present invention, and together with the description, serve to explain the principles of the invention. In the drawings:

FIG. 1 is a schematic illustration of grating coupled QWIPs adopted in commercial QWIP cameras, having a grating period of a+b, and grating groove height is h. The values of a, b and h determine the diffraction angle θ of a particular wavelength.

FIG. 6B schematically illustrates the cross-section of $E_z$ distribution at λ=9.0 μm for a PR-QWIP with air cover and AR substrate coating.

FIG. 8 illustrates the calculated $E_z$ in PR-QWIPs with air cover where, in place of the conventional substrate, the pixel has an extra thin film coating beneath the common contact layer (single layer thin film; thickness=1.4 μm and n=1.8) at λ=8.4 μm.

FIG. 9B graphically illustrates the average magnification factor $M \equiv I_z/I_{inc}$ inside the PR-QWIP with reflecting layers and 36 μm common contact layer. The arrows show the predicted Fabry-Perot Peaks.

FIG. 13 illustrates in cross-section $E_z$ distribution at λ=9.0 μm of the embodiment of FIG. 12.

FIG. 14A graphically illustrates the QE of a PY-QWIP without an AR-coating.

FIG. 14B graphically illustrates the QE of a PY-QWIP with a 9 μm AR-coating.

FIG. 16 illustrates the QE of a CC-QWIP with and without a 9 μm AR-coating.

FIG. 17A illustrates the 3D geometry of a GR-QWIP with the $E_z$ distribution shown at λ=9.7 μm.

FIG. 17B illustrates the $E_z$ distribution at λ=9.7 μm at the center plane of the active material of the embodiment of FIG. 17A.

FIG. 22A graphically illustrates the calculated and measured external QE of PR-QWIP FPA#1.

FIG. 24 graphically illustrates the measured noise gain of FPA#2.

FIG. 25A graphically illustrates the calculated and measured external QE of PR-QWIP FPA#2.

FIG. 27 graphically illustrates the measured noise gain of FPA#3.

FIG. 28A illustrates the calculated and measured external QE of PR-QWIP FPA#3.

FIG. 29 illustrates the calculated α of the GR-QWIP FPA.

FIG. 31A illustrates the top view of the modeled grating structure and the $E_z$ distribution on the center plane of the active layer at λ=10.6 μm.

FIG. 31B illustrates the experimental grating structure.

FIG. 33A illustrates the calculated and measured external QE spectra of a PY-QWIP FPA. The absolute QE value of the FPA has not been determined.

FIG. 33B shows the infrared image taken by the 1-mega-pixel PY-QWIP FPA.

FIG. 39 illustrates step 1 of the method depicted in the flow chart of FIG. 38.

FIG. 40 illustrates step 2 of the method depicted in the flow chart of FIG. 38.

FIG. 41 illustrates step 3 of the method depicted in the flow chart of FIG. 38.

FIG. 42 illustrates step 4 of the method depicted in the flow chart of FIG. 38.

FIG. 43 illustrates step 5 of the method depicted in the flow chart of FIG. 38.

FIG. 44 illustrates step 6 of the method depicted in the flow chart of FIG. 38.

FIG. 45 illustrates step 7 of the method depicted in the flow chart of FIG. 38.

FIG. 46 illustrates step 8 of the method depicted in the flow chart of FIG. 38.

FIG. 47 illustrates step 9 of the method depicted in the flow chart of FIG. 38.

FIG. 48 illustrates step 10 of the method depicted in the flow chart of FIG. 38.

Figure 2B:
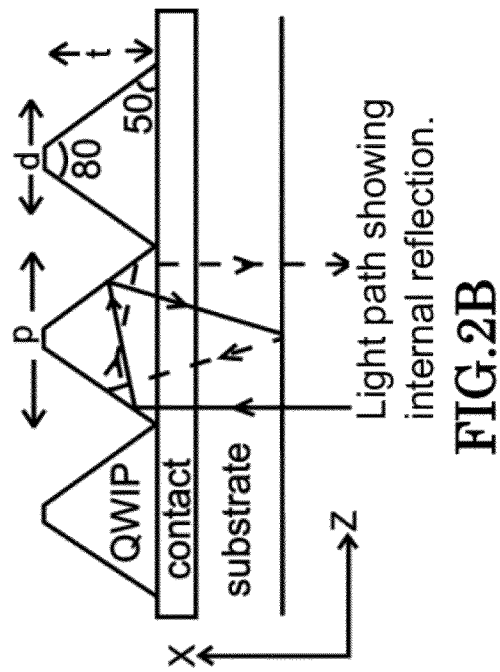
FIG. 2B shows a partial cross-section of the C-QWIP detector of FIG. 2A containing three corrugations and a light path showing internal reflection.
Figure 2A:
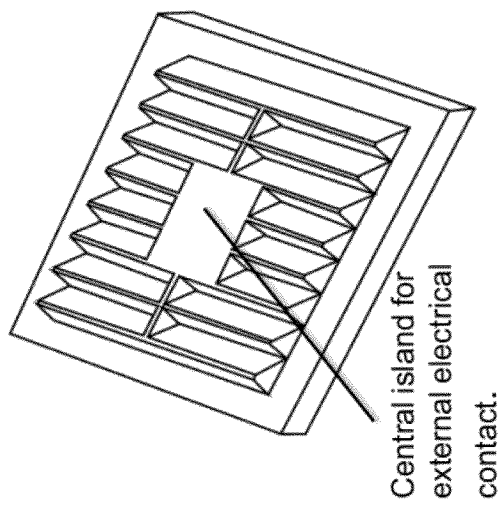
FIG. 2A is a schematically illustration from a 3-dimensional perspective of a C-QWIP detector pixel, which contains a number of corrugations and a central island for external electrical contact.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DETAILED DESCRIPTION OF THE PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

Resonance(s)

Figure 4:
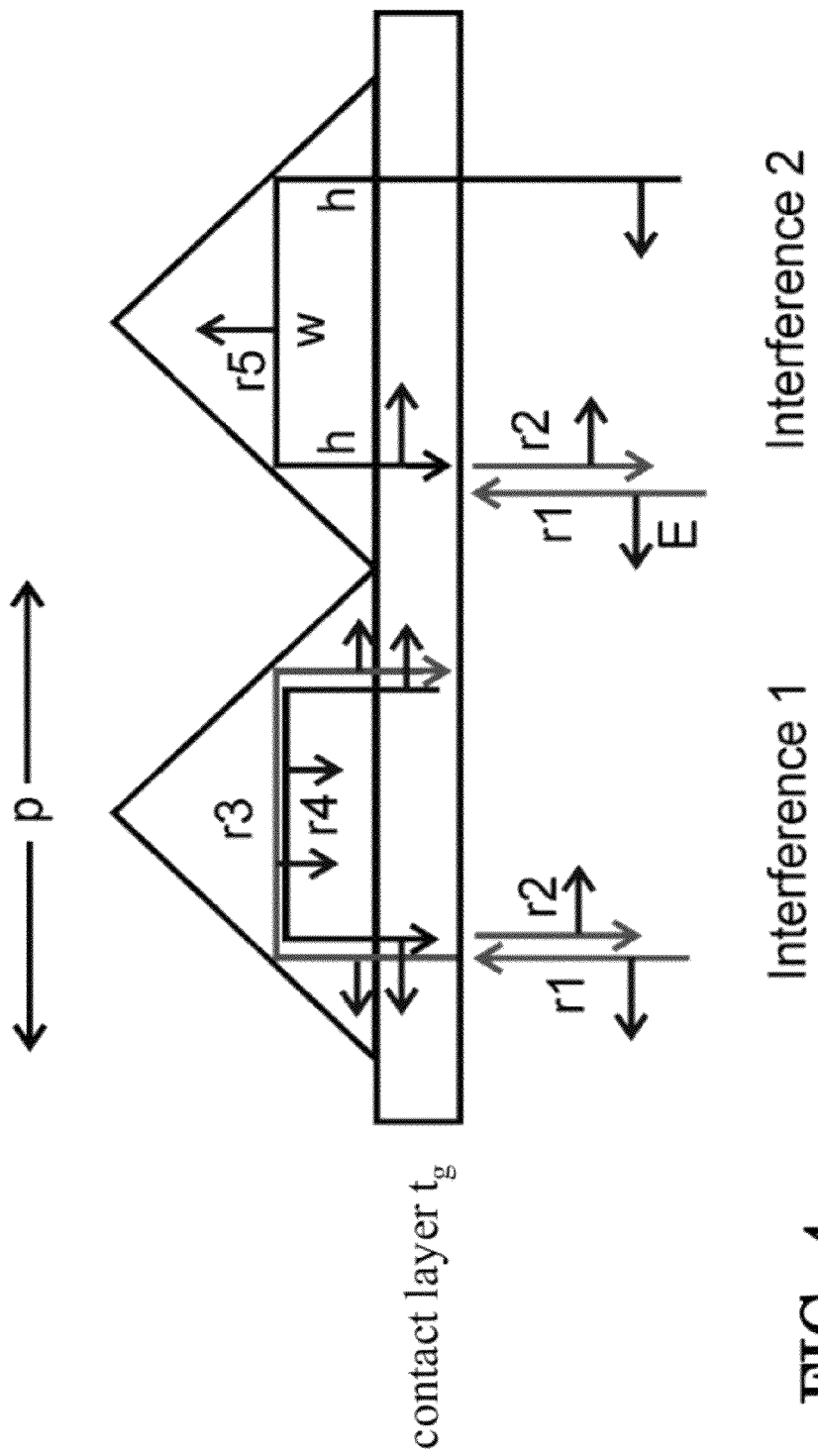
FIG. 4 schematically depicts wave interference for two C-QWIP pixels shown in cross-section.

The terminology "resonance," as used in this patent application and claims, means phase coherent superposition of light within a confined geometrical object that gives rise to a large optical intensity in that object. The terminology "resonance" or "resonances" is mentioned in various places in the following description. Fabry-Perot resonances are referenced in modulating the substrate transmission of the C-QWIP, and resonances associated with Fabry-Perot (FB) mechanism. Normally, FB resonances refer to the situation when the light bounces back and forth between two parallel plates. If the left-going light is in-phase with the right-going light, the light intensities add. If they are out of phase, the intensities interfere or subtract. In C-QWIPs, because of the 45 degree sidewalls, (FIG. 4) the light incident on the left side of the corrugation will be reflected back by the substrate on the right after two 90 degree sidewall reflections. Therefore, the substrate on the left and right are analogous to the two parallel plates in the standard FB mechanism. Resonances do not need two parallel plates in general. As long as the light can return to the original place after a number of reflections inside a geometry, it can set up a resonance, and in this case, a standing wave is established (a wave just goes back and forth). Whenever the incident power can reinforce the later incident power and the process repeats, the energy or intensity in that localized region can build up to a large value; analogous to riding on a swing. The R-QWIP has many reflecting surfaces and due to diffraction effects, the angle of incident and the angle of reflection on any plane need not be the same. For some wavelengths, the light bouncing along the discs can trace out a circular path. Therefore, in complicated geometries, there are many standing wave patterns and it is hard to analyze these patterns analytically. FB resonances or the acoustic waves in flutes are standing waves in simple geometries. In general, a numerical method is needed to discover/explore these resonance(s).

EM Modeling

To optimize an existing detector structure and to search for a new detector configuration, it is desirable to know the QE theoretically before expensive experimental resources are committed. However, there have been very few known attempts to construct a rigorous and flexible approach that can yield $E_z$ quantitatively under any arbitrary detector configurations and even fewer attempts to compare it with experiment. In this application, a rigorous three-dimensional finite element electromagnetic (EM) approach is used in obtaining QE quantitatively and explicitly and compared the model with experiments. The experimental results tend to agree with the theoretical modeling to within experimental uncertainty. After creating a reliable approach, other more complicated and unconventional optical coupling schemes were explored, with which a new type of detector geometry is proposed.

To illustrate the coherent optical effects, a 3-dimensional (3D) finite element electromagnetic (EM) simulation is carried out to calculate the quantum efficiency (labeled as QE or η) of any detector geometry using Equation (1). For a given optical power $P_0$ incident normally on a detector area A, the absorption quantum efficiency, labeled as QE or η, is given by $$\eta = \frac{1}{P_0} \int_V dI(\vec{r}), \qquad (1)$$

$$= \frac{1}{P_0} \int_V \alpha I(\vec{r}) d^3 r,$$

$$= \frac{\alpha}{A_2^{c\varepsilon_0} E_0^2} \int_V \frac{nc\varepsilon_0}{2} |E_z(\vec{r})|^2 d^3 r,$$

$$= \frac{n\alpha}{A E_0^2} \int_V |E_z(\vec{r})|^2 d^3 r,$$

where V is the detector active volume, I is the optical intensity associated with $E_z$, α is the absorption coefficient, and n is the material refractive index. In step 2 of Eqn. (1), use is made of the fact that the optical absorption at a particular location is linearly proportional to the light intensity at that location, and there is no need to rely on the assumption of exponentially decaying light. Equation (1) is thus applicable to both coherent and incoherent distribution of light intensity. Equation (1) reveals that the QE of any QWIP detector can be calculated from the volume integral of $|E_z|^2$ in the presence of a finite α. If $E_z$ in Eqn. (1) is replaced by the total E, it will be applicable to other detectors with isotropic absorption as well. Therefore, Eqn. (1) is extremely useful to any detector research.

Since $E_0$ (the incident electric field in free space) and $E_z$ are linearly proportional to each other in Equation (1), $E_0$ can be set arbitrarily, and the only input parameter in Equation (1) is the wavelength-dependent α(λ). Throughout this application, the x and y components of the incident E field are set to be the same to represent unpolarized light, and they are equal to 377 units. The value of $E_0$ in (1) is thus equal to 377√2 units, and it is polarized diagonal to the pixel. The α spectrum can be calculated from the material structure by Choi K. K, "The Physics of Quantum Well Infrared Photodetectors," World Scientific, New Jersey, 122-125 (1997), hereby incorporated by reference. For a known α(λ), there will be no more free parameters and the value of η(λ) is uniquely and unambiguously determined. To solve for $E_z$ numerically, commercial software can be used, such as COMSOL Multi-physics. After the detector geometry is constructed in this software, the only input parameter in the program is α. The α spectrum can be calculated from the material structure by $$\alpha(\lambda) = \sum_n \frac{N_D W}{L} \frac{\pi e^2 \hbar}{2\sqrt{\varepsilon_h} \, \varepsilon_0 m * c} f_n \rho_n(\lambda), \qquad (2)$$

where $N_D$ is the doping density in the well, W is well width, L is the QW period length, $f_n$ is the oscillator strength from the ground state to the $n^{th}$ excited state, and $\rho_n$ is the normalized Gaussian broadening for each optical transition. The values of $f_n$ are obtained after solving the eigen energies and eigen functions of the structure. Except for a weakly adjustable line broadening parameter for ρ, the α spectrum of a given material is fixed, and thus the QE of any detector is calculable from Equations (1) and (2) without any empirical input parameters.

In some special detector geometries such as the corrugated-QWIPs (C-QWIPs), the classical $|E_z|^2$ may be determined using ray-tracing techniques. In this case, the classical QE, which does not take the optical interference into account, can be evaluated and be used as a gauge for the rigorous EM model. The C-QWIP pixel geometry uses 48° angled sidewalls to reflect light into parallel propagation. Using an approximation of 45°, the classical solution for Equation (1) is $$\eta = t_s \eta_{int} = t_s \frac{1}{p}\left[t + \frac{e^{-\alpha p}}{2\alpha}(1 - e^{2\alpha t})\right], \quad (3)$$

for the prism-shaped C-QWIPs. In Equation (3), $t_s$ is the substrate transmission, $\eta_{int}$ is the internal quantum efficiency, p is the pixel linear dimension, and t is the corrugation height. Without an AR-coating, $t_s$=0.72. Likewise, the classical of a pyramidal C-QWIP, which has four inclined sidewalls, is $$\eta = \quad (4)$$
$$t_s \frac{\exp(-\alpha p)}{\alpha^2 p^2}\{1 + \alpha p + 2\alpha^2 t(p-t)\exp(\alpha p) + [\alpha(2t-p)-1]\exp(2\alpha t)\}.$$

As used herein, the terminology AR-coating refers to a type of optical coating applied to the surface to reduce reflection. An anti-reflective coating (AR coating) may comprise metal oxides, for example, operating to block reflected light.

Color Significance in Quantum Well Infrared Photodetectors

Certain of the drawings contain colors inside of the quantum well infrared photodetectors. The color represents the magnitude of the vertical optical electric field $E_z$. Scales appearing to the right of the figures reveal that the blue represents a very large negative value and the red represents a very large positive value. Since the intensity depends on $E_z^2$, the magnitude or intensity, rather than the sign, is important. Both the red and blue regions represent high intensity regions. Since light is a wave, it has both positive and negative components, depending on the phase at a particular instant (like the peaks and valleys in water or sine wave). For this reason, the areas of high intensity red are accompanied by areas of high intensity blue. If the $E_z$ is plotted in another time instant, the color will reverse, but the intensity does not change.

In search of an efficient structure, it is desirable to have a lot of red and blue in the distribution. The integral of $E_z$ square gives the quantum efficiency (QE).

For the resonantly enhanced Quantum Well Infrared Photodetectors, such as the embodiment comprising square ring protrusions, the concern is not the color intensity appearing on the square rings, which is not the active material. Instead, it is desirable to maximize is the intensity inside the QWIP active layer beneath the 4 square ring protrusions; i.e., the $E_z$ distribution inside the QWIP active layer. As an example of the relative values of $E_z$ and $E_0$, for an incident electric field $E_0$ of 377√2 V/m in free space, the resulting $E_z$ inside the QWIP material can be as high as 2600 V/m, which means the light intensity ($E^2$) is intensified in some regions in the active layer(s).

Reflective Inclined Sidewalls

A sidewall reflector is disclosed in U.S. application Ser. No. 12/543,121 entitled "Corrugated-Quantum Well Infrared Photodetector with Reflective Sidewall and Method." Under this type of light coupling approach, the sidewalls of a detector pixel are etched at an angle to produce inclined sidewalls, which reflect the incoming light into parallel propagation through total internal reflection. When used in focal plane array (FPA) production, the pixels may be covered with infrared absorbing materials, such as epoxy glue, which can affect the optical reflectivity of the sidewalls. In such cases, a composite reflector may be deposited onto the pixels to ensure maximum sidewall reflectivity.

A pixel structure is shown in FIG. 5 of U.S. application Ser. No. 12/543,121. Each detector pixel in this preferred embodiment may comprise an active material with thickness $t_a$, a top contact layer 1 having a thickness $t_c$, and a bottom contact layer 4 having a thickness $t_b$. The total thickness $t=t_a+t_b+t_c$. The top contact layer 1 may have a different sidewall angle. The active layer 2 sidewall is preferably inclined at 45°, making the average mesa sidewall angle of 50° in the embodiment shown in FIG. 5 of U.S. application Ser. No. 12/543, 121. The mesa sidewall is covered by a protective layer. Underneath the structure, there is a common contact layer connecting all the detectors. The corrugation period p is designed to be the same as the pixel pitch in the one-corrugation-per-pixel design. This design is preferred in high definition arrays in which pixel size is small. As shown in FIG. 5 of U.S. application Ser. No. 12/543,121, a cover layer 7 is deposited on the sidewalls to isolate the detector material from the epoxy and provide reflectivity. Preferably, the reflectivity provided is close to the original total internal reflection and the cover layer 7 does not short out the electrical contacts that are located on top and bottom of the QWIP material.

Figure 3A:
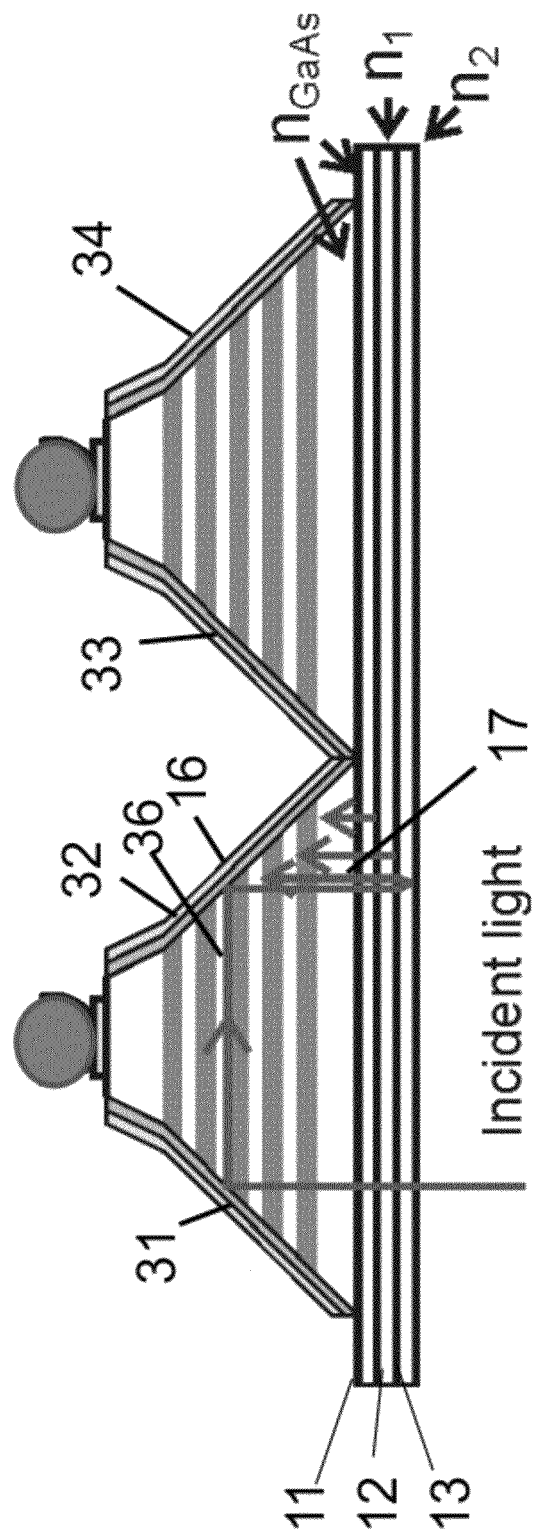
FIG. 3A schematically illustrates an example of two C-QWIP pixels (shown in cross-section in the x-z plane) comprising a thin common contact layer 11 and two material composite (thin film) reflecting layers 12, 13, one with refractive index n1 and the other n2, whereby, due to different optical properties, light is reflected at three interfaces, namely at the interfaces between GaAs/n1, n1/n2, and n2/air.

FIG. 3A schematically illustrates a preferred embodiment comprising two C-QWIP pixels (shown in cross-section in the x-z plane) having inclined sidewalls with reflecting layers. The incident light reflects at the pixel sidewall 30 and travels parallel to one of the QWIP active layers (36). One of the concepts of this invention is to eliminate or limit the thickness of the substrate to increase efficiency. An increase in the quantum efficiency is provided when the substrate layer is either substantially or totally removed to produce optical resonance effects. In addition, a thin composite film may be deposited external to the common contact layer to further alter these effects, as shown by elements 12 and 13 in FIG. 3. Without a thick substrate, the light reflected back from the bottom of the material surface will be coherent with the incoming light. The resulting optical resonances will intensify the light intensity at certain wavelengths within the detector volume, thereby increasing quantum efficiency (QE) at these wavelengths. The C-QWIP of FIG. 3B contains a substrate whose thickness is determined by the limits of mechanical thinning. With this substrate thickness, the unabsorbed light scattered back from the substrate, depicted by the arrow 17, is not coherent with the light in the active region. The composite thin film, which consists of a number of infrared transparent materials of different refractive indexes $n_i$, can increase the number of reflecting interfaces as a means to control the resonant wavelengths. Shown in FIG. 3A is a common contact layer 11 and a composite thin film layers 12, 13, one with refractive index n1 and the other n2, respectively. Due to different optical properties, light is reflected at three interfaces, namely at the interfaces between nGaAs/n1, n1/n2, and n2/air.

Figure 3B:
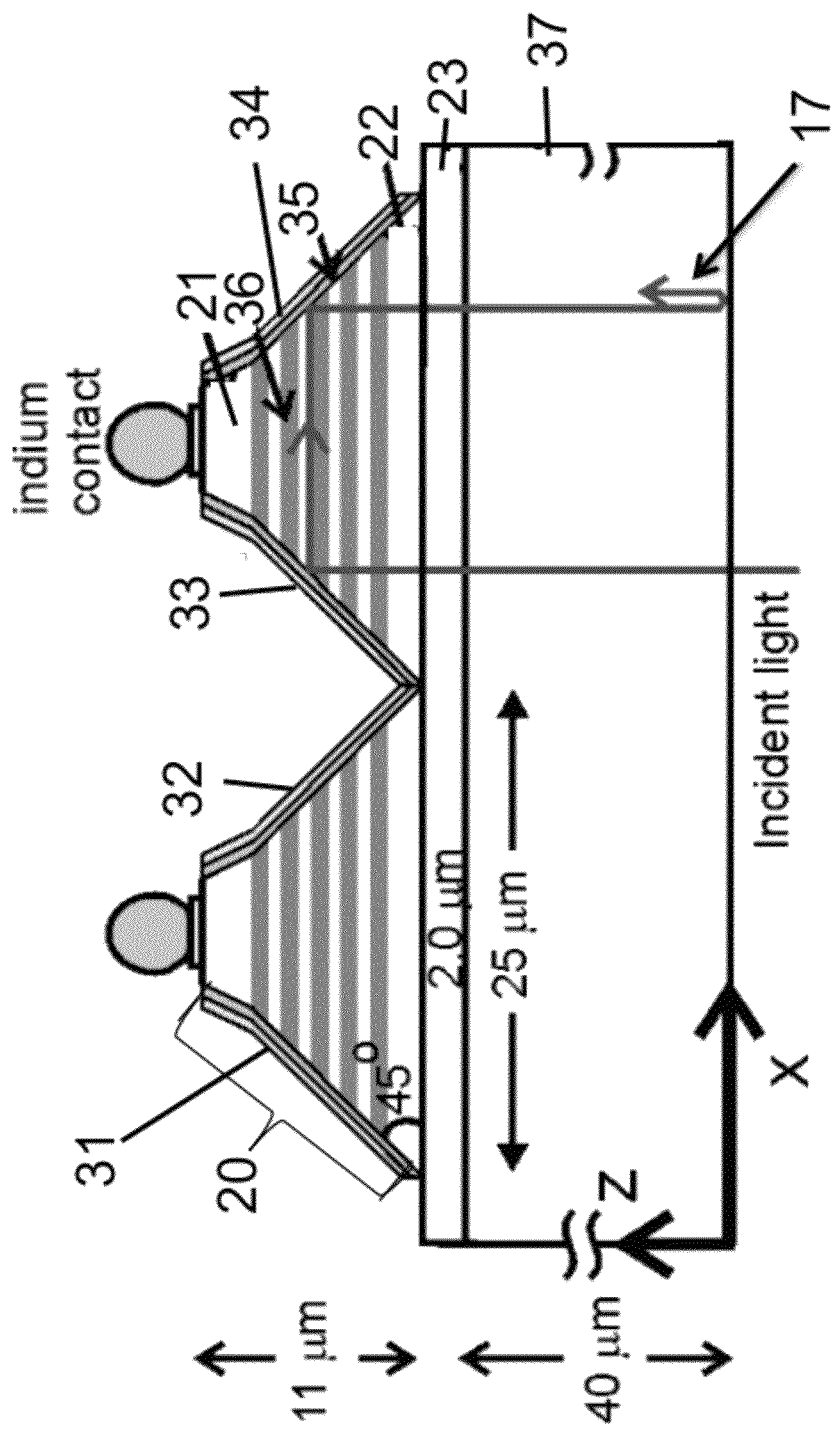
FIG. 3B schematically illustrates an example of a detector pixel approximately 25 μm across with a detector material (referenced as 20) thickness of 11 μm, which includes an active layer sandwiched between two contact layers 21, 22. Below the bottom contact layer 22, there is a common contact layer 23 connecting all the pixels and a substrate 37.

FIG. 3B schematically illustrates an example where each detector pixel is 25 μm across. The total detector material (referenced as 20) is 11 μm thick, which consists of an active layer, sandwiched between two contact layers 21, 22 at top and bottom, respectively. Below the bottom contact layer 22, there is a common contact layer 23 connecting all the pixels. The common contact layer 23 can be as thin as 0.5 μm for reliable contacting, but it is chosen to be 2.0 μm thick in this example. In the preferred geometry, the sidewalls covered by layers 31, 32, 33, and 34 are inclined at 45° with respect to the active layer as shown in one of the cross-sections (the x-z plane) in FIG. 3B. The angle of the top contact layer 21 can be made steeper to yield a wider contact surface at the top.

Although only one reference numeral appears, dielectric insulation layers 35 are positioned between each of the reflective surfaces or layers 31, 32, 33, and 34 and the detector material 20. The dielectric layers 35 are formed of Magnesium Fluoride, MgF$_2$, and used in separating the C-QWIP material and the gold reflecting surface. MgF$_2$ is just one preferred example, and other dielectric materials can be used.

Although 45° is the preferred sidewall angle, each of the four sidewalls can have different arbitrary angles. A more symmetrical geometry will be that of a pyramid (as shown in FIG. 6), which consists of four equally inclined sidewalls, or a prism (as shown in FIG. 5), which consists of two inclined sidewalls and two more vertical sidewalls. A C-QWIP can also be a cone-shaped object.

In the preferred embodiment depicted in FIG. 3B, a substrate layer 37 is shown beneath the common contact layer 23. This substrate layer 37 is part of the detector material upon which the active QWIP layers are deposited. After flip-chip bonding to a readout integrated circuit (ROIC), substrate 37 is usually thinned to improve the mechanical stability upon thermal cycling. With various mechanical thinning techniques, such as lapping or diamond turning, the thinnest substrate one can obtain is about 40 μM.

For infrared imaging within the two atmospheric windows, which span from 3 to 5 μm and 8 to 12 μm respectively, the optical wavelength inside the QWIP material is shorter than 4 μm because of the large refractive index (n~3.24) of the GaAs substrate. The roundtrip optical path length of the unabsorbed light reflecting from the substrate will therefore be larger than 20 wavelengths for a 40 μm substrate. Because of the fact that the coherence length of thermal radiation is no longer than a few wavelengths, almost all reflected light from the substrate (an example of which is depicted by the arrow 17 in FIG. 3B) will not be coherent with the light inside the active material. As such, optical interference effects are negligible in the C-QWIP cameras, and the quantum efficiency (labeled as QE or η) of a C-QWIP is well described by the classical ray-optics.

By tracing the infrared absorption of a light beam along its optical path, η is given by (as described further in "Light coupling characteristics of corrugated quantum-well infrared photodetectors," K. K. Choi, K. M. Leung, T. Tamir and C. Monroy, IEEE J. Quant. Elect. vol 40, pp. 130-142, (2004), hereby incorporated by reference):

$$\eta = t_s \eta_{int} = t_s \frac{1}{p}\left[t + \frac{e^{-\alpha p}}{2\alpha}(1 - e^{2\alpha t})\right], \quad (3)$$

where $t_s$ is the substrate transmission coefficient, p is the pixel pitch, α is the absorption coefficient, t is the QWIP material thickness. For a GaAs substrate with n=3.24, $t_s$=0.72.

Figure 7A:
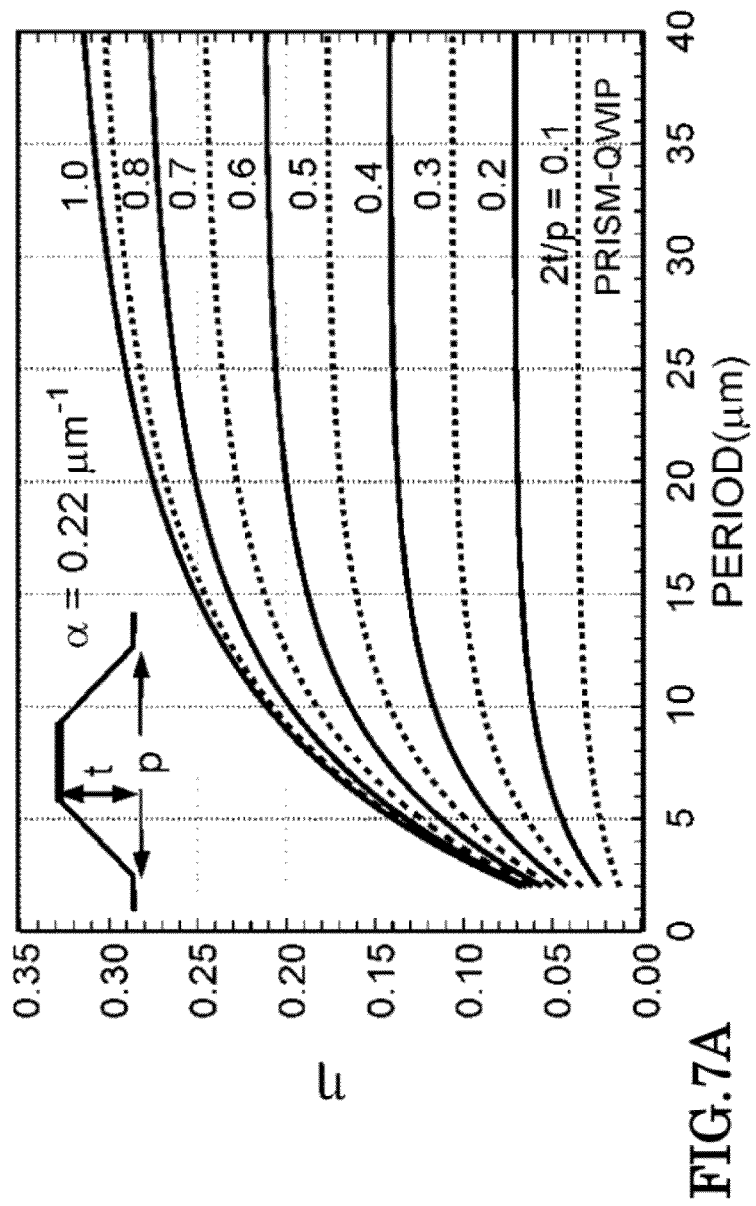
FIG. 7A graphically illustrates the external unpolarized QE (for unity pixel fill factor) of a PR-QWIP (PRISM) for different pixel geometries.
Figure 7B:
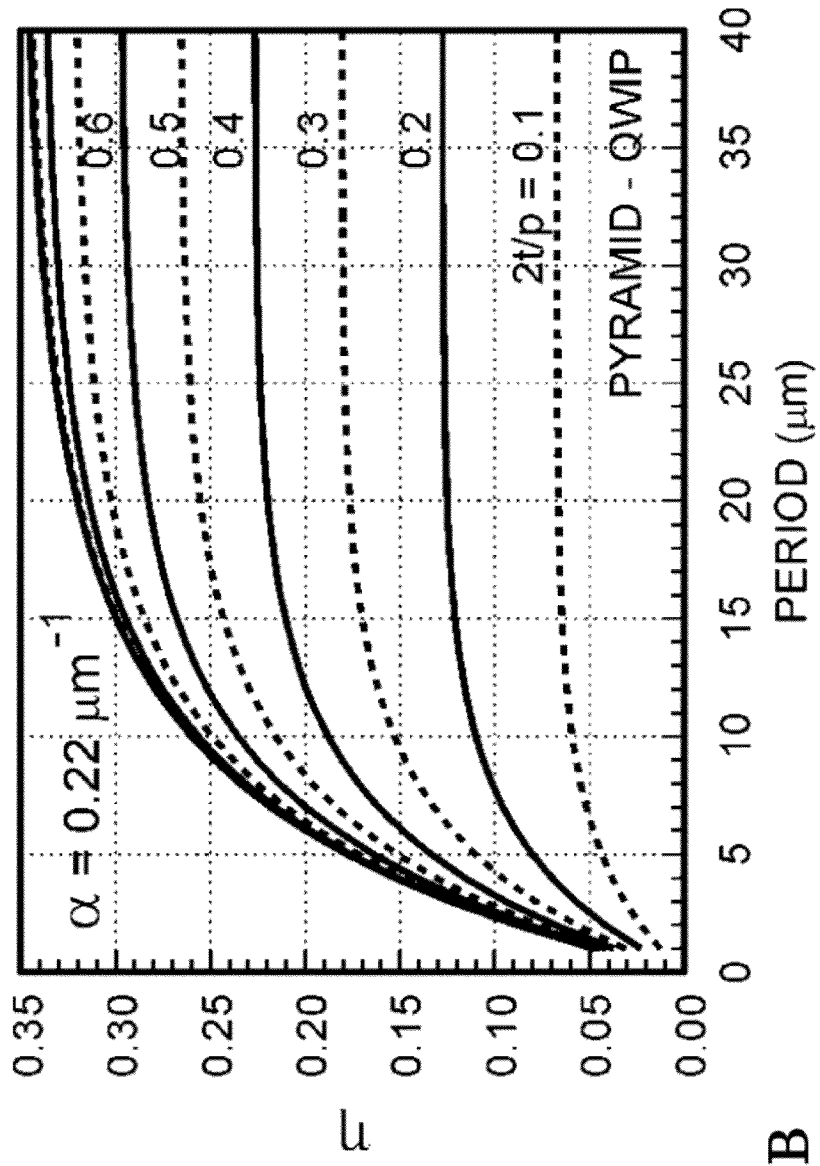
FIG. 7B illustrated graphically the External unpolarized QE (for unity pixel fill factor) of a PY-QWIP (Pyramid) for different pixel geometries.

With an exemplified α of 0.22 μm$^{-1}$, FIGS. 7A and 7B graphically illustrate the external unpolarized QE (for unity pixel fill factor) of a PR-QWIP (PRISM) and pyramid-shaped C-QWIP (labeled as PY-QWIPs) for different 2t/p ratios (pixel geometries). Shown are the theoretical quantum efficiency (QE) for QWIPs under ray-optics analysis with different detector geometries when the substrate is thick with an assumed pixel pitch of 25 μm (dash lines indicate classical quantum efficiency (QE) with thick substrates). For a typical p=25 μm and t=11 μm, the theoretical QE is 27% for PR-QWIPS and 32% for PY-QWIPS.

In order to further increase the quantum efficiency of a C-QWIP, the present patent describes a new C-QWIP detector structure in which the substrate layer is either substantially or totally removed to produce optical resonance effects. In addition, a thin composite film may deposit external to the common contact layer to alter these effects. Without a thick substrate, the light reflected back from the bottom of the material surface will be coherent with the incoming light. The resulting optical resonances will intensify the light intensity at certain wavelengths within the detector volume, thereby increasing QE at these wavelengths.

Resonance

To gain physical insights into the resonant mechanism and thus the pixel design rules, a simplified C-QWIP structure is considered in FIG. 4A, which schematically illustrates C-QWIP geometry with period p and common contact layer $t_g$. FIG. 4A shows the ray diagrams of the two sets of optical interferences. It does not have a reflector cover or a thin film coating so that the number of reflecting interfaces is limited to three: two at the sidewalls and one at the common contact layer. They are all in contact with air. The pixel period is p and the common contact layer thickness is $t_g$.

In FIG. 4A, one can identify two sets of coherent interference, which are labeled as interference 1 and interference 2. In interference 1, the incident beam $r_1$ partially transmits into the substrate as $r_3$. Through partial reflection at the other bottom side of the corrugation, the light makes a round trip inside the corrugation and interferes with the reflected beam $r_2$. If $r_4$ and $r_2$ interfere destructively, the substrate reflection will be reduced and $r_3$ will be strengthened. Upon more round trip interferences, the substrate reflection will be completely suppressed and the internal intensity is greatly enhanced, analogous to the usual Fabry-Perot resonances in parallel planes. The analogy exists because all the incident light has the same path length of $(2t_g+2h+w)=(2t_g+p)$ in the corrugation between the two substrate reflections, independent of the incident location. They differ only in that the corrugated structure possesses another interference set (#2), in which $r_1$ interferes with another beam $r_5$ incident on the opposite sidewall.

Since there is a phase shift of π upon 45° internal reflection for the transverse magnetic (TM) mode, the optical E vector switches direction at the inclined surfaces as depicted in FIG. 4A. Therefore resonance for interference 1 occurs when the sum of the phase shift of $r_3$ and $r_4$ is 2Nπ, where N is an integer. Hence, $$2\left(\frac{2\pi n_q p}{\lambda} + 2\frac{2\pi n_g t_g}{\lambda}\right) = 2N\pi, \quad (5)$$

$$\Rightarrow \lambda = \frac{2n_q p + 4n_g t_g}{N},$$

where λ is the wavelength in free space, $n_g$ is the contact layer refractive index, and $n_q$ is the QWIP refractive index. For interference 2, following again the change of the E direction, the resonance condition is:

$$\frac{2\pi n_q p}{\lambda} + 2\frac{2\pi n_g t_g}{\lambda} = (2N+1)\pi, \quad (6)$$

$$\Rightarrow \lambda = \frac{2n_q p + 4n_g t_g}{2N+1}.$$

Since the electric fields of the two resonant series are out of phase, they tend to cancel each other when the wavelength multiples are odd. The remaining strong resonances are at even multiple of λ where $$\lambda = \frac{2n_q p + 4n_g t_g}{2N}. \quad (7)$$

To yield a large number of resonant wavelengths for comparison, a structure with $t_{g=36}$ μm is considered in FIG. 9B, and optical coherence is assumed in this hypothetical case. The straight arrows indicate the λ values given by Eqn. (7). FIG. 9B also shows the calculated result using finite element EM simulation with $t_g$=36 μm. The peak positions between the two calculations are in agreement, thus validating the underlying physical principle of Fabry-Perot oscillations. The small discrepancy between the peak locations at shorter wavelengths is due to the fact that the structure under electromagnetic (EM) simulation has 48° sidewalls, while that for the Fabry-Perot peak analysis assumes 45°. The small resonant peaks in the EM simulation are those resonances with odd multiple wavelengths.

FIG. 9B shows the magnification factor $M \equiv I_y/I_{inc}$ averaged across the center cross section inside the PR-QWIP with reflecting layers and 36 μm common contact layer. The straight lines indicate the even wavelength multiple resonances for the simplified PR-QWIP with the same 36 μm common contact layer.

The above analysis shows that the C-QWIP resonances are originated from the light bouncing back and forth between the common contact layer. In the presence of extra interfaces in the actual C-QWIP pixels, which include the interfaces between QWIP/MgF$_2$, MgF$_2$/Au, QWIP/thin film, and thin film/Air, the exact resonant wavelengths will be more complicated and can only be obtained from finite element EM simulation. Nevertheless, Eqn. (7) is shown to provide a good estimate on these wavelengths and suggested that one can change either the common contact thickness or the remaining substrate thickness for a fixed p to design different resonant wavelengths.

Resonance also occurs in grating coupled detectors, but it has been overlooked generally. For example, FIG. 17A shows a grating coupled QWIP (GR-QWIP) geometry and FIG. 17B shows the associated $E_z$ distribution. The pixel area is 23×23 μm². The material active layer is 1.5 μm-thick, and the common contact layer is 1.0 μm-thick. On top of the active layer, there is a reflective grating with period d of 3.0 μm and height h of 0.75 μm. The grating is covered entirely with a highly conductive metal such as gold. These period and height are optimized for an incident light with λ=9.72 μm in free space. According to the standard grating formula, which is d sin θ=λ/n, d should be chosen such that θ=90° for a given λ. To eliminate the zeroth diffraction that reflects the light directly backward, h is chosen to satisfy h=λ/(4n).

Figure 18:
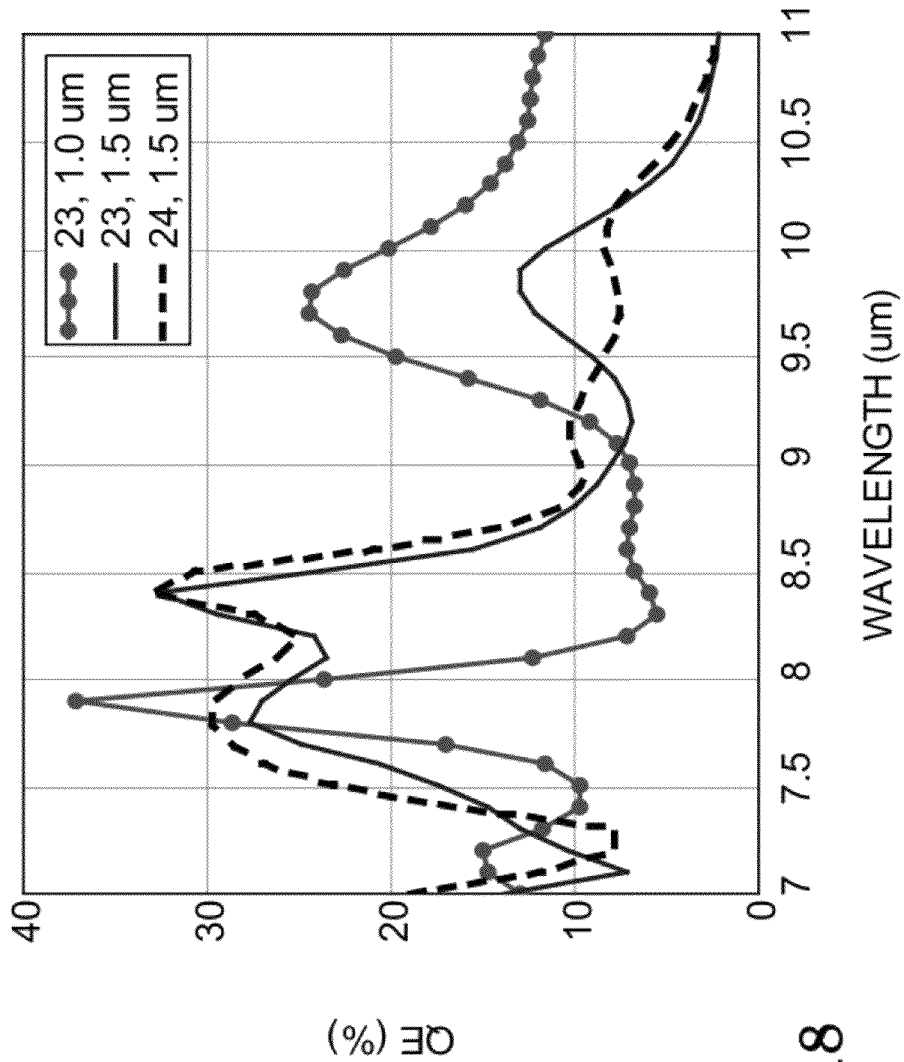
FIG. 18 illustrates the QE of three GR-QWIPs having different pixel size and common contact layer thickness. The grating period is 3.0 μm, the grating height is 0.75 μm, and the active layer thickness is 1.5 μm.
Figure 35:
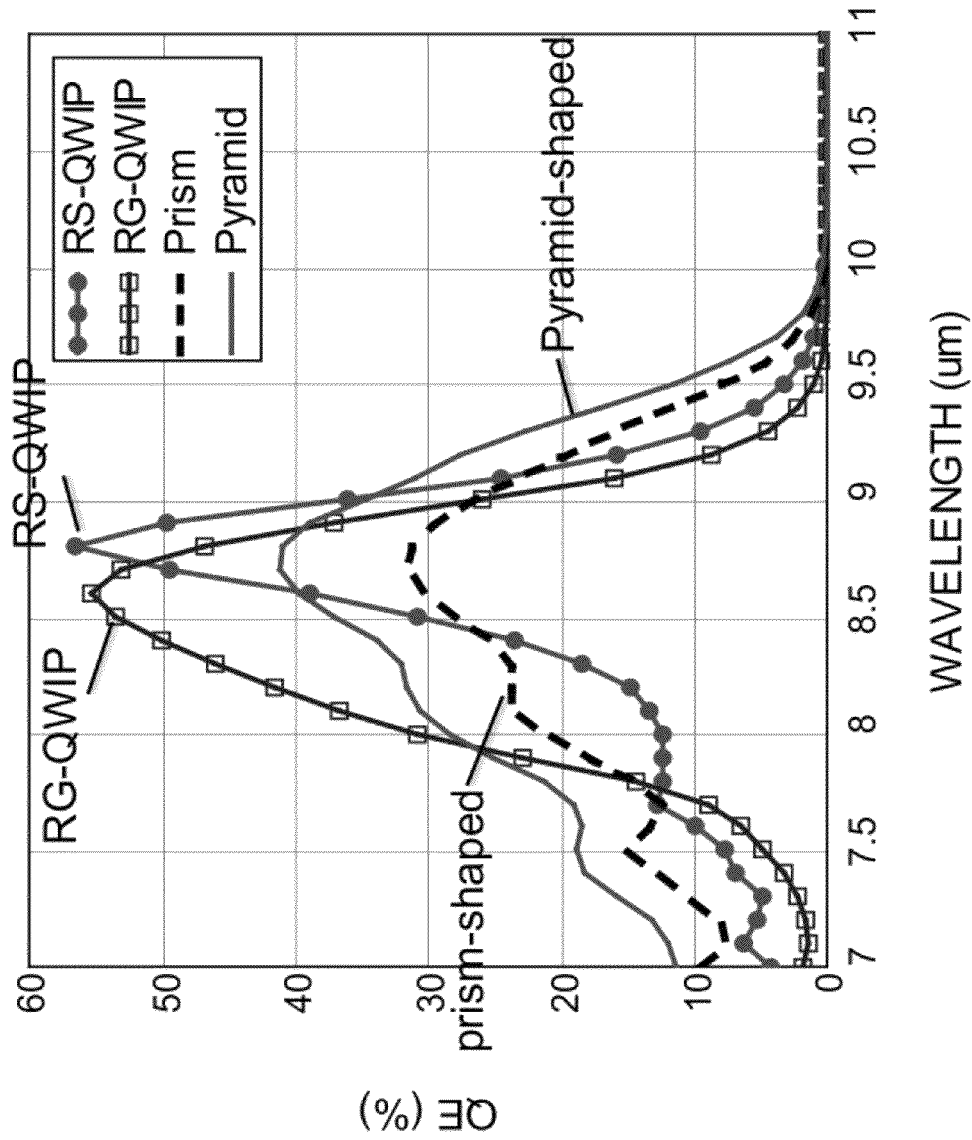
FIG. 35 illustrates the calculated QE of the prism-shaped and pyramid-shaped C-QWIPs for a material with a spectrum shown in FIG. 20 and the R-QWIPs with the same a spectral lineshape but with a peak value of 0.20 µm$^{-1}$.
Figure 36A:
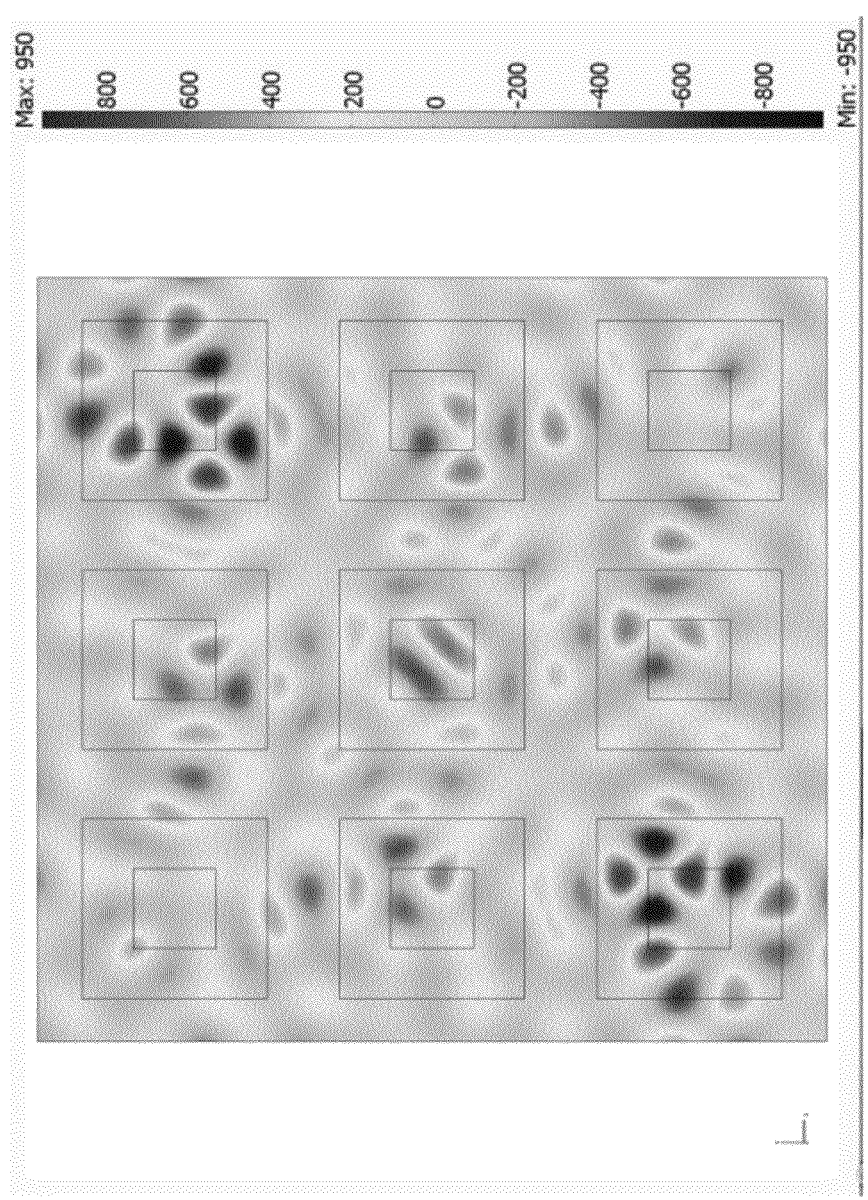
FIG. 36A illustrates the $E_z$ distribution at the center plane of the active layer at λ=7.0 µm.
Figure 36B:
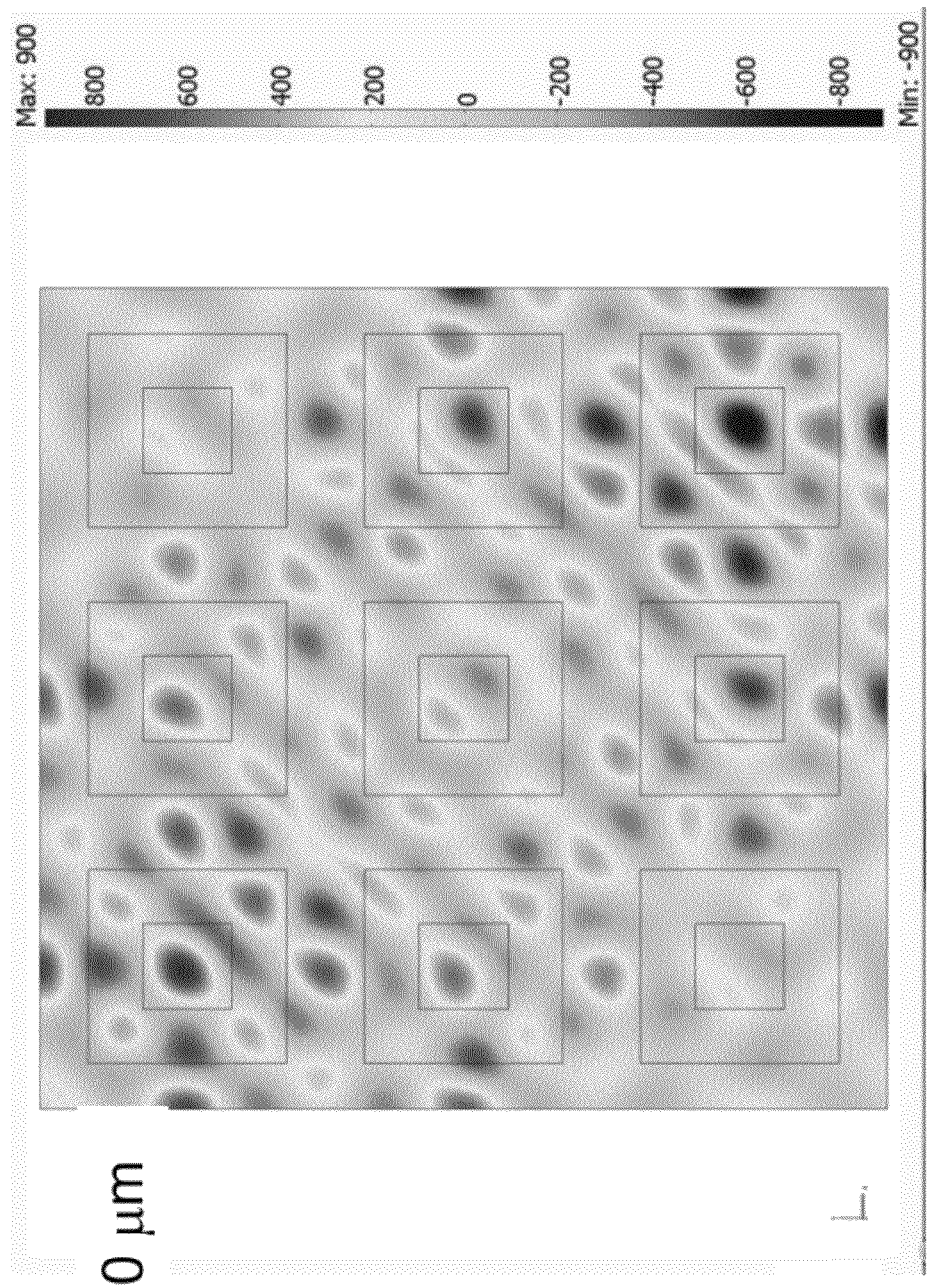
FIG. 36B illustrates the $E_z$ distribution at the center plane of the active layer at λ=8.0 µm.
Figure 36C:
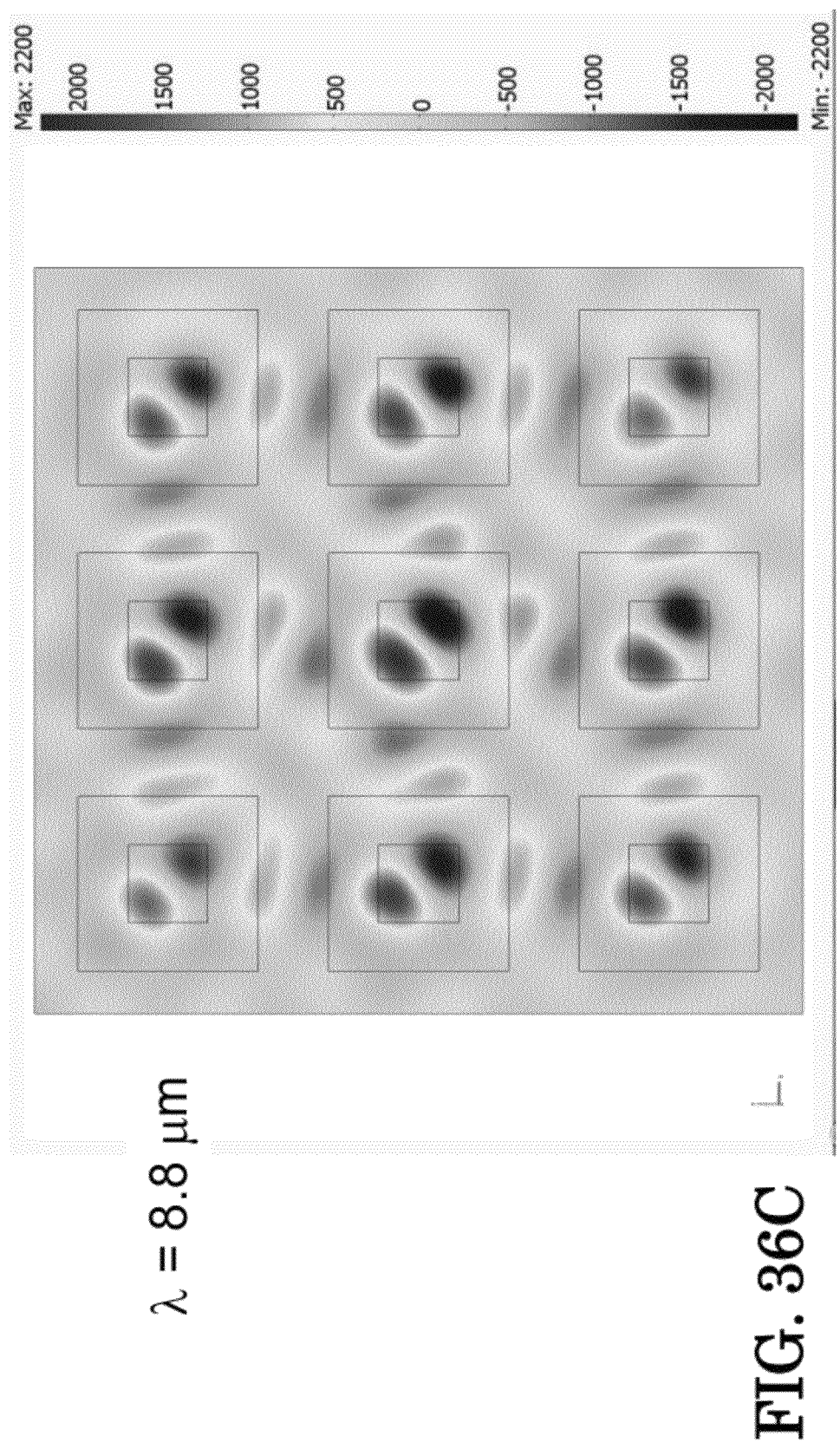
FIG. 36C illustrates the $E_z$ distribution at the center plane of the active layer at =8.8 µm.
Figure 36D:
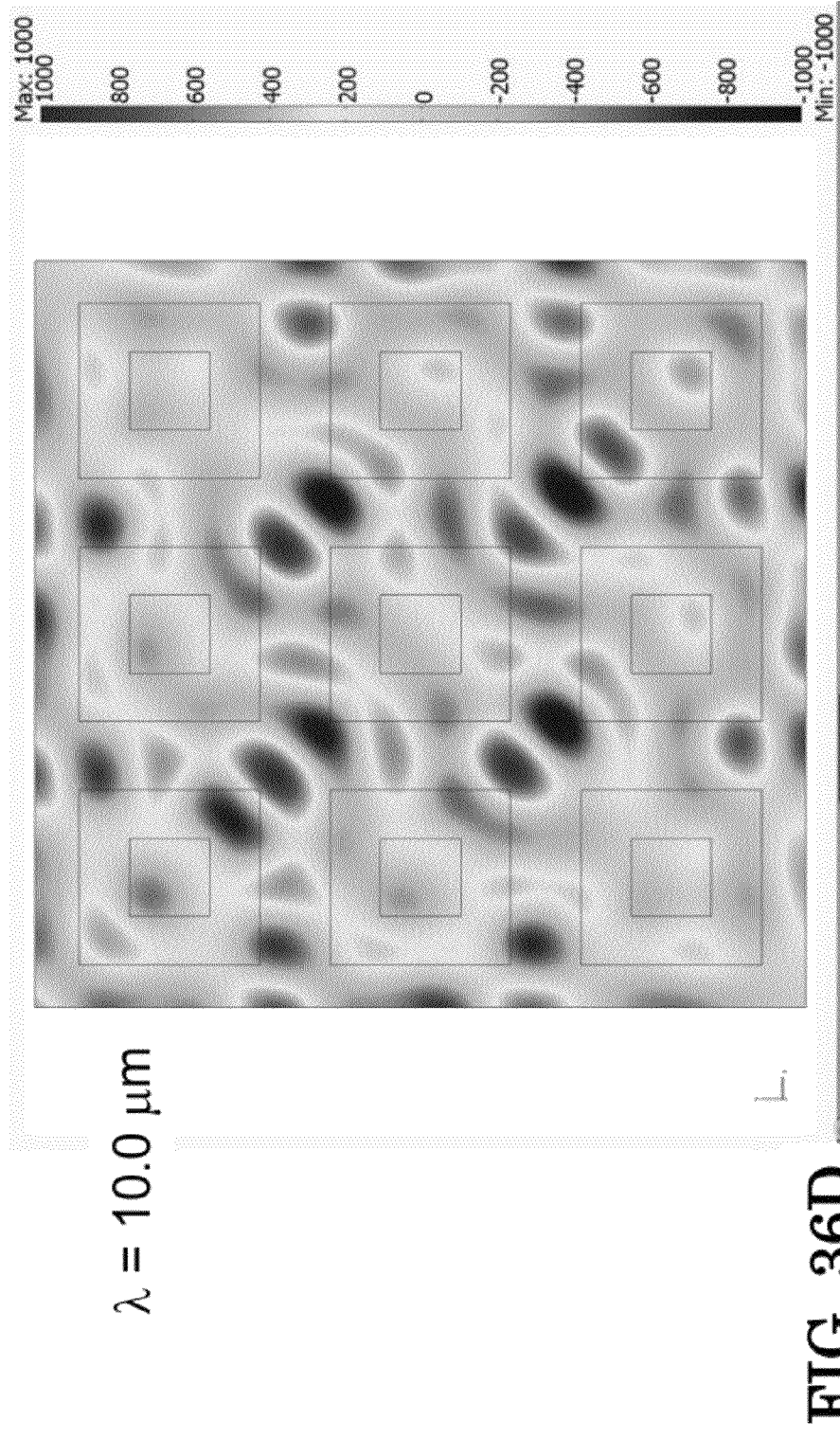
FIG. 36D illustrates the $E_z$ distribution at the center plane of the active layer at λ=10.0 µm.

In practice, such a grating structure will be placed on a material with the same peak absorption λ but otherwise arbitrarily selected active layer thickness $t_a$, common contact layer thickness $t_c$ and pixel size p. These material thicknesses and pixel dimensions are considered separately from that of the grating's based on factors such as material cost and readout circuit dimensions. However, based on the present EM modeling, the solid curve with circles in FIG. 18 shows that for the prescribed material thickness and pixel size, a significant peak indeed appears at ~9.7 μM as the grating formula predicts. However, the magnitude of this peak varies with p and $t_c$ for the same $t_a$, and there are larger peaks at the shorter wavelengths that correspond to smaller values of θ. Therefore, there are factors other than d and h affecting the grating efficiency, and the grating formula alone cannot provide a complete prescription for the detector design. With a finite pixel size, the detector volume is in fact a resonant cavity. When the incident light of a particular λ enters into the detector pixel, it will be diffracted by the grating at a specific θ. The diffracted light rays will reflect at the pixel sidewalls and substrate, and form an interference pattern. If this interference pattern constitutes to a large integrated intensity, the cavity is said to be in resonance. For a particular set of pixel dimensions, there will be a set of θ and a set of corresponding λ that result in large intensities. However, for QWIPs, only the vertical component of the intensity results in absorption. Therefore, in order to obtain the absolute maximum QE, the dimensions of the pixel have to be adjusted such that one of the resonances occurs when θ is near 90°. Such an optimized structure will be referred to as one member of the resonator-QWIPs (R-QWIPs), and it will be labeled as RG-QWIP. After such an optimization procedure, the QE of a RG-QWIP can be very large, reaching 55% as shown in FIG. 35. The detector parameters are: p=23 μm, d=2.7 μm, h=0.62 μm, $t_{a=1.0}$ μm, and $t_{c=0.8}$ μm.

Figure 34:
FIG. 34 illustrates the 3D geometry of a resonator-QWIP with square ring unit cells.

FIG. 34 shows another example of a resonator-QWIP design, which will be referred as the RS-QWIP. It has nine square ring units on a 23 μm×23 μm pixel area with inner square size of 2.4 μm×2.4 μm, and outer square size of 5.4 μm×5.4 μm. The center-to-center spacing of the units is 7.5 μm. Other parameters are: h=0.62 μm, $t_{a=1.0}$ μm and $t_{c=0.8}$ μm. With resonances provided by the six square protuberances, the detector shows a large QE of 57% centered at 8.8 μm with a 0.6 μm bandwidth in FIG. 35. These coupling characteristics are highly desirable for a long wavelength detector having a cutoff between 9-10 μm. Since these R-QWIPs only needs a 1.0 μm-thick active material, it will have the same large gain as the usual grating QWIPs, but now with 10 times higher QE since the commercial un-optimized grating cameras have demonstrated only 5% QE so far. Therefore, these innovative R-QWIPs will have 10 times high signal as the commercial grating coupled camera, and thus can operate a 10 times higher speed.

Figure 5A:
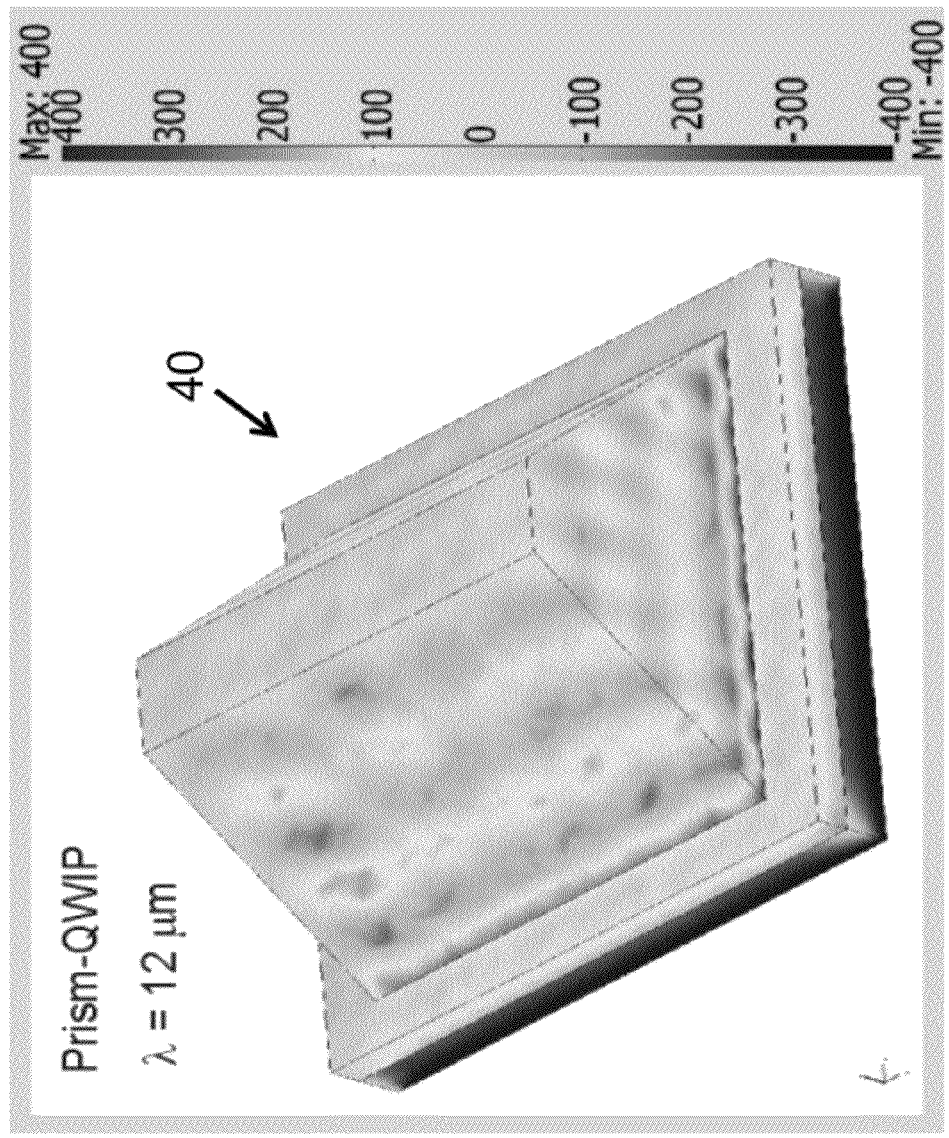
FIG. 5A schematically illustrates the prism-QWIP geometry or the PR-QWIP, used in the electromagnetic (EM) field simulation. The contour pattern shows the $E_z$ distribution of the optical field.
Figure 5B:
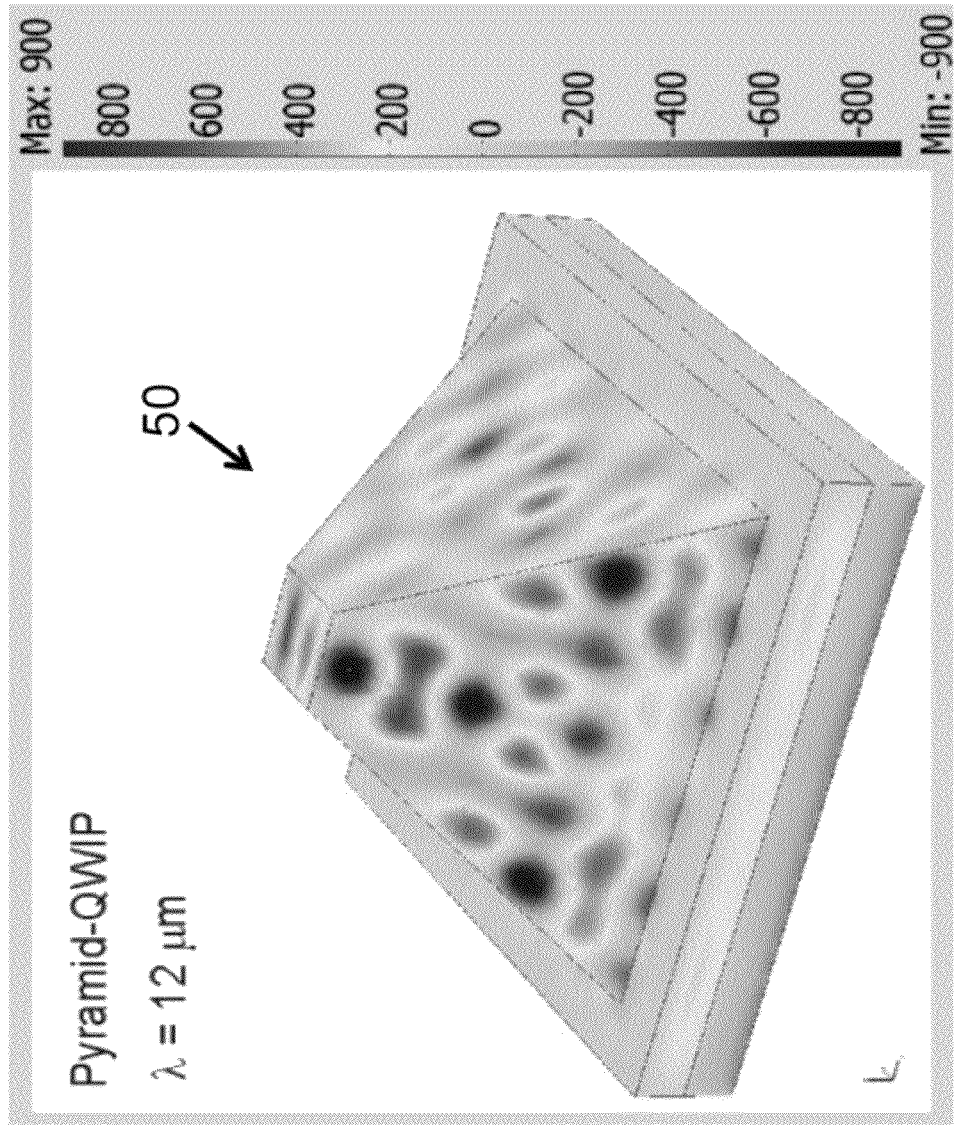
FIG. 5B schematically illustrates the pyramid-QWIP geometry or the PY-QWIP, used in the EM field simulation. The contour pattern shows the $E_z$ distribution of the optical field.

The resonator concept can be applied to the C-QWIP structures to further improve their QE. To turn the existing C-QWIPs into resonant cavities, the thick substrate that the detector is rested on will be completely removed, and an optional composite thin film will be deposited underneath the common contact layer. To illustrate the coherent optical effects, a 3-dimensional (3D) finite element electromagnetic (EM) simulation is carried out to calculate the quantum efficiency (QE) of PR- and PY-QWIPs without the optional composite reflectors or thin films. The detectors are assumed to be surrounded by air. FIGS. 5A and 5B illustrate the detector geometry used in the EM field simulation. FIG. 5A schematically illustrates the prism-QWIP geometry or the PR-QWIP, used in the electromagnetic (EM) field simulation. The contour pattern shows the $E_z$ distribution of the optical field. FIG. 5B schematically illustrates the pyramid-QWIP geometry or the PY-QWIP, used in the EM field simulation. The contour pattern shows the $E_z$ distribution of the optical field.

Figure 5C:
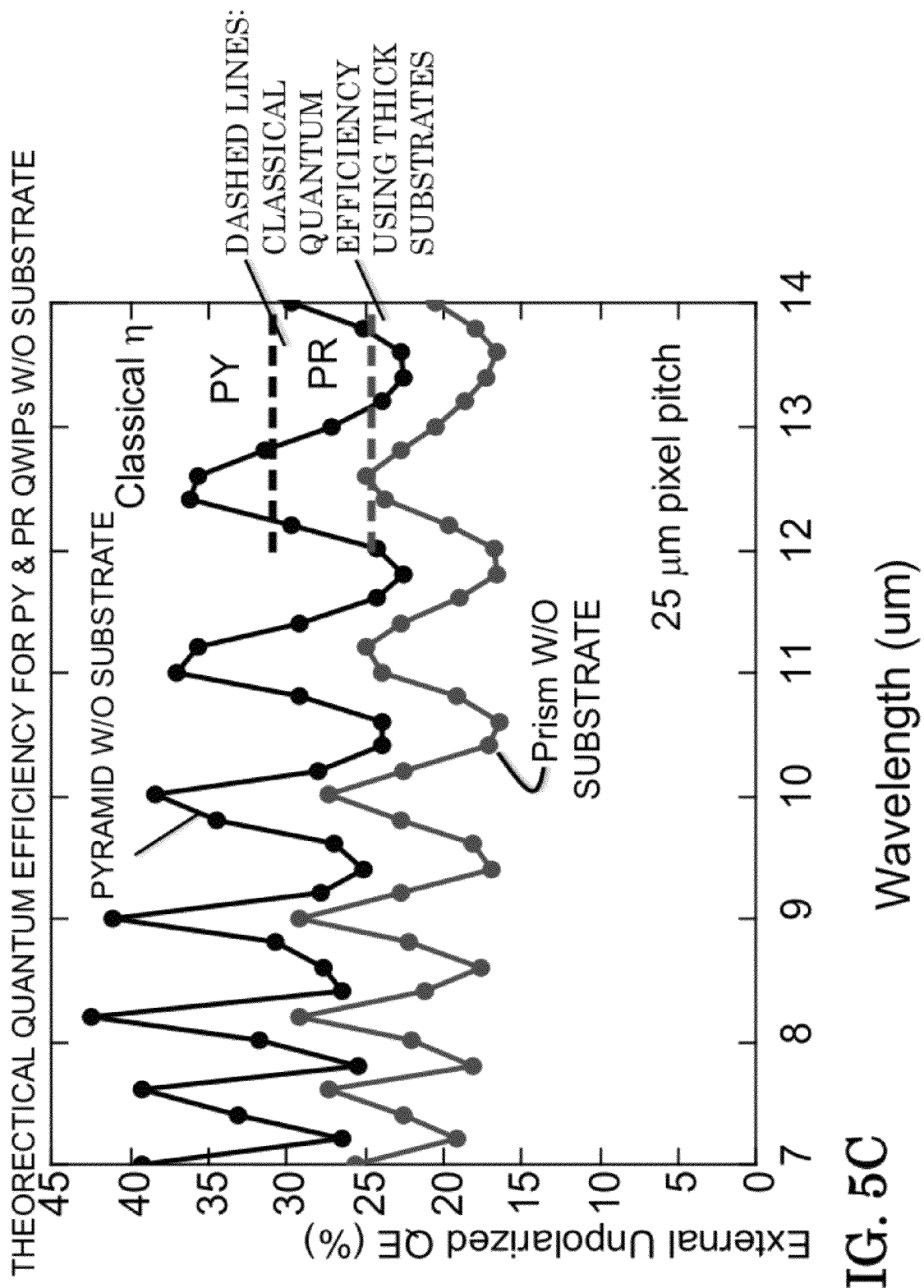
FIG. 5C graphically illustrates the theoretical quantum efficiency for QWIPs with different geometries when the substrate is removed or absent wherein, for comparison purposes, the dashed lines (- - - -) illustrate the "classical" quantum efficiency using thick substrates (the assumed pixel pitch is 25 μm).

FIG. 5C graphically illustrates the theoretical quantum efficiency for QWIPs with different geometries when the substrate is absent. The dashed lines illustrate the "classical" quantum efficiency using thick substrates. In FIG. 5C, the assumed pixel pitch is 25 μm. For a 25 μm pixel pitch FPAs, the following values are assumed: 25×25×11 μm$^{-3}$ PR-QWIP and 25×25×11 μm$^{-3}$ PY-QWIP. The common contact layer is 1.5 μm. The absorption coefficient α is assumed to be 0.15 μm$^{-1}$.

FIG. 5C shows that optical interference causes the quantum efficiency (QE) of a PR-QWIP to oscillate about its classical value of ~25% obtained from ray-tracing technique. At 8.4 μm, a narrowly peaked value can reach 30%. For PY-QWIPs, the QE oscillates above its classical value of 32% and can reach 43% at 8.4 μm.

Figure 5D:
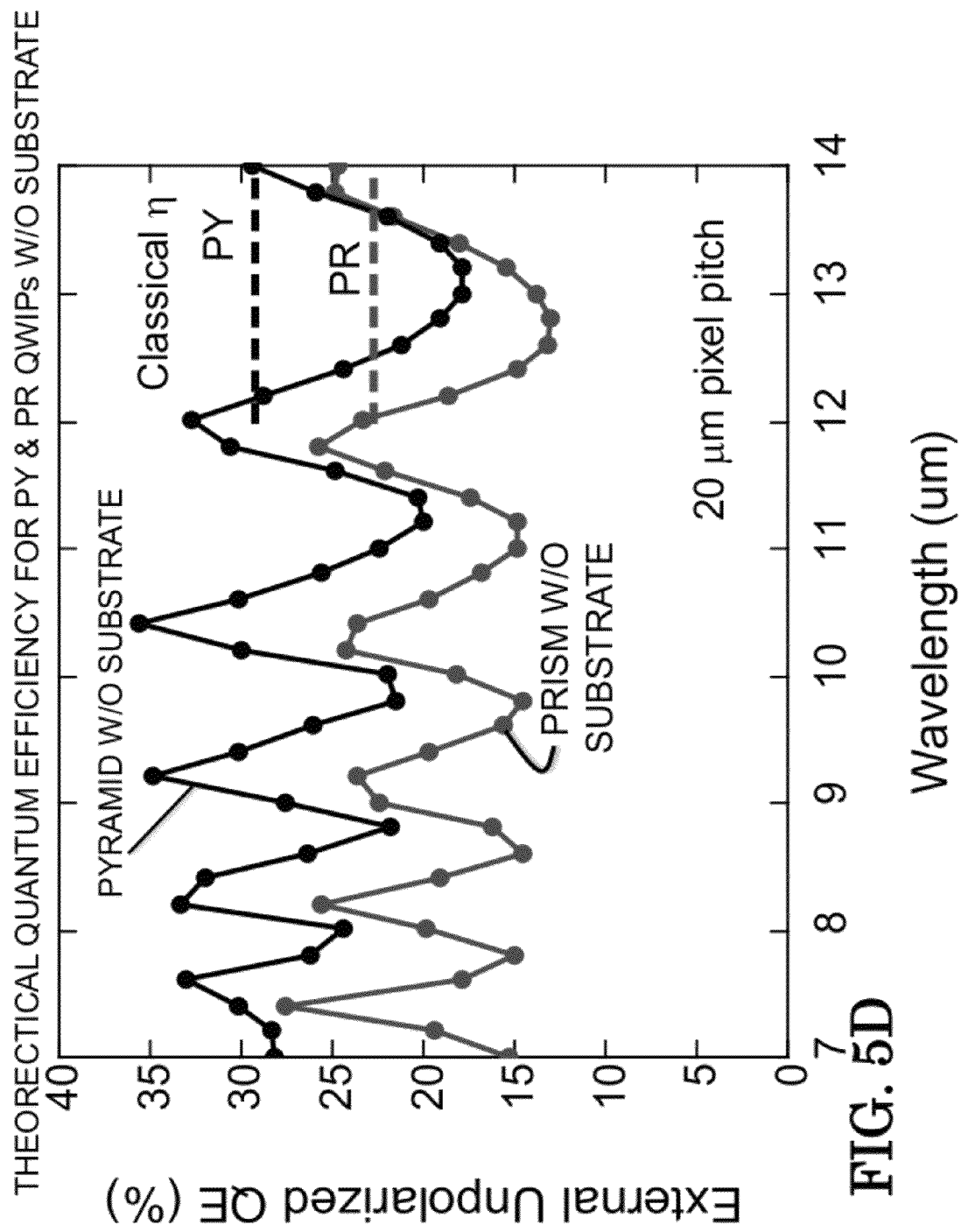
FIG. 5D illustrated graphically the theoretical QE for QWIPs with different detector geometry when the substrate is removed (or absent) (with an assumed pixel pitch of 20 μm).

FIG. 5D illustrated graphically the theoretical QE for QWIPs with different detector geometry when the substrate is removed (with an assumed pixel pitch of 20 μm). The straight lines are the classical QE obtained using thick substrates. In FIG. 5D the QE for a 20 μm pixel pitch FPA is examined, with which 20×20×8.8 μm$^{-3}$ PR-QWIP and 20×20×9.1 μm$^{-3}$ PY-QWIP The average QEs of the PR- and PY-QWIPs are about 20% and 30%, respectively, in this wavelength regime in the 20 μm pitch FPA. Therefore, the resonantly enhanced C-QWIP structures can greatly improve the QE of the existing grating-QWIP FPAs and also the unthinned C-QWIP FPAs.

FIGS. 5C and 5D show that with optical resonances, a large optical intensity enhancement can be obtained at certain wavelengths λ with which a large QE can be achieved. To obtain a more uniformly large QE, a composite thin film can be added to the common contact layer. An example for a single layer thin film (thickness=1.4 μm and n=1.8) is shown in FIG. 8. This layer introduces an extra material interface for light reflection and thus creates more resonances. Typical infrared materials with similar refractive indexes such as AgCl (n=1.98) and BaF$_2$ (n=1.51) etc. can be used albeit with different resonant wavelengths.

Figure 9A:
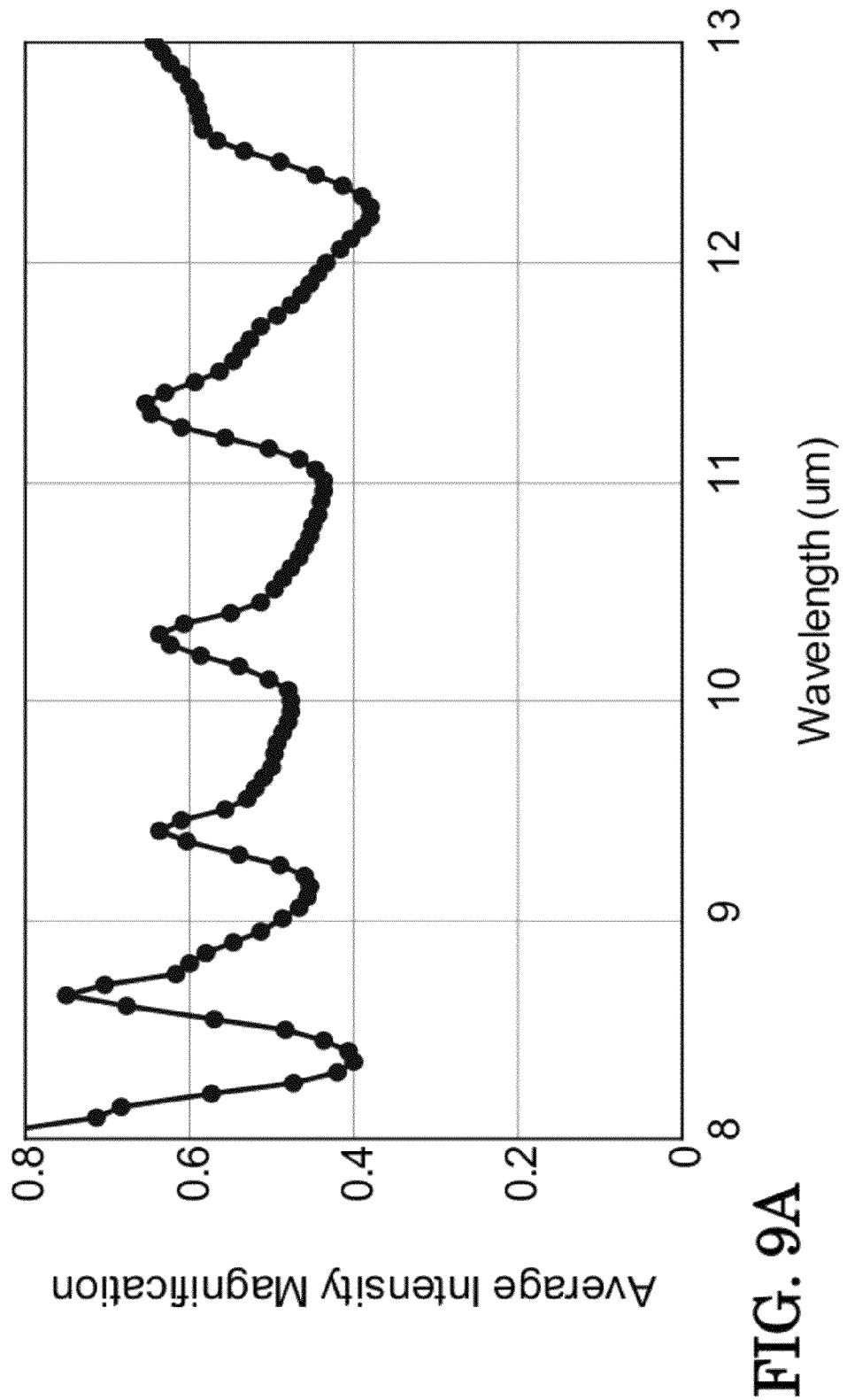
FIG. 9A graphically illustrates the average magnification factor $M \equiv I_z/I_{inc}$ inside the C-QWIP with a thin film coating as a function of λ.

FIG. 8 shows the $E_z$ distribution with this thin film coating (single layer thin film; thickness=1.4 μm and n=1.8) at λ=8.4 μm in PR-QWIPs with air cover. The pixel has an extra thin film coating beneath the common contact layer. To appreciate the optical effects of this coating, the detector material is assumed to have no absorption in FIG. 9. Since the detector QE is dependent on the average intensity in the detector volume, one can define the average intensity magnification factor M as average($I_z$)/$I_{inc}$=average ($|E_z|^2$)/$|E_{inc}|^2$, where $I_z$ is the optical intensity associated with the vertical $E_z$, and $I_{inc}$ is the incident intensity with $E_x$ polarized along the x-direction. As seen in FIG. 9A, large M values ~0.52 are now more uniformly distributed across the 8-13 μm range with an optical thin film in comparison with the large oscillation of M about an average value of 0.44 without the thin film in FIG. 9B. Uniform broadband detection is then possible. When comparing the number of resonances between FIGS. 9A and 9B, one should keep in mind that the number of resonances is dependent on the common contact layer thickness $t_g$. For the same $t_g$, the one with an additional optical thin film will have more resonances than the one without. Different resonant characteristics can be obtained with different composite thin film coatings.

FIG. 9A shows the magnification factor M≡$I_z$/$I_{inc}$ inside the C-QWIP with a thin film coating as a function of λ. For incoherent transmission, the transmitted intensity ratio $I_x$/$I_{inc}$ would have been equal to $T_r$=0.44.

Figure 11:
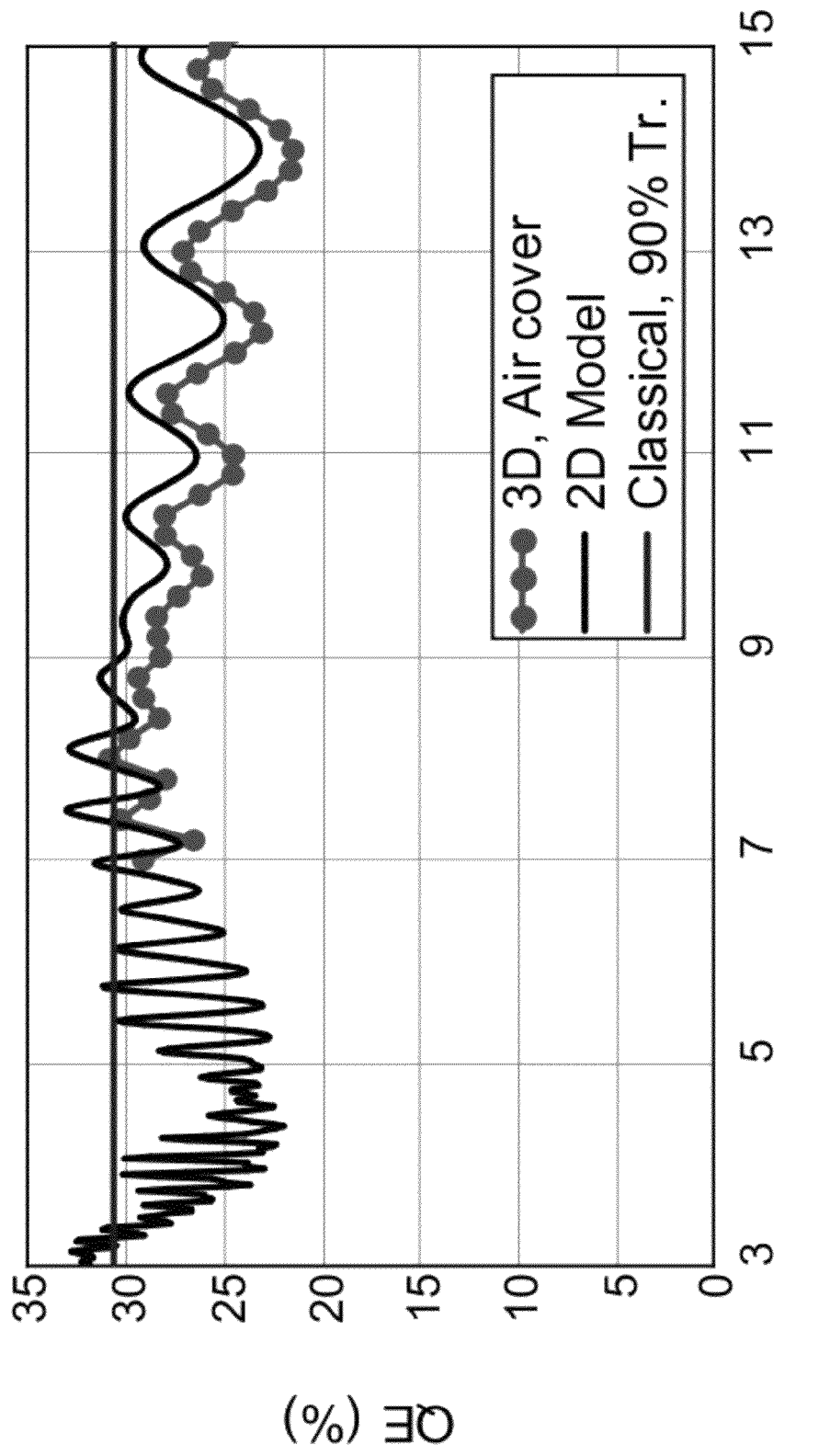
FIG. 11 illustrates the QE of a PR-QWIP with a 9 μm AR-coating.

As an explicit illustration of the advantages of a composite thin film, the QEs of the PR-QWIP, the PY-QWIP and also a conical QWIP with air cover having a single thin film coating are calculated based on Equation (2). This coating has a thickness of 1.25 μm and a refractive index of 1.8. FIGS. 11, 14B and 16 show the larger number of Fabry-Perot resonances around 9 μm generally increases the QE at this wavelength regime.

To gain a perspective on various light coupling schemes discussed in this patent, the QE of different detectors used for a 25-μm pixel pitch array are plotted in FIG. 35. The C-QWIPs (prisms and pyramids) are assumed to have an 11 μm thick active material with a peak a of 0.15 μm$^{-1}$ and have a thin film coating. The resonator-QWIPs (RG and RS) are assumed to have a 1.0 μm-thick active material with a peak a of 0.20 μm$^{-1}$ and no thin film coating. The C-QWIPs more rely on the use of a large active volume to achieve a high QE at all wavelengths, while the resonator-QWIPs make use of the intensified light under resonances to achieve the same at selected wavelengths. They have their own advantages. For example, the present R-QWIP uses a thinner material (and thus be cheaper) and has a larger gain and thus more tolerant to the readout noise, but its QE is only about 5.8% in the 3-5 μm band and therefore it is not suitable for two-color detection. The C-QWIPs, on the other hand, are suitable for all general applications but need a thicker (and thus more expansive) material, and a high voltage and low noise readout circuit to complement its smaller gain and thus lower noise characteristics.

The inclined sidewalls on the C-QWIP can be produced either by wet chemical etching (e.g. with 1H$_3$PO$_4$: 1H$_2$O$_2$: 3H$_2$O) or plasma etching (e.g. BCl$_3$/Ar). To completely remove the substrate, plasma etching can be used on a mechanically thinned substrate. It requires the insertion of an etch stop layer before growing the detector material on the GaAs substrate. An example of a C-QWIP material with an etch stop layer is shown in Box A. This example of C-QWIP material contains a 3.0 μm top contact layer made of GaAs, a 4.6 μm GaAs/Al$_{0.17}$Ga$_{0.83}$As active QWIP material, a 2.4 μm bottom GaAs contact layer, a 2.6 μm common contact layer, and a 0.1 μm Al$_{0.3}$Ga$_{0.7}$As layer, which are grown on top of a 650 μm GaAs wafer substrate. All three contact layers are doped with $N_D$=1×10$^{18}$ cm$^{-3}$ Si donors, and the GaAs layers in the active region is doped at 0.6×10$^{18}$ cm$^{-3}$. The active region contains 60 periods of QWs, each containing 6 nm GaAs and 70 nm AlGaAs.

BOX A—A typical C-QWIP material containing an etch stop layer on a GaAs substrate.

| Top contact layer, | 3.0 μm | GaAs |
| Active QWIP layer, | 4.6 μm | GaAs/Al$_{0.17}$Ga$_{0.83}$As |
| Bottom contact layer, | 2.4 μm | GaAs |
| Common contact layer, | 2.6 μm | GaAs |
| Etch stop layer, | 0.1 μm | Al$_{0.3}$Ga$_{0.7}$As |
| GaAs Substrate, | 650 μm | GaAs |

The plasma process was investigated and established by J. W. Lee, M. W. Devre, B. H. Reelfs, D. Johnson, J. N. Sasserath, F. Clayton, D. Hays, and S. J. Pearton, J. Vac. Sci. Technol. A 18(4), pp. 1220-1224 (2000), hereby incorporated by reference. After the substrate is mechanically thinned to 40 μm, it can be loaded into an inductively coupled plasma (ICP) etcher for selective etching. The gases flow into the etcher consists of 5 sccm (standard cubic centimeter per minute) BCl$_3$, 5 sccm SF$_6$, and 10 sccm helium. The ICP source power, which controls the plasma density, is set at 300 W and 2 MHz, and the rf chuck power, which controls the plasma collision energy and thus the etching rate, is set at 10 W and 13.56 MHz. The chamber pressure is set at 10 mTorr. Under such etching condition, the etching rate for GaAs is 0.37 μm/min and the etching rate for Al$_{0.2}$Ga$_{0.8}$As is 9.2×10$^{-4}$ μm/min. The selectivity is thus 400:1. This selectivity will also be further increased by increasing the Al content. In this process, BCl$_3$ serves as an etchant to GaAs, and once the AlGaAs stop etch layer is exposed, the reaction of aluminum with SF$_6$ forms the nonvolatile AlF$_3$ compounds and prevents further etching. The role of helium in the plasma is to assist the removal of chemical by-products on the material surface so that the GaAs etching rate is increased and the surface is smoother. As such, other inert gases can be used as a substitute for helium.

A PR-QWIP FPA based on the detector material in Box A has been characterized before and after the GaAs substrate was removed by the dry plasma etching process. No composite thin film was used. Preliminary data shows that the detector QE varies with wavelengths according to that shown in FIG. 5C after the substrate is removed. A preferred embodiment resonantly enhanced corrugated quantum well infrared photodetector (RE C-QWIP) has thus been shown to operate as the modeling predicted. A preferred embodiment RE C-QWIP provides a large QE for the FPA.

The preferred embodiment resonantly enhanced corrugated quantum well infrared photodetector (RE C-QWIP) will further increase the detector QE through coherent resonance effects. These can be achieved by removing the substrate and, subsequently, by adding an optional layer of composite thin film. The RE C-QWIP preserves the broadband advantages of a C-QWIP through multiple resonances, and yet intensified the light at those wavelengths. With the resulting higher QE, the target acquisition time will be shorter, which allows the cameras to track faster objects. With higher photocurrent, it allows the camera operating at higher temperatures with the same sensitivity. Higher temperature operation can reduce the readiness time and the cooling power consumption.

Grating coupled QWIP FPAs are expensive due to the low yield in grating fabrication, less sensitive due to inefficient, narrow band light coupling, lower in definition due to the larger pixel size. In contrast, C-QWIP FPAs are inexpensive due to the standard batch processing, higher in sensitive due to efficient broadband light coupling, and higher in definition due to the smaller pixel size in the one corrugation per pixel geometry. C-QWIP coupling is also suitable for multi-color detection due to its wavelength-independent light coupling mechanism.

RE C-QWIP FPAs further increases the C-QWIP quantum efficiency by several times and thus make the camera more sensitive.

A RE C-QWIP FPA camera can be used as an upgrade replacement for all grating coupled or C-QWIP cameras. In the past, a C-QWIP FPA was found to have the best performance in detecting unmanned aerial vehicles in a detection contest, which consisted of 12 sensing teams using different technologies. The cameras are also used in ballistic missile intercept observations, ground based mid-course defense and terminal high altitude air defense. C-QWIP cameras obtained the best and most detailed video missile intercept footages to date. In view of the broadband characteristics of C-QWIPs, NASA has revised the technology roadmap for its Landsat program. On board of the upcoming earth observing satellite, there will be a Thermal Imaging Infrared Sensor that requires broadband infrared detectors. NASA has designated C-QWIP FPAs to be the technology for this mission and proposed the structure for other planetary missions such as the Jupiter-Europa mission. The RE C-QWIPs will further improve this technology. Because of its ability in generating even larger photocurrent needed for high speed imaging, Army Night Vision Lab and L3, Inc. will be interested in developing RE C-QWIPs for the Objective Pilotage for Utility and Lift program.

RE C-QWIP FPAs can also be made in high resolutions such as 4 megapixels or 16 megapixels and into two- or multi-color FPAs. They will be the unique choice for many long wavelength applications in terms of availability, sensitivity, stability, reliability, resolution and cost. The applications include night vision, all weather navigation, infrared astronomy, space exploration, earth resources exploration, environmental protection, geological survey, homeland security, industrial quality control, maintenance and diagnostics, and medical imaging etc.

The invention utilizes the insight into the resonant mechanism, the Fabry-Perot oscillations, in conjunction with the inclined detector sidewalls, in producing intense optical fields polarized in the vertical direction. This insight devises a simple and cost effective solution in achieving high quantum efficiency and broadband infrared detection in QWIP materials. It is the first time for one to show that Fabry-Perot resonances exist in trapezoidal resonators, which include prisms, pyramids, and cones, in addition to the usual parallel plate etalon, and to utilize these resonances to produce large infrared absorption across a wide spectrum.

EM Modeling Solutions

With an exemplified $\alpha$ of 0.22 $\mu m^{-1}$, FIGS. 7A and 7B show the QE of prism-shaped C-QWIPs (FIG. 5A)(labeled as PR-QWIPs) and pyramid-shaped C-QWIP (FIG. 5B)(labeled as PY-QWIPs) for different 2t/p ratios. For a typical p=25 $\mu m$ and t=11 $\mu m$, the classical theoretical QE is 25% for PR-QWIPs and 31% for PY-QWIPs.

Referring now to FIG. 6, assuming a constant $\alpha$=0.15 $\mu m^{-1}$ (independent of wavelengths), where typically a is the typical peak value for a QWIP material with $1 \times 10^{18}$ $cm^{-3}$ doping and 1.5 $\mu m$ absorption bandwidth. In the following, four different pixel geometries are examined: prism-shaped C-QWIPs (PR-QWIPs), pyramidal C-QWIPs (PY-QWIPs), conical C-QWIPs (CC-QWIPs), and cross-grating QWIPs (GR-QWIPs). The physical dimensions (L, W, H) in microns are (25, 25, 11) for the PR- and PY-QWIPs and (20, 20, 1.5) for GR-QWIPs, and 25 $\mu m$ in diameter and 11 $\mu m$ in height for CC-QWIPs. All C-QWIP sidewall angles are 48°, and all detectors have the same common contact layer thickness of 1.5 $\mu m$. Also modeled are the effects of an AR-coating deposited underneath the common contact layer. For 9 $\mu m$ detection, the coating is made of a 1.25 $\mu m$-thick, n=1.8 optical material. The entire pixel volume is assumed to be filled with active materials.

Figure 6A:
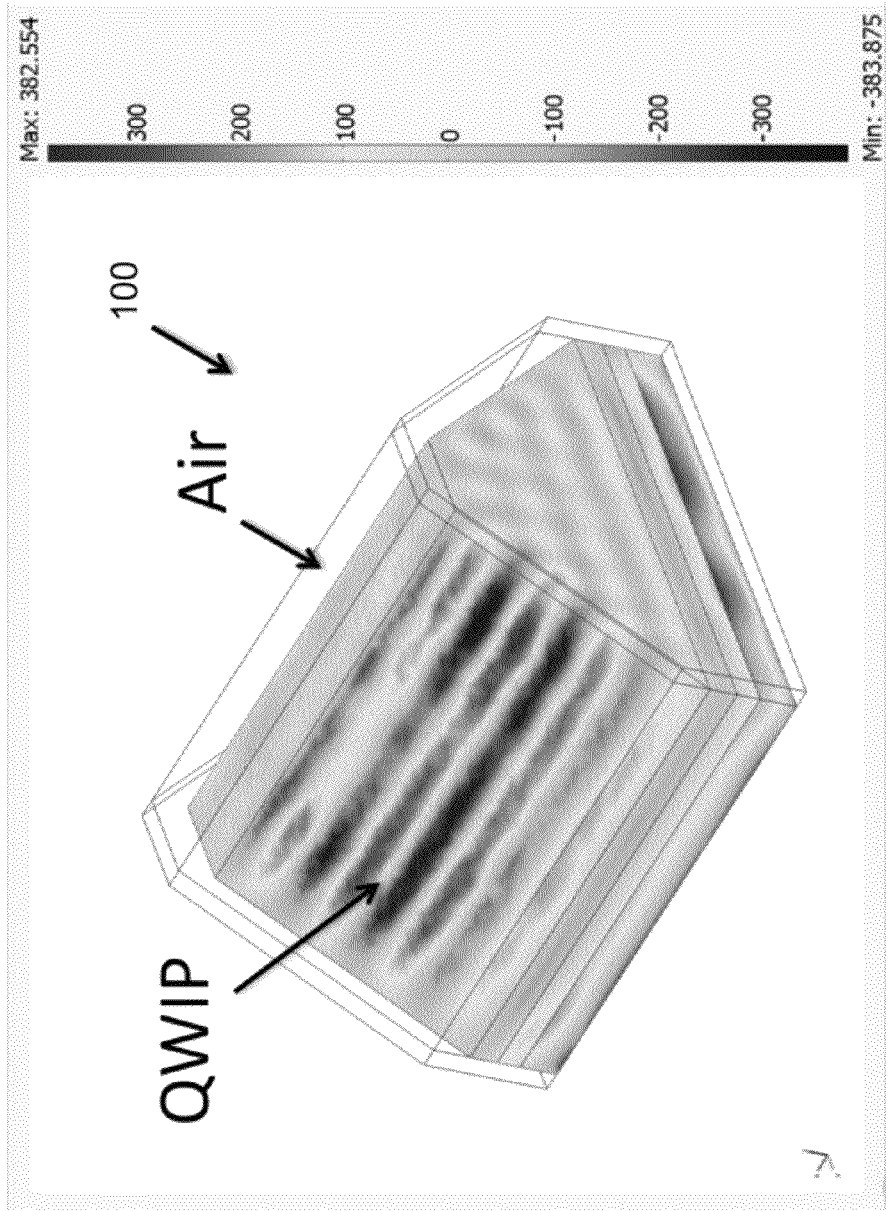
FIG. 6A schematically illustrates the geometry of a PR-QWIP with an air cover and AR substrate coating. The $E_z$ distribution is shown at λ=9.0

FIGS. 6A and 6B show the 3-dimensional geometry of a PR-QWIP surrounded by air, as well as the $E_z$ distribution on the surfaces and in the cross-section, respectively.

Figure 10:
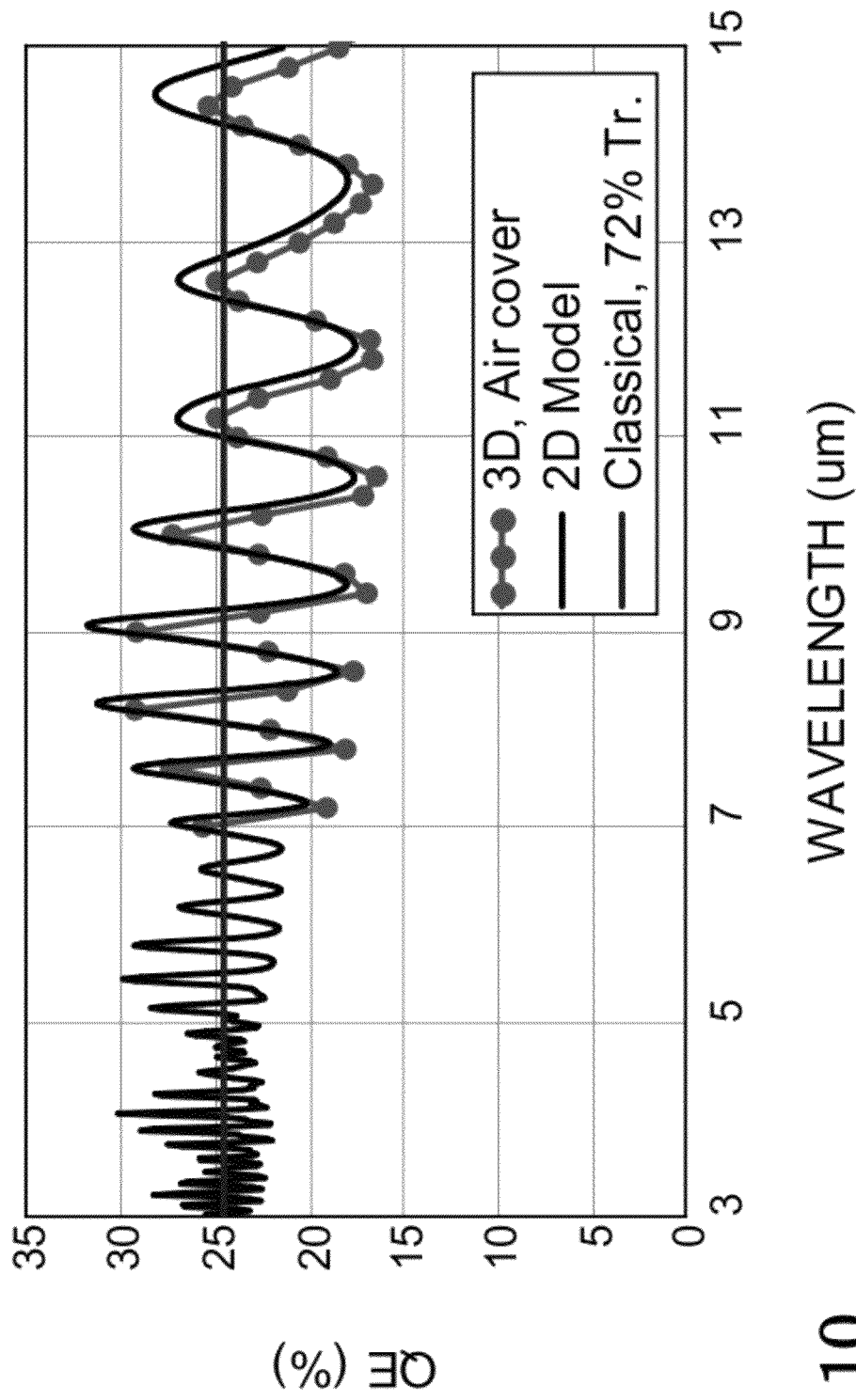
FIG. 10 illustrates the QE of a PR-QWIP without a 9 μm AR-coating.

FIG. 10 shows the QE without an AR-coating. For this detector geometry, one can use either a 2D EM model or a 3D EM model. Both models show the same oscillatory behavior due to optical interference and they agree with each other. The similar results between these two models show that there are compensating effects at the ends of the prism. The weaker sidewall reflections towards the ends as seen in FIG. 6A are compensated by the diffraction effects of the two vertical sidewalls. Towards the shorter $\lambda$, the EM QE is centered about the classical value of 24.6% calculated from Equation (3) using $t_{s=0.72}$ for n=3.239. The agreement between EM and classical models lends credibility to the present EM modeling. The present result shows that the PR-QWIP provides relatively constant coupling efficiency in the calculated $\lambda$ range from 3 to 15 $\mu m$. With a 9 $\mu m$ AR-coating, the QE rises up to ~30.6% in a broad $\lambda$ range as FIG. 11 shows, and it corresponds to a $t_s$ of 90% in the classical model. This situation is the same when the coating is designed for MWIR detection.

Figure 12:
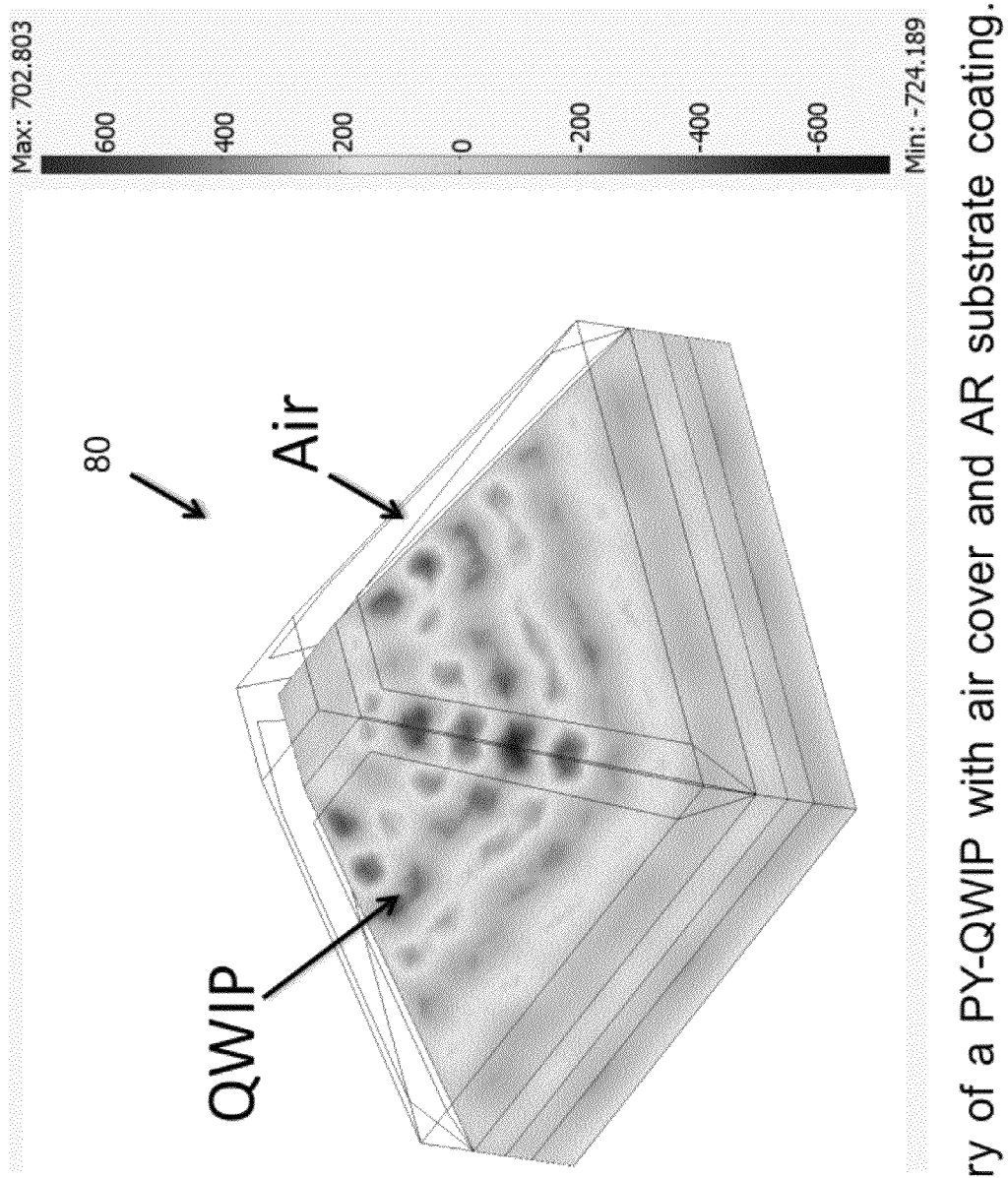
FIG. 12 illustrates the geometry of a PY-QWIP with air cover and AR substrate coating. The $E_z$ distribution is shown at λ=9.0 μm.

FIGS. 12 and 13 show the geometry for the PY-QWIP and FIG. 14 shows the 3D modeling result. There is no 2D analog for this detector geometry. The non-anti-reflective (AR) coated and AR coated classical QE are 30.9% and 38.6%, respectively. The EM solutions are shown to oscillate about these classical values and are higher than that of a PR-QWIP. FIG. 14A graphically illustrates the QE of a PY-QWIP without an AR-coating, and FIG. 14B graphically shows the QE with a 9 μm AR-coating.

Figure 15A:
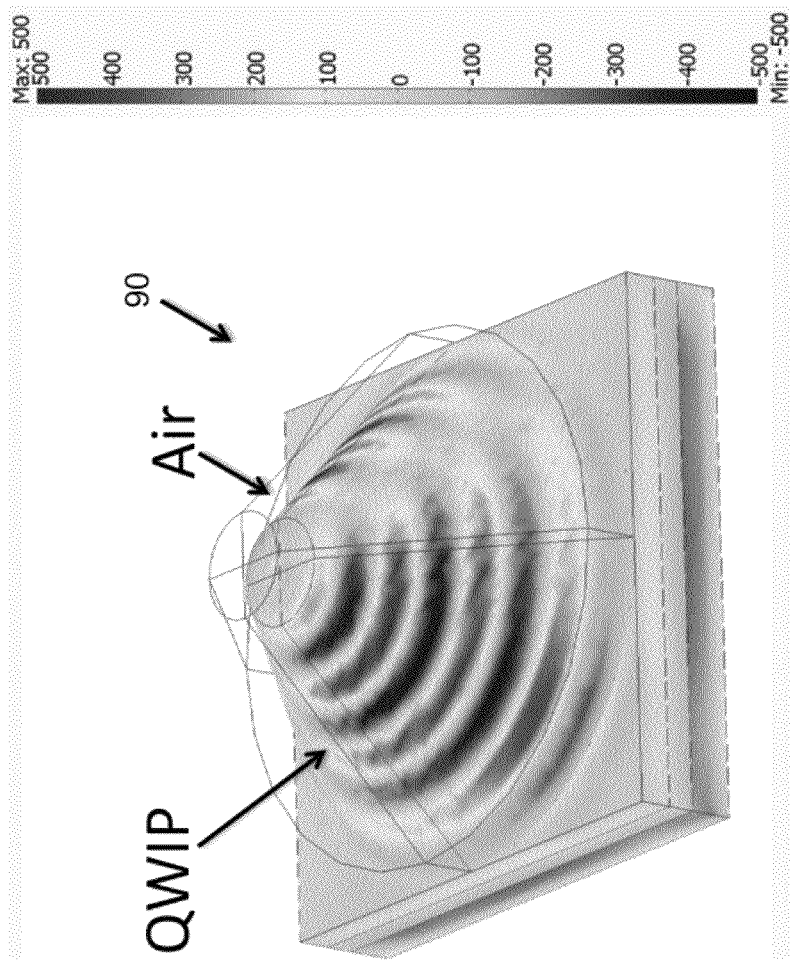
FIG. 15A illustrates the 3-D geometry of a CC-QWIP with air cover and AR substrate coating. The $E_z$ distribution is shown at λ=9.0 μm.
Figure 15B:
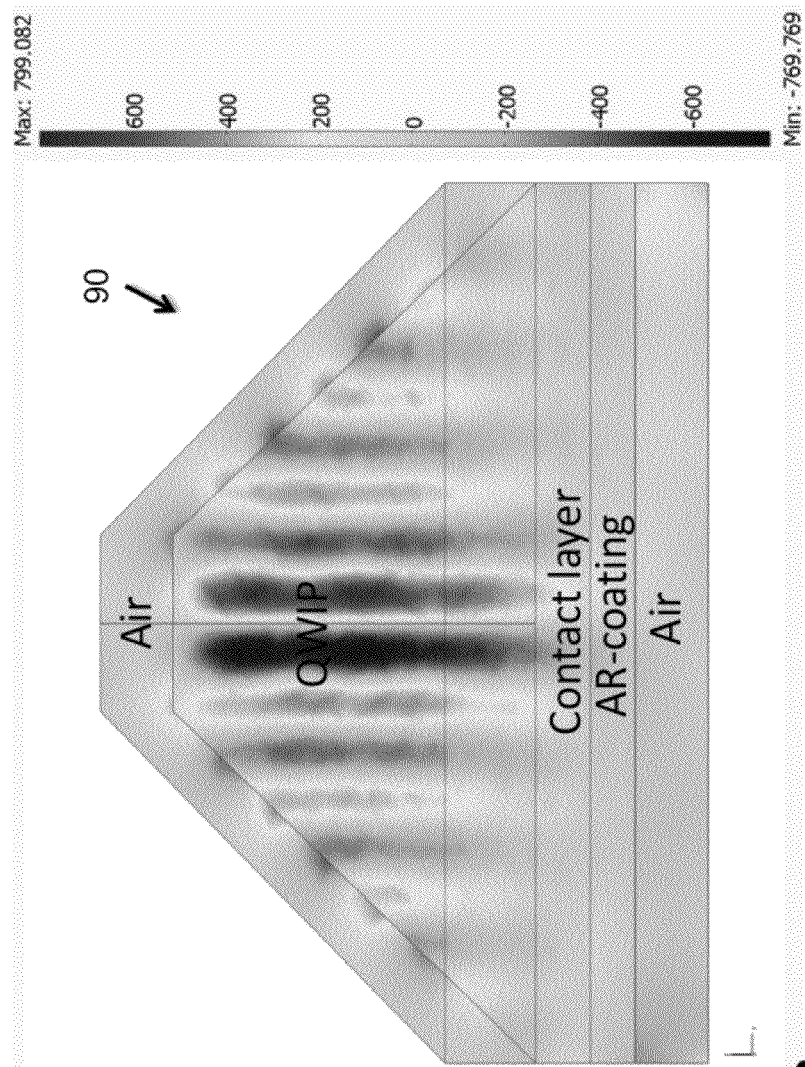
FIG. 15B illustrates in cross section of FIG. 15A illustrating the $E_z$ distribution at λ=9.0 μm.

FIG. 15A schematically illustrates the 3-D geometry of a conical CC-QWIP with air cover and AR substrate coating. The EL distribution is shown at λ=9.0 μm. FIG. 15B schematically illustrates the cross-section of the $E_z$ distribution at λ=9.0 μm. FIG. 16 shows the 3D modeling result. As seen in FIGS. 11, 14B and 16, when an AR-coating is applied, the QE generally rises to the peak values of the oscillations and the broadband nature prescribed by the classical model is restored. This effect can be understood by the fact that the oscillations in the C-QWIPs are due to Fabry-Perot modulation of the substrate transmission. The AR-coating increases the substrate transmission in general and hence suppresses the oscillation amplitudes.

With the AR-coating, the QEs of the PR-QWIP, PY-QWIP and CC-QWIP are about 31%, 39% and 34%, respectively. Therefore, the PY-QWIP has the highest QE. On the other hand, the detector dark current is directly proportional to the detector volume for the same detector height, and hence their dark currents are in the ratio of 1:0.67:0.53. The $I_p/I_d$ ratio is therefore 1:1.88:2.07. The cone-shaped C-QWIP will thus provide the lowest noise equivalent temperature difference.

FIG. 16 graphically illustrates the QE of a CC-QWIP with and without a 9 μm AR-coating.

FIG. 17A schematically depicts the 3D geometry of a GR-QWIP 60 with a specially configured cover having polygonal protrusions 61 (or nodules). The $E_z$ distribution is shown at λ=9.7 μm, where the first order diffraction occur at θ=90°. FIG. 17B illustrates the cross-section of the $E_z$ distribution at the same λ in the center plane of the active layer. FIG. 18 graphically illustrates the increase or decrease of the 9.7 μm peak with a small change of pixel size p from 23 μm to 24 μm or a small change of common contact thickness $t_c$ from 1.0 μm to 1.5 μm. Evidently, the QE of 24% at p=23 μm and $t_{c=1.0}$ μm will drastically reduce to 8% at p=24 μm and $t_{c=1.5}$ μm for the same active layer thickness and grating structure. Therefore, this example shows that one cannot put a grating and a detector material together without proper EM optimization.

When each pixel is treated as a resonator, by changing the resonator's size and shape a different set of cavity eigen modes are created. The excitation of these eigen modes (and their superpositions if they are degenerate) by the incident light will determine the detector QE spectrum.

Experimental Comparison

The EM model may be compared with experimental results. By applying the EM model to actual detectors, there are several additional factors. Firstly, the α will not be a constant but varies according to $$\alpha(\lambda) = \sum_n \frac{N_D W}{L} \frac{\pi e^2 \hbar}{2\sqrt{\varepsilon_h}\, \varepsilon_0 m * c} f_n \rho_n(\lambda),$$

Figure 19:
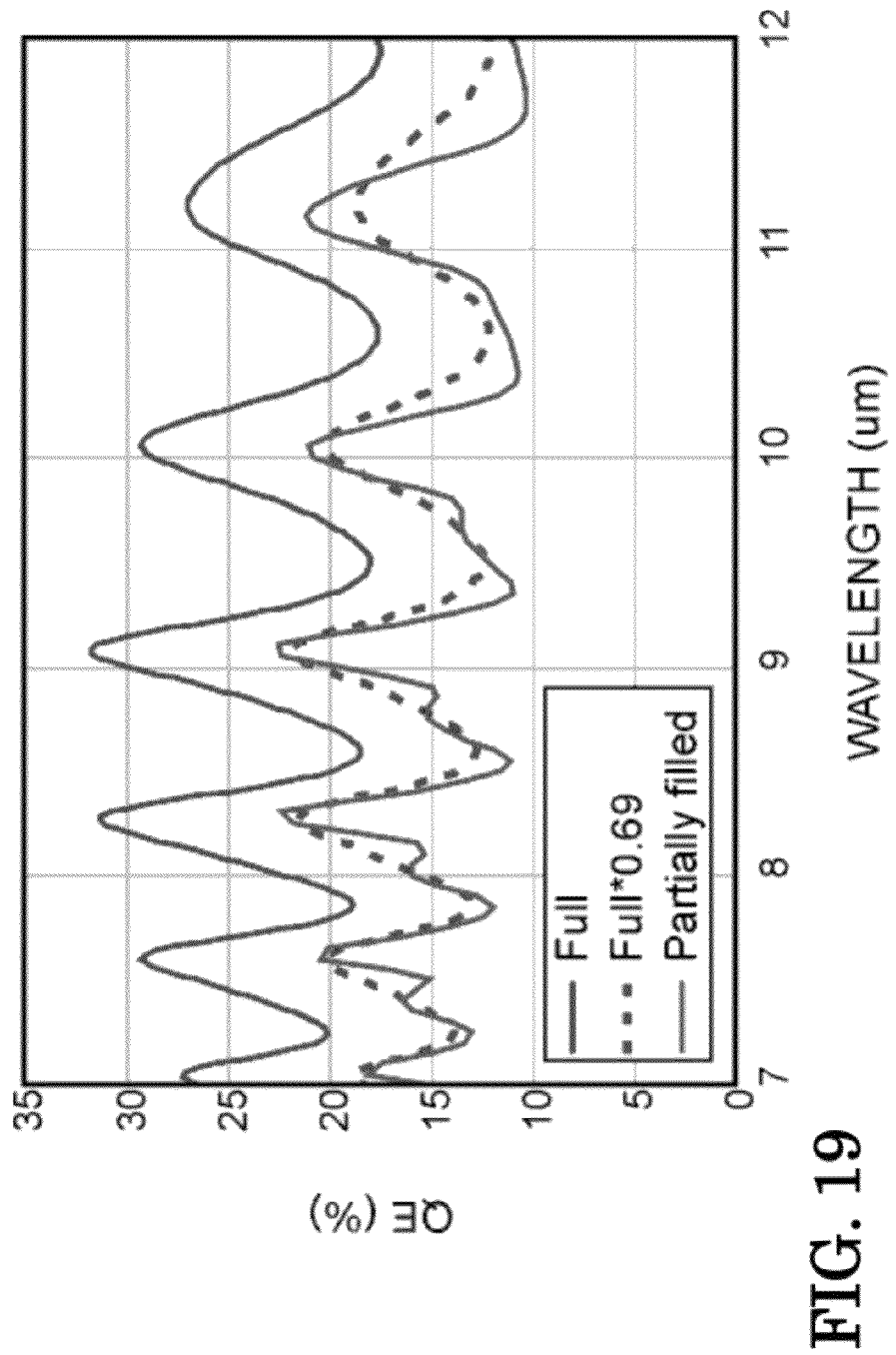
FIG. 19 graphically illustrates difference between a fully occupied C-QWIP and a partially filled 60 QW C-QWIP.

Secondly, the actual detector area is necessarily smaller than the pixel pitch area, characterized by the pixel fill factor $f_p$. The value of $f_p$ is taken to be 0.8 for C-QWIPs and 0.64 for gratings based on the grating geometry in FIG. 31B. Thirdly, the C-QWIP may cover with materials other than air. For PR-QWIPs, a layer of 2000 Å $MgF_2$/700 Å Au is usually applied on the sidewalls for epoxy isolation. It was found that the EM result with $MgF_2$/epoxy (without the Au) is almost the same as that with air. The solution with $MgF_2$/Au/epoxy still has the same QE magnitude but oscillates at a different phase. In practice, the oscillation phase matches better with that without Au. One can hypothesize that the 700 Å Au deposited on the inclined sidewalls has lower electrical conductivity than the solid gold, and thus it cannot enforce the perfect electric conductor boundary condition adopted in the EM model. Therefore, the air cover solution will be used for experimental comparison. Finally, the experimental C-QWIPs are usually only partially occupied with active material due to the bias limitations of the available readout circuits. There will be a corrugation fill factor κ, which accounts for the thinner active material. For example, FIG. 19 shows the EM results of a fully occupied PR-QWIP and a partially occupied PR-QWIP, which contains a 60 QW structure used in this experiment. This example shows that one can use κ=0.69 if the full structure solution is adopted. In summary, the external QE of a C-QWIP for experimental comparison is given by $$\eta_{ext} = f_p \kappa \eta_{full}, \tag{8}$$

where $f_p$=0.8, κ=0.69, and $\eta_{full}$ is the QE for a fully occupied C-QWIP calculated from the following equations (repeat of Equation 1):

$$\eta = \frac{1}{P_0} \int_V dI(\vec{r}), \tag{1}$$
$$= \frac{1}{P_0} \int_V \alpha I(\vec{r}) d^3 r,$$
$$= \frac{\alpha}{A_2^{c\varepsilon_0} E_0^2} \int_V \frac{nc\varepsilon_0}{2} |E_z(\vec{r})|^2 d^3 r,$$
$$= \frac{n\alpha}{A E_0^2} \int_V |E_z(\vec{r})|^2 d^3 r,$$

$$\alpha(\lambda) \sum_n \frac{N_D W}{L} \frac{\pi e^2 \hbar}{2\sqrt{\varepsilon_h}\, \varepsilon_0 m * c} f_n \rho_n(\lambda),$$

The same κ is used for the classical model. For PR-QWIPs where 2D model is applicable, it is used for comparison since it is more efficient and more accurate because of the use of finer meshes in the computation.

PR-QWIP FPA#1

Figure 20:
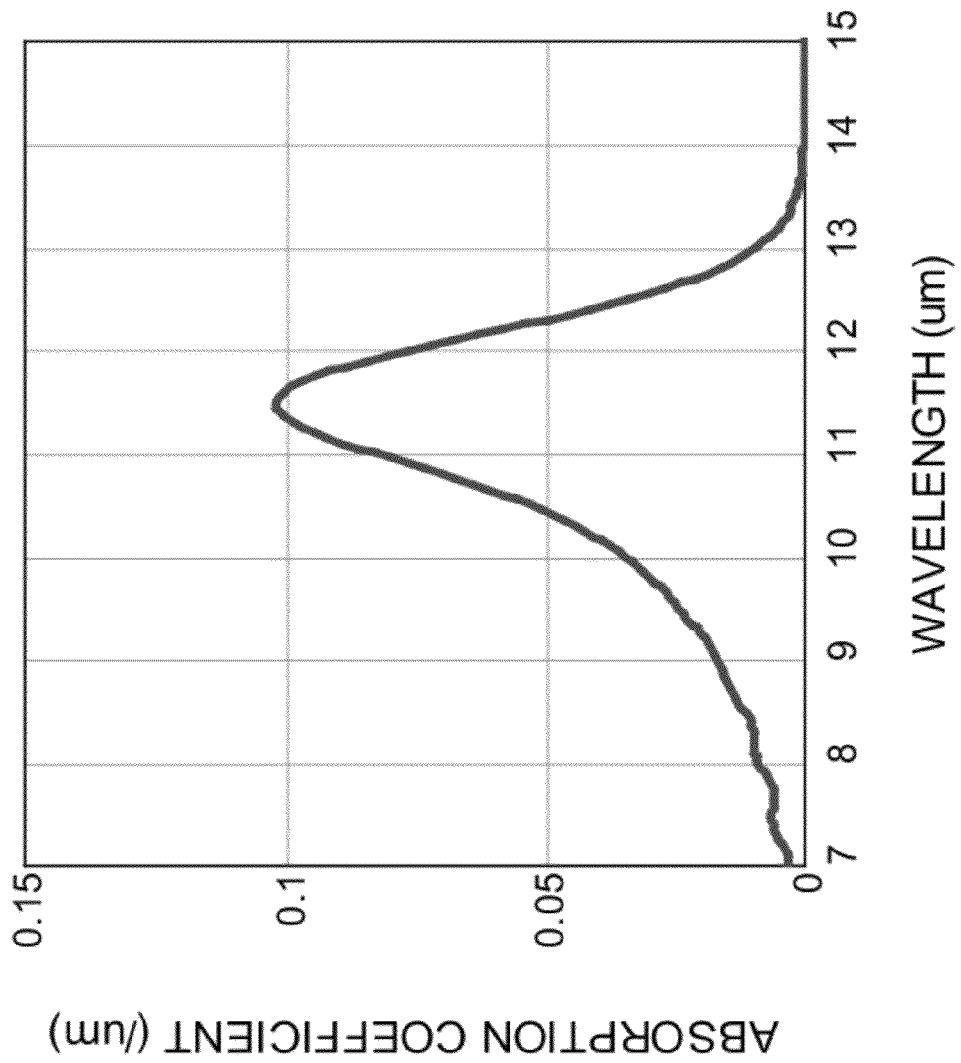
FIG. 20 graphically illustrates the calculated α of focal plane array (FPA) #1.
Figure 21:
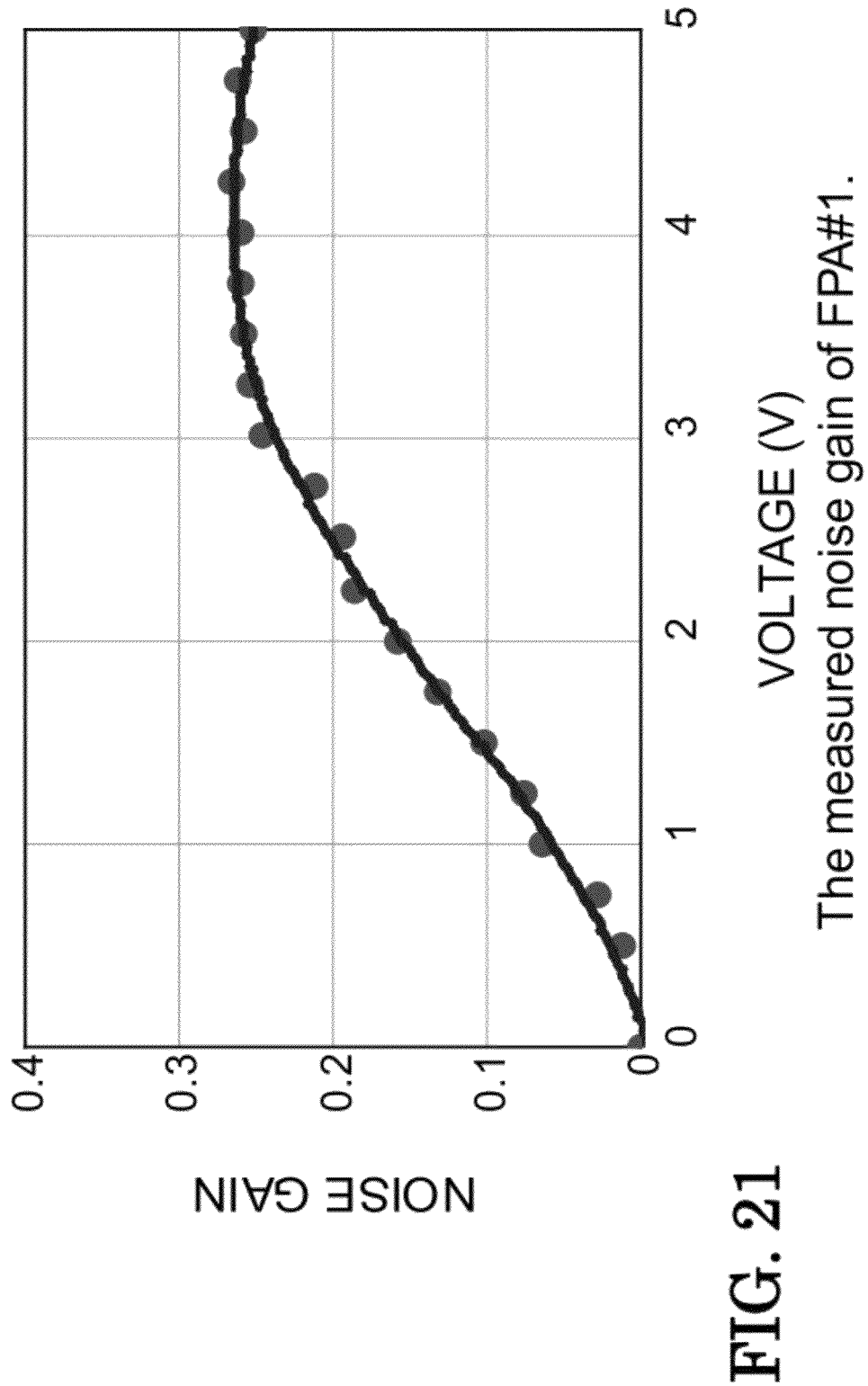
FIG. 21 graphically illustrates the measured noise gain of FPA#1.

The QWIP material is made of 60 periods of 700 Å $Al_{0.166}Ga_{0.834}As$ and 60 Å GaAs. To avoid dopant migration during the material growth, only the center part of the well is doped such that the equivalent $N_D$ is $0.62\times10^{18}$ cm$^{-3}$ in the well. The active QW material is sandwiched between two GaAs contact layers. The top layer is 3 μm thick and the bottom layer is 3.4 μm thick. Applying $$\alpha(\lambda) = \sum_n \frac{N_D W}{L} \frac{\pi e^2 \hbar}{2\sqrt{\varepsilon_h}\, \varepsilon_0 m * c} f_n \rho_n(\lambda),$$

to this material, the α spectrum is shown in FIG. 20 (which illustrates the calculated α of FPA#1) with a peak value of 0.1 μm$^{-1}$. Meanwhile, the noise gain g is measured from a test detector fabricated on the same wafer and is shown in FIG. 21, which illustrates the measured noise gain of FPA#1. The material is fabricated into 640×512 FPAs with Indigo 9803 readout circuit. The detector substrate is completely removed and there is no AR-coating.

Figure 22B:
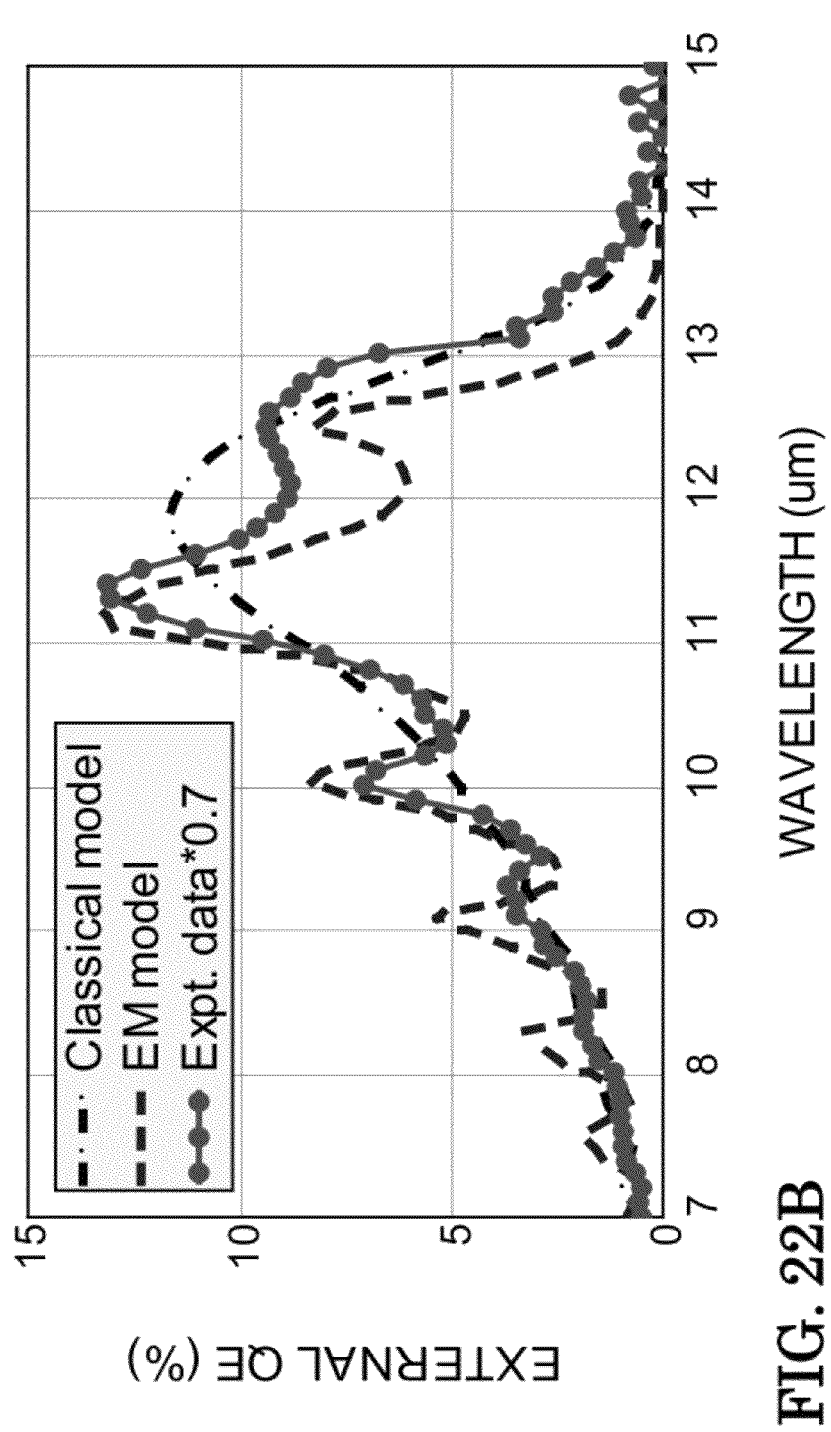
FIG. 22B graphically illustrates the calculated and measured external QE of PR-QWIP FPA#1 multiplied by 0.7 to fit the predicted QE.

The conversion efficiency CE spectrum ($=\eta g$) was measured at a bias of 2.1 V. From FIG. 21, g will then be 0.165. The FPA QE spectrum can thus be converted from the CE spectrum and is displayed in FIG. 22A. The QE spectrum is oscillatory as expected, in contrast to the smooth spectrum shown by the test detector under 45° edge coupling. The experimental peak values for external CE and QE are 3.1% and 18.8%, respectively. The internal QE accounting for both pixel fill factor $f_p$ and substrate transmission $t_s$ will then be 32.6%. FIG. 22A illustrates the calculated and measured external QE of PR-QWIP FPA#1. In FIG. 22A, the predicted QE for both the classical and EM models are shown without adjusting any parameters. The EM model correctly accounts for the positions of the experimental peaks but underestimated the QE magnitude. If the experimental data is multiplied by a factor of 0.7 as shown in FIG. 22B, satisfactory agreement between their lineshapes can be obtained. The weaker peaks from the data can be due to pixel nonuniformity, which tends to average out the peaks and makes the spectrum resemble the classical lineshape.

PR-QWIP FPA#2

Figure 23:
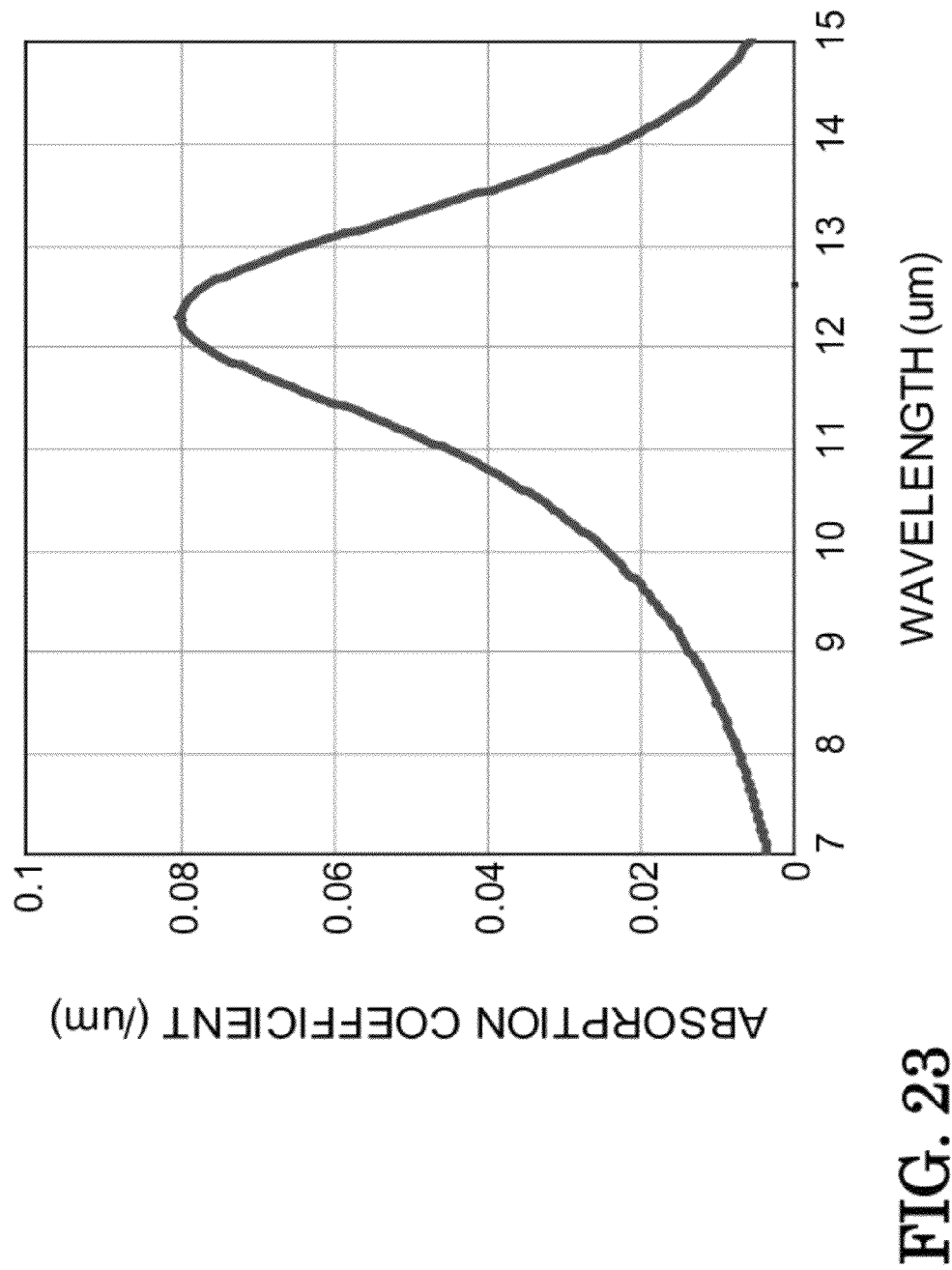
FIG. 23 graphically illustrates the calculated α of focal plane array (FPA) #2.
Figure 25B:
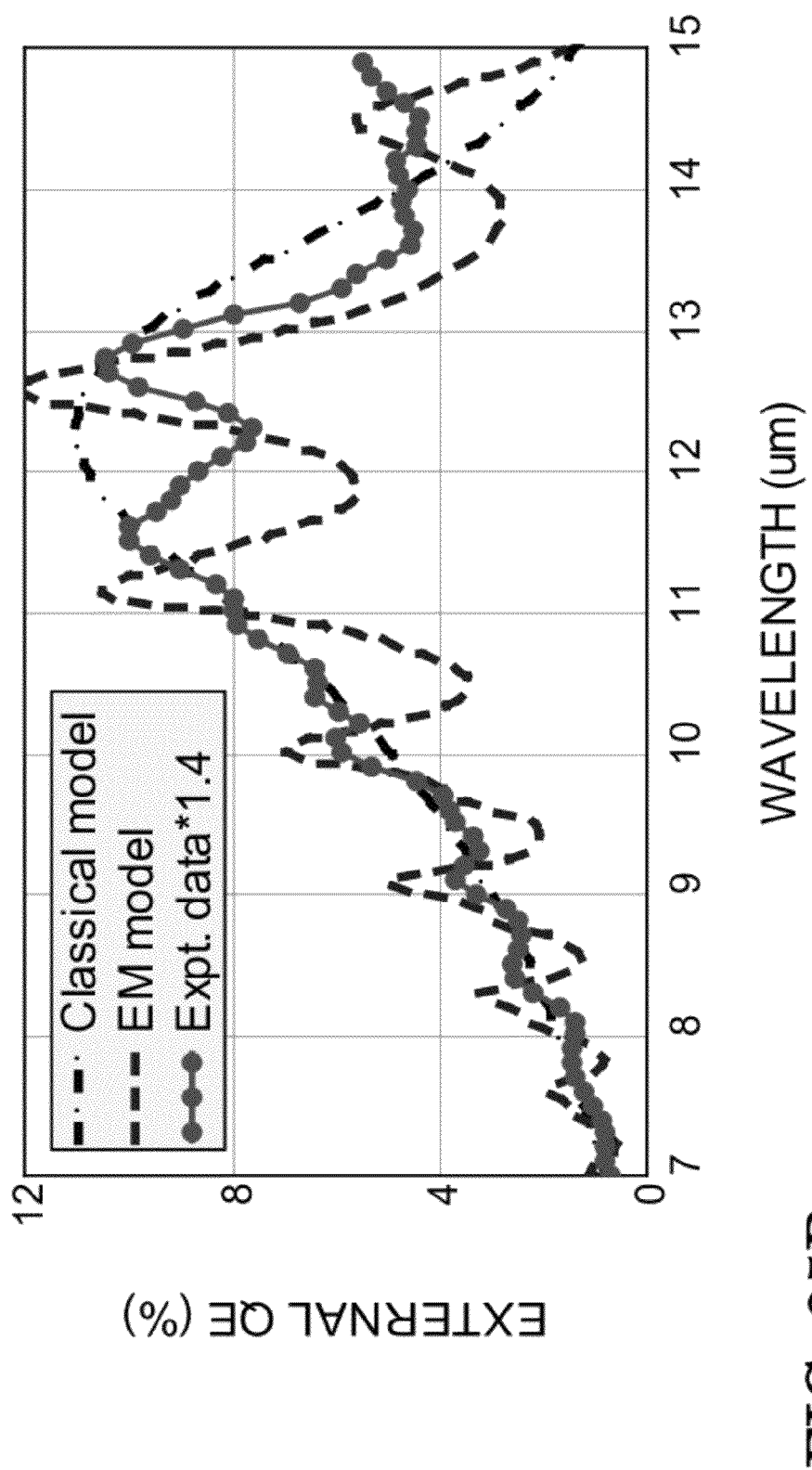
FIG. 25B graphically illustrates the calculated and measured external QE of PR-QWIP FPA#2 multiplied by 1.4 to fit the predicted QE.

FPA#2 has the same material structure as that of FPA#1 but the wafer was grown at a different time. The observed material wavelength was shifted to a longer wavelength, with which a different barrier composition was assumed. The calculated $\alpha$ is shown in FIG. 23 and the measured gain is shown in FIG. 24. Measured at 2.75 V, the peak CE is 2.2%. Together with g=0.29, the deduced external QE is 7.6%, and thus the internal QE is 13.2%. FIG. 25(A) shows the theory and experiment; i.e., the calculated and measured external QE of PR-QWIP FPA#2. In this case, the theory overestimated the measured QE by a factor of 1.4 as indicated in FIG. 25(B); wherein the measured QE is multiplied by 1.4 to fit the predicted QE. The experimental spectrum also shows less pronounced peaks, which may indicate a less uniform array.

PR-QWIP FPA#3

Figure 26:
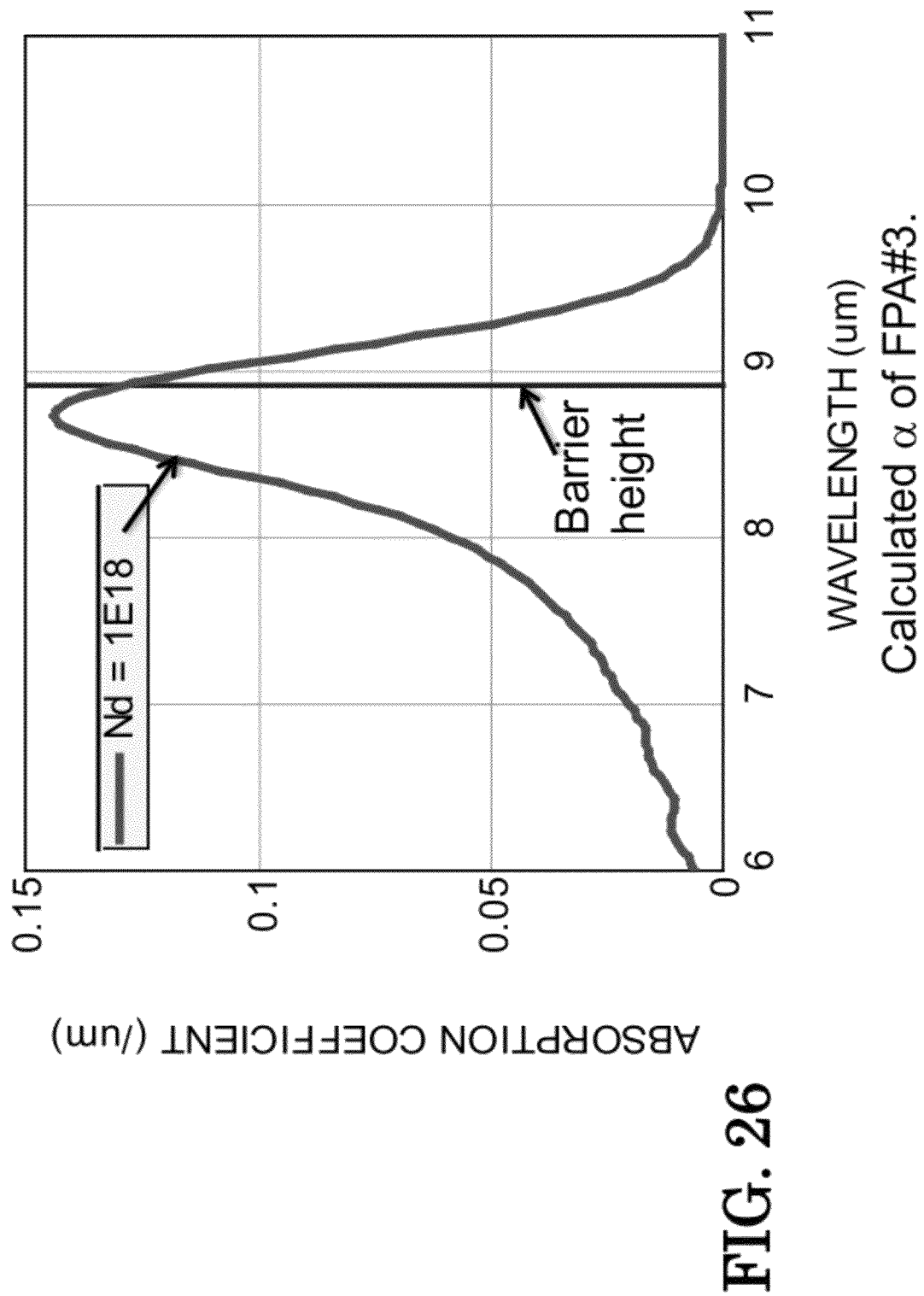
FIG. 26 graphically illustrates the calculated α of FPA#3.
Figure 28B:
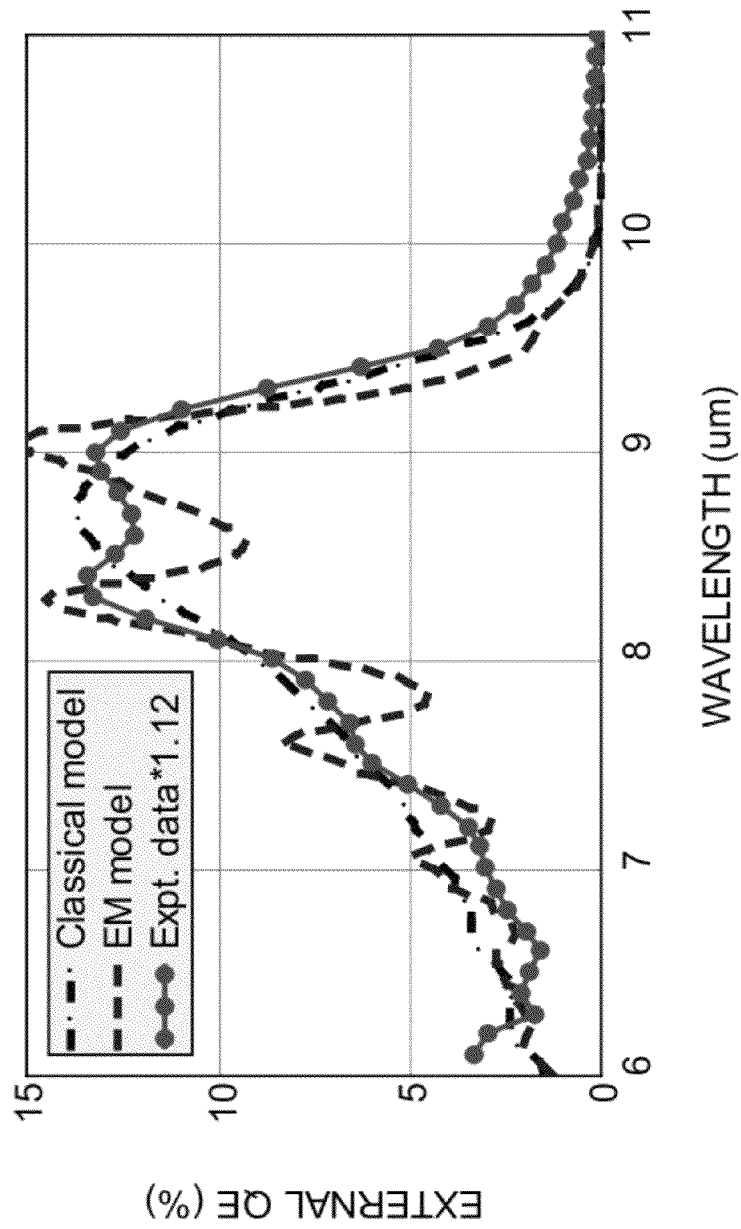
FIG. 28B illustrates the measured QE (of FIG. 28A) multiplied by 1.12 to fit the predicted QE.

FPA#3 is made of 60 periods of 700 Å $Al_{0.23}Ga_{0.73}As$ and 48 Å GaAs, and is doped to $1\times10^{18}$ cm$^{-3}$. The calculated $\alpha$ (of FPA#3) is shown in FIG. 26 with a peak value of ~0.15 cm$^{-1}$. The measured gain (of FPA#3) is shown in FIG. 27. Measured at 2.69 V, the peak CE is 1.1%. Together with g=0.092, the deduced external QE is 12.0% and the internal QE is 20.8%. FIG. 28A shows calculated and measured external QE of PR-QWIP FPA#3. In this case, the QE magnitude between theory and experiment is consistent. One may adjust the data slightly higher (in FIG. 28B, the measured QE is multiplied by 1.12 to fit the predicted QE) to match the theory at the shorter wavelengths as in FIG. 28B. The discrepancy in this case is less than 10%. The oscillatory peaks are again predicted in the correct positions.

GR-QWIP FPA

The example of a GR-QWIP is a cross-grating of waffle type. It is fabricated on a material consisting of 20 periods of 700-Å $Al_{0.168}Ga_{0.832}As$ and 55-Å GaAs QWs, a 1.5-μm top contact layer, and a 1.5-μm common contact layer. The top contact layer is also used for the grating structure. FIG. 31A shows the grating structure that is modeled closely to the actual experimental structure in FIG. 31B. It has a pixel size of 20 μm, a grating period of 4 μm, and a grid line width of 1 μm. The grating height is 0.85 μm, and the size of the gold cover on top of the grating is 18×18 μm².

Figure 30:
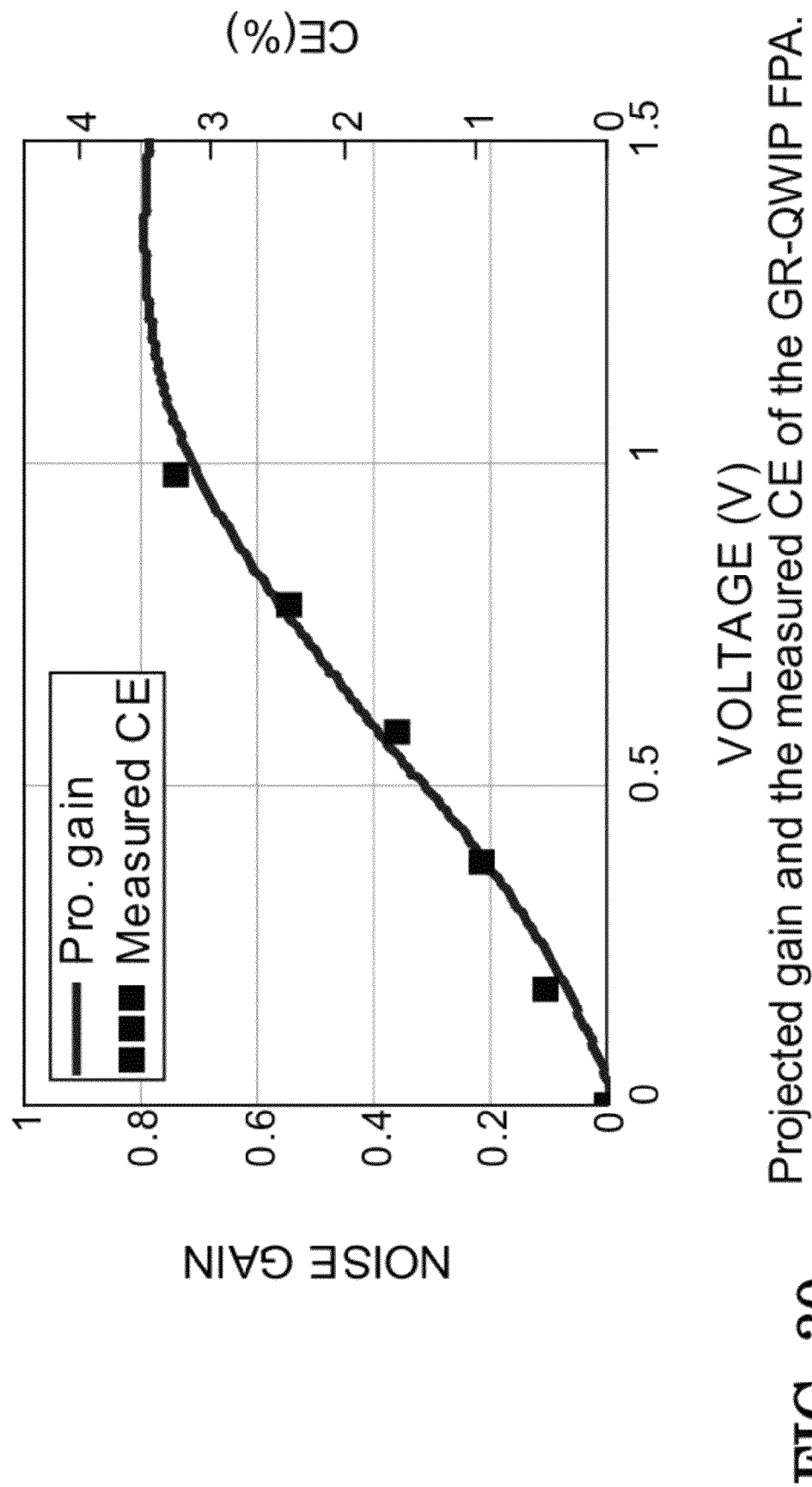
FIG. 30 illustrates the projected gain and the measured CE of the GR-QWIP FPA.

FIG. 29 illustrates the calculated $\alpha$ of the GR-QWIP FPA. FIG. 30 illustrates the projected gain and the measured CE of the GR-QW IP FPA.

Figure 31C:
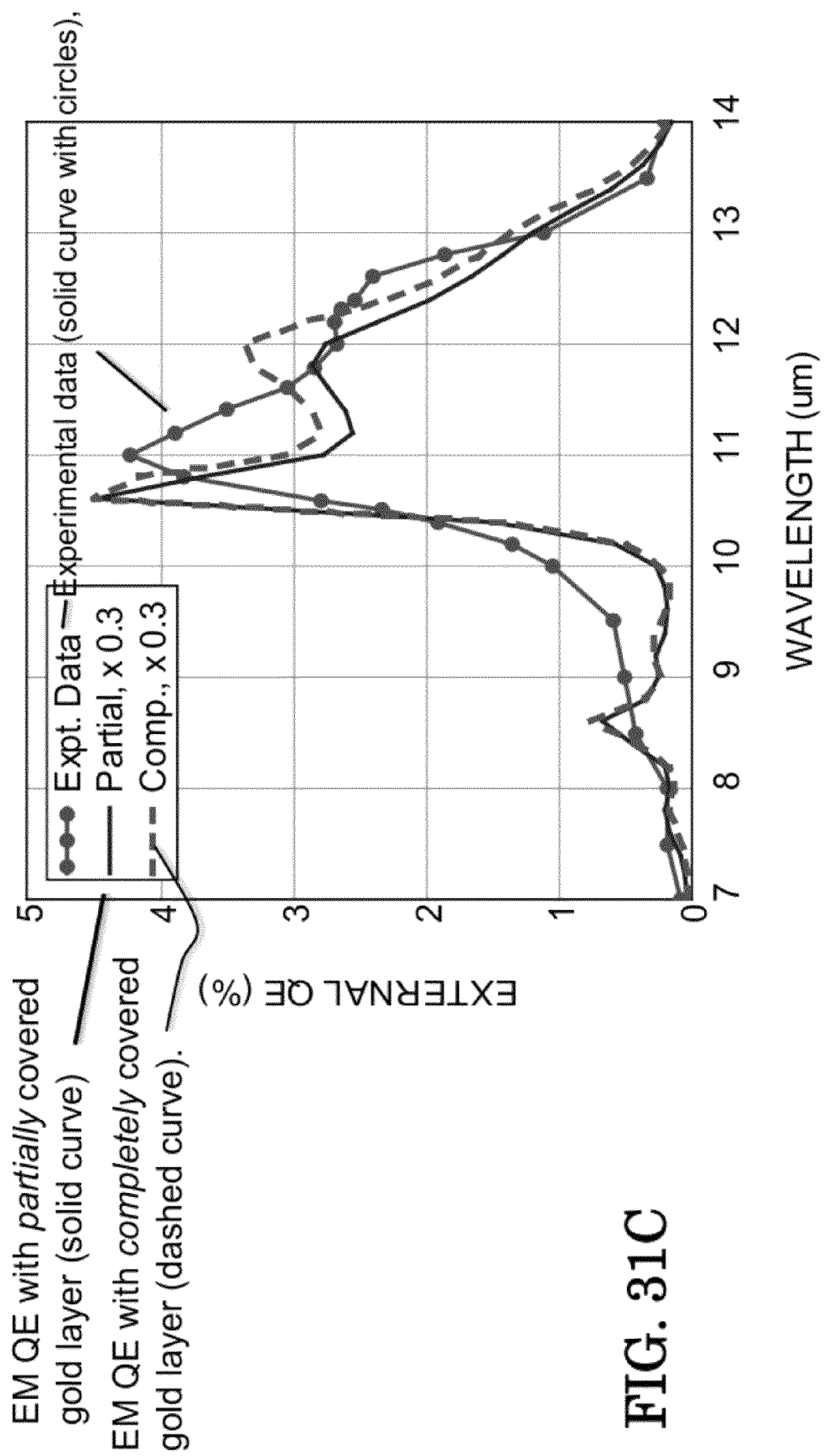
FIG. 31C illustrates the experimental data (solid curve with circles), EM QE with partially covered gold layer (solid curve) and EM QE with completely covered gold layer (dashed curve). The theoretical QE is scaled by a factor of 0.3 to fit the experiment.

At 0.78 V (equivalent to 2.34 V for 60 QWs), the peak CE is 2.41%. Together with g=0.56, the deduced external QE is 4.31% and the internal QE is 7.5%. (Note that the QE of a grating cannot be improved by the usual AR-coating as mentioned before.) FIG. 31C shows the theory and experiment. The theory correctly predicts the three peaks located near 8.5, 11.0, and 12.2 μm. The model with a partial Au cover explains the experimental lineshape better than that with a complete cover, showing that a small detail in the grating design can affect QE appreciably. Even though the present model is able to explain the main feature in the spectrum, the experimental QE is smaller than the modeled QE by a factor of 3.3. This discrepancy is attributed to the fact that the actual grating shown in FIG. 31B has a different sidewall profile. Instead of having vertical sidewalls as modeled, the grid lines have a rounded profile and are depressed in regions away from the intersections. These features diminish the overall size of the grid and, thus, reduce its effectiveness.

Comparison Summary

Figure 32:
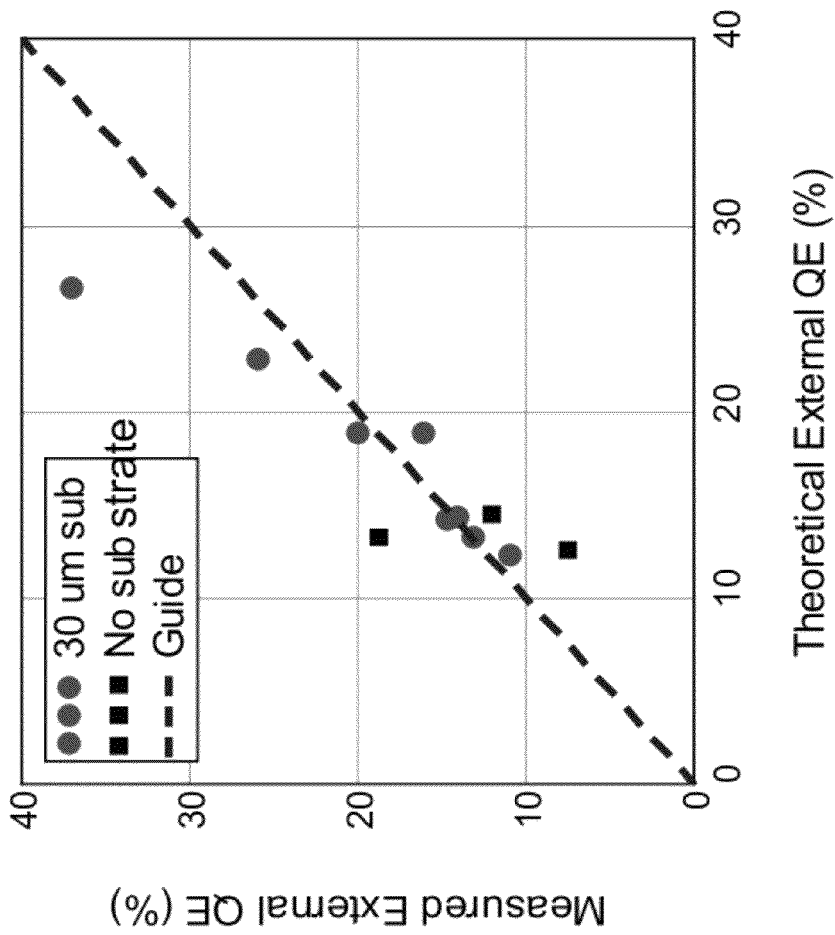
FIG. 32 illustrates a plot of predicted QE versus measured QE for thinned PR-QWIPs (squares) and thick substrate PR-QWIPs (circles).

FIG. 32 summarizes the present results of QE comparison as well as other PR-QWIP FPAs that fabricated with thick substrates, where the classical model applies. Overall, there is general agreement between theory and experiment. In this plot, the ones that have higher QE are those having larger number of QWs (e.g. 108 QWs), higher doping, narrower linewidth, and AR-coating.

FIG. 32 illustrates a plot of predicted QE versus measured QE for thinned PR-QWIPs (squares), thick substrate PR-QWIPs (circles) and GR-QWIPs (diamonds). Several 1-megapixel PY-QWIP FPAs have been fabricated. These FPAs were glued to thick Si wafers by epoxy for mechanical support, and the Si substrate has an AR-coating deposited. EM modeling was performed for this detector configuration but did not account for the infrared absorption spectrum of the glue. FIG. 33A shows the theoretical models and the experimental QE spectrum (in arbitrary units) of one of the FPAs. The EM model reproduces some of the peaks observed in the FPA. The strong experimental dip at 8.0 μm is known to be due to the strong epoxy absorption line at this wavelength. Although the absolute QE of this FPA has not determined, a similar FPA has shown a QE of ~24%, which is consistent with the model and supports the higher theoretical QE for the PY-QWIP geometry. Therefore, the present EM model is also applicable to the PY-QWIP structure. FIG. 33B shows the infrared image taken by the 1-megapixel FPA.

Resonator QWIPs

In the foregoing, the EM model for various detector geometries to within experimental uncertainties was shown, along with a showing of the consistency of the EM model and the classical model whenever the classical model is available. Accordingly, a reliable approach to calculate QE of a detector with any material structure and pixel geometry has been described. This powerful capability is useful for detector applications. One will be able to design all the detector optical properties, without any empirical parameters, before the production begins. At the same time, the EM modeling is also extremely useful in developing a better optical coupling design. It not only provides an instant answer for each particular design but also calculates the corresponding EM field distributions. The field distribution can lead to important insights into the underlying light coupling mechanisms as in the grating coupling case. By treating each pixel as a resonator, one may be able to change the resonator's size and shape so that a different set of cavity eigen modes is created. The excitation of these eigen modes (and their superpositions if they are degenerate) by the incident light will determine the detector QE spectrum.

For example, to yield a broadband resonator, one approach is to construct an irregular resonator, with which a complex excitation spectrum can be generated. One can design a narrow band detector using a more regularly shaped resonator. In this case, the focus will be on designing a strong resonance in a particular wavelength. FIG. 34 shows an example of the resonator-QWIP design, which will be referred as the RS-QWIP. Specifically, FIG. 36 illustrates the $E_z$ distribution at the center plane of the QWIP active layer at incident wavelengths of 7.0, 8.0, 8.8 and 10.0 μm. The incident light is polarized along the diagonal of the pixel. The RS-QWIP contains 9 square rings with inner size of 2.4 μm×2.4 μm and outer size of 5.4 μm×5.4 μm and 0.62 μm in height that are made of GaAs. These ring resonators are fabricated on top of the 1.0 μm thick QWIP material with another 0.8 μm common contact layer. Their centers are 7.5 μm apart. All the top surfaces are covered with metal contact. The pixel size is 23 μm×23 μm. The calculated spectrum has a large QE of 57% centered at 8.8 μm with a 0.6 μm bandwidth as shown in FIG. 35. These coupling characteristics are highly desirable for long wavelength detectors having a cutoff between 9-10 μm. Since this R-QWIP only needs a 1.0 □m-thick active material, it will have the same large gain as the typical grating QWIPs, but now with 10 times higher QE. At the same time, it can be operated at a bias lower than the C-QWIPs and thus more compatible with the usual readout circuits. If successfully demonstrated, this design will have an important impact on the QWIP technology.

Figure 37:
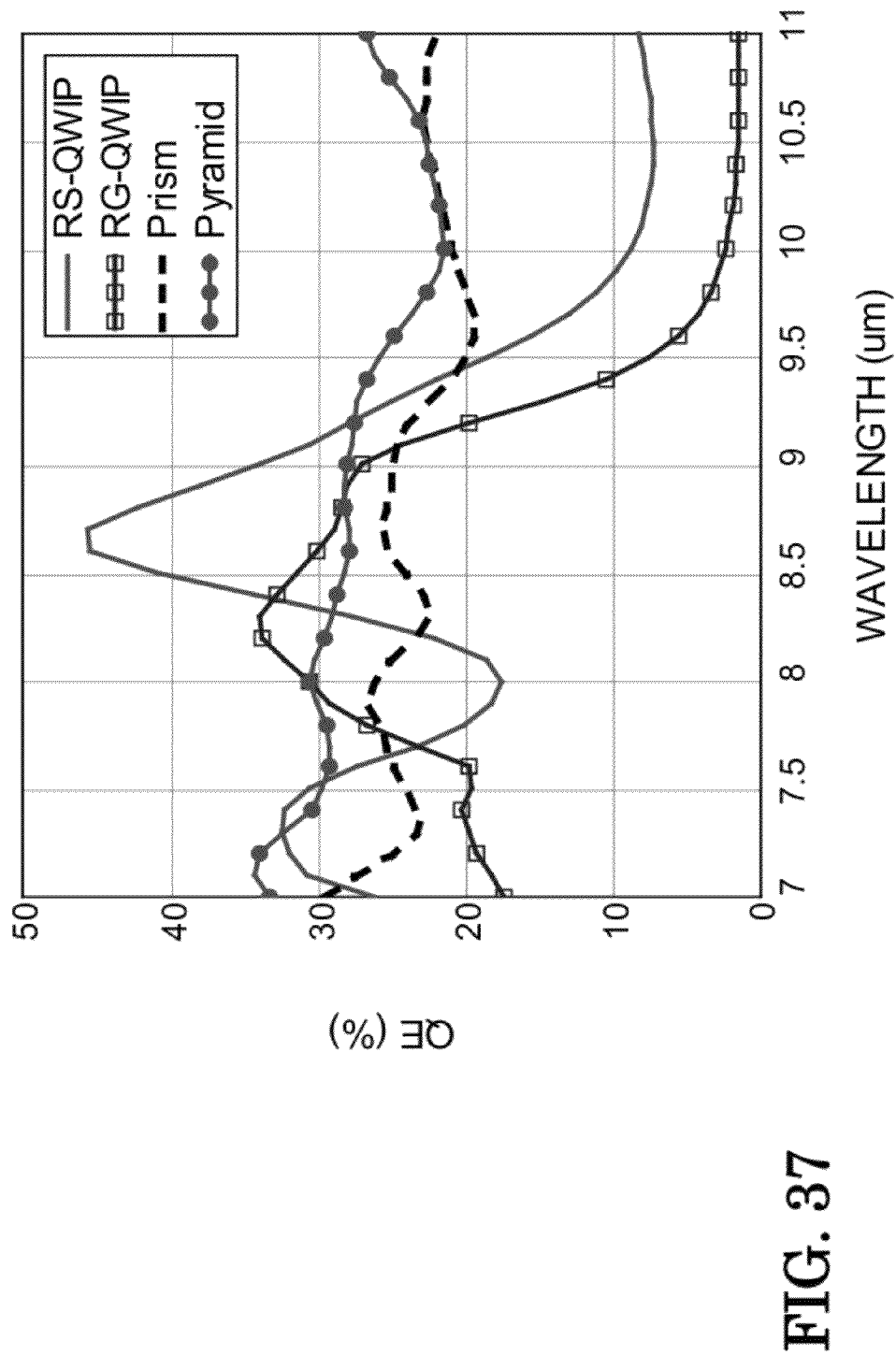
FIG. 37 illustrates the QE of different optimized detectors for 8-9.2 µm detection in a 12-µm pixel pitch array. The α value is assumed to be constant at 0.20 µm$^{-1}$.

To provide another example of optimized detector designs, the objective is to optimize the detector design for an array with 12-μm pixel pitch, and the detection is in the range of 8-9.2 μm. This pitch will be amenable for very high resolution imaging. The value of cc is assumed to be constant at 0.20 μm$^{-1}$. For the RG-QWIP design, the pixel size is 10×10 μm$^2$. In order to yield the first order diffraction peak at ~8.7 μm, a grating period d=2.7 μm is first selected. With p=10 μm, a 4×4 array of posts can be placed on top of the pixel. Other detector parameters, such as h=0.62 μm, $t_{a=1.0}$ μm, and $t_{c=0.8}$ μm are adjusted in the EM model to yield the largest QE possible within the detection range. We found that the QE spectrum and its magnitude are sensitively dependent on all of these parameters at the 0.02 μm level. The best result is shown in FIG. 37. With the proper choices of h, $t_a$, and $t_c$, a relatively constant QE with a peak value of 34% at 8.3 μM can be obtained in the detection range. This level of QE is similar to that in FIG. 18 despite the grating size is drastically reduced from 23 to 10 μm. This example shows the importance of proper grating design. Based on the same active layer thickness, the QE can be further increased by designing a more efficient resonant structure. For example, if the square post pattern of the grating is replaced by a single square ring with the dimension the same as that of FIG. 34 except h=0.54 μm instead of 0.62 μm, the QE can be increased to 46% at 8.7 μm as shown in FIG. 37. This example shows that EM modeling can open up to new detector designs.

A quantitative EM model in calculating QE of a QWIP pixel has been described, which provides an unambiguous answer to any detector geometry and thus it is highly versatile its accuracy and reliability, which has been verified through experiments and analytical classical solutions. Using this approach, one can now be able to ascertain the detector optical performance before construction. This approach not only yields the QE value but also gives the corresponding EM field distribution. This distribution can be used to determine the underlying coupling mechanism and thus is able to point to more efficient structures. The R-QWIP designed in this work is one example that may have significant advantages over the existing designs. In view of the fact that the R-QWIPs are designed with a computer using a few minutes of run time while the existing detectors are developed over the last two decades mostly through empirical means, the speed of achieving a better detector should be greatly accelerated in the future. It should be pointed out that the preferred embodiment designed R-QWIPs are only the first of the many possibilities that been investigated, and its structural parameter space has not been systematically explored. The current theoretical prediction should therefore be considered as the starting point and further improvement is expected. With the present approach, one can also incorporate other more complicated optical structures such as photonic crystals, plasmonic structures, nanomaterials, and meta-materials for QE enhancement. The EM model only requires the input of the appropriate optical constants of the constituent materials and the geometrical design. There are no obstacles in incorporating these and other optical effects into the detector modeling. In addition to advancing the infrared technology, the experimental effort on various optical structures will also shed light on these frontier optical effects and hence contributes to the advancement of basic sciences. The present research is by no means only relevant to QWIP research. By evaluating the total E field integral in Eqn. (1) instead of the $E_z$ integral, one can apply the same formulism to detectors with isotropic absorption.

$$\eta = \frac{1}{P_0} \int_V dI(\vec{r}),$$

$$= \frac{1}{P_0} \int_V \alpha I(\vec{r}) d^3 r,$$

$$= \frac{\alpha}{A_2^{c\varepsilon_0} E_0^2} \int_V \frac{nc\varepsilon_0}{2} |E_z(\vec{r})|^2 d^3 r,$$

$$= \frac{n\alpha}{AE_0^2} \int_V |E_z(\vec{r})|^2 d^3 r.$$

Various resonating structures can then be designed to yield a large QE on thinner detector materials. These thinner materials will benefit all detector technologies especially for those with critical growth thicknesses and those with short carrier recombination lifetimes. To this end, the present advance in EM modeling may open a new chapter not only in the QWIP technology but also in other infrared technologies as well.

It is noted (from U.S. application Ser. No. 12/543,121 that epoxy may be used between the detector and the other wafer. In order that the epoxy not reduce the absorption, a gold layer is utilized to isolate the epoxy from the sidewalls. The thickness of the gold layer may be as thin as 30 Å and may be as thick as 0.1 micron or more. Increasing the thickness of the layer beyond 0.1 micron provides no noticeable effect. Preferably, the gold layer has a thickness in the range of 500 Å to 1000 Å. When the gold layer is thin, R of the p-polarized light in FIG. 6E can be as low as 20%. A substantial amount of light in this case tunnels through the MgF$_2$/Au layer and into the epoxy layer despite the incident angle is still larger than the critical angle. The small R is a case for the frustrated internal reflection. On the other hand, when the dielectric thickness is small, R reaches a minimum at λ=0.54 μm due to the excitation of surface plasmon polaritons on the gold surfaces and is the case for the attenuated internal reflection. Between 0.7<λ<15 μM, a small portion of the reflection is lost to ohmic heating in the metal. When λ is near 16.2 μm, surface phonon polariton absorption along the dielectric/gold interface is responsible for the R minimum. This surface effect is evident from the increased absorption at a small dielectric thickness.

It is further noted that a one-corrugation-per-pixel geometry may be adopted to increase the active detector volume and incorporate a composite cover layer to preserve the large sidewall reflectivity, which results in a large detector quantum efficiency. Also, the detector material structure may be optimized such as the final state energy, the doping density, and the number of quantum well periods to improve the FPA operation under the existing readout electronics. As a result, high FPA sensitivity has been achieved, having characteristics in agreement with the detector model. Based on this model, a systematic analysis on the FPA performance was performed with a wide range of detector and system parameters. C-QWIP FPAs are capable of high speed imaging especially for those with longer cutoff wavelengths.

Possible uses for the present invention include a number of focal plane array (FPA) cameras containing 1024×1024 pixels with uses including detecting unmanned aerial vehicles, ballistic missile intercept observations, thermal imaging infrared sensors that requires broadband infrared detectors, night vision, infrared astronomy, natural resources exploration, industrial quality control, and medical imaging. C-QWIP coupling is also suitable for multi-color detection due to its wavelength-independent light coupling mechanism. As in the case of C-QWIPs, the resonantly enhanced QWIP FPAs may incorporate an epoxy backfill as it is necessary in mating the detector array to the supporting electronic readout circuits. FPAs can also be made into larger formats such as 4 megapixels or 16 megapixels and into two- or multi-color FPAs. Applications include night vision, all weather navigation, infrared astronomy, space exploration, earth resources exploration, environmental protection, geological survey, homeland security, industrial quality control, maintenance and diagnostics, and medical imaging etc. The preferred embodiment increases the quantum efficiency because of the resonance effect for improved performance.

Resonantly enhanced QWIP focal plane arrays (FPAs) are relatively inexpensive due to the standard batch processing, higher in sensitive due to efficient broadband light coupling, and higher in definition due to the smaller pixel size in pixel geometry.

Epoxy Backfill

As reported in U.S. application Ser. No. 12/543,121, the C-QWIP detector is subject to adverse effects from its surroundings. Any material that comes into contact with the detector surfaces will change the sidewall reflectivity and thus the quantum efficiency (QE). In order to achieve high performance irrespective to the production process, a designated cover layer for sidewall encapsulation was invented as described in U.S. application Ser. No. 12/543,121 and K. K. Choi, D. P. Forrai, D. W. Endres and J. Sun, IEEE J. Quant. Elect. vol. 45, No. 10, pp. 1255-1264 (2009), hereby incorporated by reference. The high reflectivity of the invented layer will ensure the high QE of the C-QWIP arrays, while the low leakage of the $MgF_2$ layer will not increase the detector dark current. The high plasmon energy of gold and the low optical phonon energy of $MgF_2$ provide a large wavelength window for high reflectivity of the film. The deposition of the $MgF_2$/Au film is simple, fast and economical, which will not add cost to the array production.

To evaluate the effects of the epoxy materials, which can have a wide range of infrared absorption properties, the sidewall reflectivity is calculated as a function of the complex refractive index of the epoxy N=n+ik, where n is the real part of the refractive index and k is the extinction coefficient. While the typical n for epoxy is 1.5, k can vary within a wide range of values depending on the types of epoxy. For generality, FIG. 4 in U.S. application Ser. No. 12/543,121 shows the calculated sidewall reflectivity R as a function of the extinction coefficient k. R can reduce from 100% to 25% at certain k for the p-polarized light, the polarization component that is responsible for C-QWIP infrared absorption. Therefore, the presence of epoxy can reduce the sidewall reflection by a factor of 4.

In the foregoing, electromagnetic field modeling was applied to calculate the external quantum efficiency of various QWIP pixel geometries with thinned substrates. It was found that for a 24×24×1.5 micron$^3$ cross grating-QWIP, the QE is peaked at 13.0, 11.0 and 8.4 microns, insensitive to the grating periods. These peaks are identified as the first three harmonic resonances associated with the pixel resonant cavity. For a material absorption coefficient of 0.15 $\mu m^{-1}$, the corresponding QEs are 10.2, 12.2, and 3.6%, respectively. For a regular prism-shaped corrugated-QWIP with a 25 micron pitch, the QE oscillates about its classical value of 24.5% within the calculated wavelength range from 3 to 15 microns. A peaked value of 32% occurs at 9.1 microns. For pyramidal C-QWIPs, the maximum QE is 42% and for cone-shaped C-QWIPs, it is 35%. In the presence of an anti-reflection coating, the oscillation amplitude diminishes and the average values generally rise to near the peaks of the oscillations. The modeling results were compared with the experimental data for grating-QWIP FPAs and prism-shaped C-QWIP FPAs, and satisfactory agreements were achieved for both. After verifying this EM approach, other detector geometries were explored and a new type of resonator-QWIPs (R-QWIPs) was found that can provide 30% QE at certain wavelengths. The R-QWIPs only need a 1.5 µm thick active material and therefore have the same advantages as other thin layer detectors. Combining the high QE of a resonator and the high gain of a thin material layer, the new R-QWIPs will provide a conversion efficiency far higher than conventional QWIP detectors. The principles of this resonator approach may also be used with other detector technologies.

Figure 38:
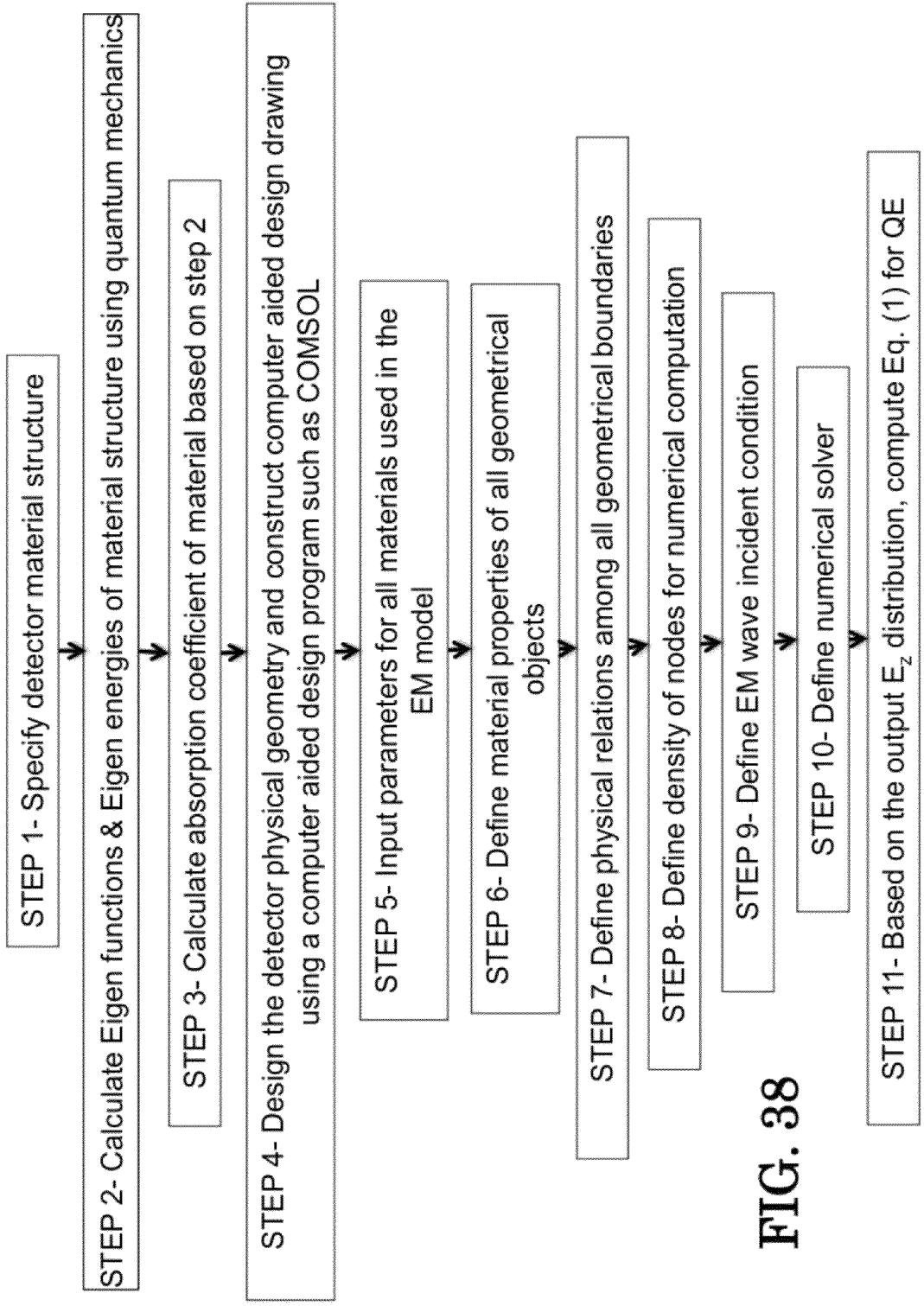
FIG. 38 is a flow chart of a preferred method for determining the efficiency of a photodetector configuration using a three-dimensional finite element electromagnetic computer simulation.

FIG. 38 is a flow chart of a preferred method for determining the efficiency of a photodetector configuration using a three-dimensional finite element electromagnetic computer simulation comprising the following eleven steps.

STEP 1—Specify the detector material structure.

STEP 2—Calculate Eigen functions & Eigen energies of material structure using quantum mechanics.

STEP 3—Calculate absorption coefficient of material based on step 2.

STEP 4—Design the detector physical geometry and construct computer aided design drawing using a computer aided design program such as COMSOL.

STEP 5—Input parameters for all materials used in the EM model.

STEP 6—Define material properties of all geometrical objects.

STEP 7—Define physical relations among all geometrical boundaries.

STEP 8—Define density of nodes for numerical computation.

STEP 9—Define EM wave incident condition.

STEP 10—Define numerical solver.

STEP 11—Based on the output $E_z$ distribution, compute Eq. (1) for QE.

FIG. 39 illustrates step 1 including the following table.

| | | |
|---|---|---|
| 30000 A | GaAs | $1 \times 10^{18}$ cm$^{-3}$ |
| 50 A | AlGaAs (x = 0.230) | undoped |
| 19 Å | GaAs | undoped |
| 24 Å | GaAs | $2 \times 10^{18}$ cm$^{-3}$ |
| 5 Å | GaAs | undoped |

-continued

| 700 Å   | AlGaAs (x = 0.230) | undoped                     |
| ------- | ------------------ | --------------------------- |
| 19 Å    | GaAs               | undoped                     |
| 24 Å    | GaAs               | 2 × 10$^{18}$ cm$^{-3}$     |
| 5 Å     | GaAs               | undoped                     |
| 50 Å    | AlGaAs (x = 0.230) | undoped                     |
| 49200 Å | GaAs               | 1 × 10$^{18}$ cm$^{-3}$     |
| 1000 Å  | AlGaAs (x = 0.3)   | undoped                     |
| 2500 Å  | GaAs               | undoped                     |
|         | GaAs               | S.I. - SUBSTRATE            |

FIG. 40 illustrates step 2; calculation of eigen functions and eigen energies of the material structure. Eigen functions in material layer n may be expressed using the equation $$\Psi = A_n e^{ik_n z} + B_u e^{-ik_z}$$

$A_n$ and $B_n$ of layer n are related to $A_{+1}$ and $B_{+1}$ of the next layer by:

$$\begin{bmatrix} A_n \\ B_n \end{bmatrix} = \frac{1}{2} \begin{bmatrix} (1+\gamma_{n,n+1})e^{i(k_{n+1}-k_n)d_{n,n+1}} & (1-\gamma_{n,n+1})e^{-i(k_{n+1}+k_n)d_{n,n+1}} \\ (1-\gamma_{n,n+1})e^{i(k_{n+1}+k_n)d_{n,n+1}} & (1+\gamma_{n,n+1})e^{-i(k_{n+1}-k_n)d_{n,n+1}} \end{bmatrix} \begin{bmatrix} A_{n+1} \\ B_{n+1} \end{bmatrix} = \frac{1}{2} M_{n,n+1} \begin{bmatrix} A_{n+1} \\ B_{n+1} \end{bmatrix}$$

$$\gamma_{n,n+1} = \frac{m_n^* k_{n+1}}{m_{n+1}^* k_n}$$

where

At an eigen energy, the electron transmission coefficient $T_G(E)$ through all the layers has a local maximum, where $$T_G(E) = \frac{1}{|A_1(E)|^2} \frac{v_p(E)}{v_1(E)} = \frac{2^{2p-2}}{|a_{11}(E)|^2} \frac{m_1^*(E)}{m_p^*(E)} \frac{k_p(E)}{k_1(E)}$$

After identifying all the eigen energies, the corresponding eigen functions can be obtained by putting the energy values back into the second equation.

FIG. 41 illustrates step 3 of the method depicted in the flow chart of FIG. 38; i.e., calculation of absorption coefficient of material based on step 2, including the steps of:

Step 3A—Determine $f_n$—After obtaining $\Psi(E_n)$ in terms of A and B for the nth eigen energy $E_n$ (in Step 2) the oscillator strength $f_p$ is given by $$f_n = \frac{2\hbar}{m*\omega} \left| \left\langle \Psi_n \left| \frac{\partial}{\partial z} \right| \Psi_1 \right\rangle \right|^2, n = 2, 3 \dots$$

Step 3B—Determine $\rho_n(\lambda)$

Due to the layer thickness fluctuation in actual material, the eigen energies have finite energy distributions, which lead to finite energy distribution for each optical transition.

$$\rho_n(\lambda) = \frac{1}{\sqrt{2\pi}\,\sigma} \exp\left[-\frac{1}{2\sigma^2}\left(\frac{hc}{\lambda} - E_n + E_1\right)^2\right]$$

Step 3C Determine $\alpha(\lambda)$
After knowing $f_n$ and $\rho_n$, $\alpha(\lambda)$ is given by $$\alpha(\lambda) = \sum_n \frac{N_D W}{L} \frac{\pi e^2 \hbar}{2\sqrt{\varepsilon_h}\, \varepsilon_0 m * c} f_n \rho_n(\lambda),$$

FIG. 42 illustrates step 4 of the method depicted in the flow chart of FIG. 38; the design the detector physical geometry and construct computer aided design drawing using a computer aided design software, such as for example COMSOL.

FIG. 43 illustrates step 5 of the method depicted in the flow chart of FIG. 38; inputting parameters for all materials used in the EM model. The material properties are inputted such as the relative permittivity $\in_r$, which is related to $\alpha$, the conductivity $\sigma$ and the relative permeability $\mu_4$ of each geometrical subdomain.

FIG. 44 illustrates step 6 of the method depicted in the flow chart of FIG. 38. Other than the absorption properties of the QWIP material, the properties of other geometrical objects, such as the conductivity of the gold metal, can be loaded from a material library in the subdomain setting page.

FIG. 45 illustrates step 7 of the method depicted in the flow chart of FIG. 38, which includes defining all the internal and external boundaries in the geometry based on the known physical principles and symmetries. For example, if the detectors are arranged in a regular array, certain boundaries are in periodic condition. If the wave is expected to propagate out to infinity after leaving the detector material and into top air layer, one should select scattering boundary condition at the top air boundary, which artificially deletes any reflecting waves at that boundary.

FIG. 46 illustrates step 8 of the method depicted in the flow chart of FIG. 38; i.e., defining the maximum element size and other factors that control the density of the mesh. The shorter the optical wavelengths are, the higher the frequency of the spatial variations will be, and the denser the mesh should be. If the mesh is too coarse, a self consistent solution can never be reached or the solution is not accurate enough. If mesh is too dense, there will be too many computations and too much required memory. Optimum density is determined by trial and error.

FIG. 47 illustrates step 9, defining the EM wave incident condition. At the bottom air layer, the incident wave is defined to be traveling normally to that surface. $E_x$ and $E_y$ are defined as 377 V/m. $E_z$ is defined as 0 V/m.

FIG. 48 illustrates step 10; defining the numerical solver. For example, if using a harmonic propagating wave, using wavelength as a parameter in the range of 8 to 10.8 μm in the step of 0.2 μm. It also contains several other pages of settings related to how the numerical computation is proceeded, such as using progressing multi-grids to improve accuracy in each iteration, the maximum number of iterations and the maximum accuracy tolerance, etc.

Figure 49:
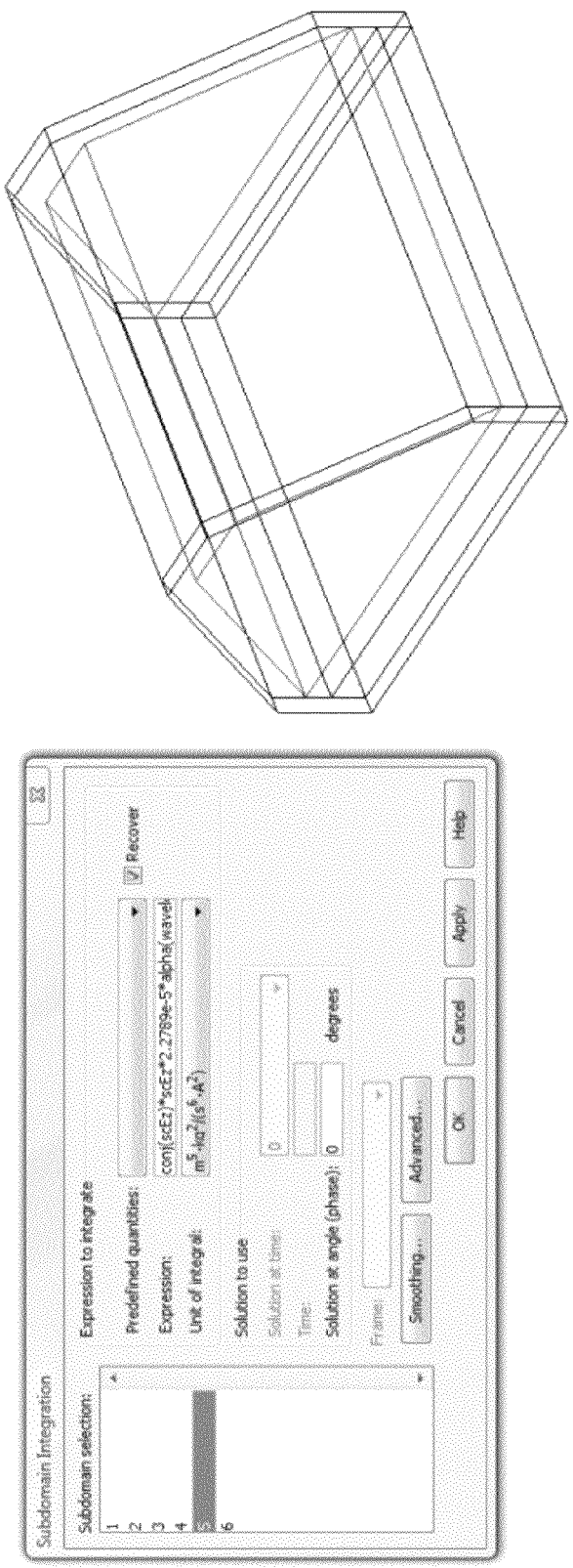
FIG. 49 illustrates step 11 of the method depicted in the flow chart of FIG. 38.

FIG. 49 illustrates step 11; based on the output $E_z$ distribution, computing QE using the equation $$\eta = \frac{n\alpha}{AE_0^2} \int_V |E_z(\vec{r})|^2 d^3 r$$

As used herein, the terminology pixel pitch means the linear spacing allocated to each pixel in a detector array.

As used herein, the terminology mesh means a partition of the geometry model into small units of simple shapes.

As used herein, $E_z$, represents the vertical optical electric field, as depicted for example in FIG. 47.

As used herein, the terminology protuberance means an outward projection of material such as a sharply raised surface, bulge, bump, protrusion or formation extending from the surface.

Although various preferred embodiments of the present invention have been described herein in detail to provide for complete and clear disclosure, it will be appreciated by those skilled in the art, that variations may be made thereto without departing from the spirit of the invention.

It should be emphasized that the above-described embodiments are merely possible examples of implementations. Many variations and modifications may be made to the above-described embodiments. All such modifications and variations are intended to be included herein within the scope of the disclosure and protected by the following claims.

The invention claimed is:

1. A computer implemented method for designing a photodetector utilizing a 3-dimensional simulation comprising:
   selecting a type of material from which to construct a photodetector based upon a desired wavelength or wavelength range to be detected;
   determining at least one configuration geometry for the photodetector;
   determining 3-dimensional electromagnetic field distributions using a computer simulation for the at least one configuration geometry,
   using a computer, determining a quantum efficiency spectrum at the desired wavelength or wavelength range for the at least one configuration geometry; and
   selecting a 3-dimensional configuration geometry based upon the computer determined quantum efficiency spectrum;
   whereby effectiveness of the photodetector is simulated using a computer to perform a 3-dimensional simulation to determine the quantum efficiency spectrum prior to fabrication.

2. The method of claim 1 wherein the electromagnetic field distributions of a plurality of configuration geometries are determined using a computer simulation comprising a 3-dimensional finite element electromagnetic simulation, and wherein quantum efficiencies of the plurality of configuration geometries are determined at a predetermined wavelength range in order to determine an optimal configuration geometry.

3. The method of claim 1 wherein the step of selecting a type of material comprises:
   calculating Eigen values and energies of the material structure; and
   calculating an absorption coefficient of the material based upon the Eigen energies;
and wherein the step of determining a configuration geometry comprises:
   inputting into the computer, parameters for a material to be used;
   defining material properties of all geometrical objects in the configuration geometry;
and
   defining physical relations among all geometrical boundaries.

4. The method of claim 3 wherein the calculating of the absorption coefficient is determined by $$\alpha(\lambda) = \sum_n \frac{N_D W}{L} \frac{\pi e^2 \hbar}{2\sqrt{\varepsilon_h}\,\varepsilon_0 m * c} f_n \rho_n(\lambda)$$

where $N_D$ is doping density, W is well width, L is length of a quantum well period, e is electric charge, h is the Plank's constant, $\varepsilon_h$ is relative permittivity in z direction, $\varepsilon_0$ is permittivity in free space, m* is electron effective mass, c is the speed of light in vacuum, $f_n$ is oscillator strength for optical transition from ground state to nth excited state, and $\rho_n$ is line width of nth optical transition.

5. The method of claim 1 wherein the photodetector is a quantum well infrared photodetector with a GaAs substrate and wherein optical absorption at a particular location is linearly proportional to the light intensity at that location, and wherein light is detected in a wavelength range from 3 to 15 microns and wherein quantum efficiency (η) for a prism-shaped photodetector is determined by $$\eta = \frac{1}{P_0} \int_V dI(\vec{r}),$$
$$= \frac{1}{P_0} \int_V \alpha I(\vec{r}) d^3 r,$$
$$= \frac{\alpha}{A_2^{c\varepsilon_0} E_0^2} \int_V \frac{nc\varepsilon_0}{2} |E_z(\vec{r})|^2 d^3 r,$$
$$= \frac{n\alpha}{A E_0^2} \int_V |E_z(\vec{r})|^2 d^3 r,$$

where $P_o$ is optical power incident normally on a detector area A, V is the detector active volume, I is optical intensity associated with $E_z$, α is absorption coefficient, r is spatial coordinate, n is material reflective index, $\varepsilon_o$ is permittivity of free space, c is the speed of light, $E_0$ is electric field in free space, $E_z$ is electric polarization perpendicular to the layers and wherein quantum efficiency η for a prism-shaped photodetector is determined by $$\eta = t_s \eta_{int} = t_s \frac{1}{p}\left[t + \frac{e^{-\alpha p}}{2\alpha}(1 - e^{2\alpha t})\right]$$

where $t_s$ is substrate transmission coefficient, p is pixel pitch, α is absorption coefficient, t is QWIP material thickness.

6. The method of claim 5 wherein quantum efficiency of the photodetector is calculated from a volume integral of $|E_z|^2$ in presence of a finite α.

7. The method of claim 1 wherein the photodetector has a pyramidal configuration with four inclined sidewalls and quantum efficiency is $$\eta = t_s \frac{\exp(-\alpha p)}{\alpha^2 p^2}\{1 + \alpha p + 2\alpha^2 t(p - t)\exp(\alpha p) + [\alpha(2t - p) - 1]\exp(2\alpha t)\}$$

where $t_s$ is substrate transmission coefficient, p is pixel pitch, α is absorption coefficient, t is QWIP material thickness.

8. The method of claim 1 wherein the selecting of a type of material from which to construct the photodetector comprises calculating Eigen functions & Eigen energies of materials to obtain absorption coefficients of materials and selecting a material based upon absorption characteristics of the material.

9. The method of claim 1 wherein the determining of the electromagnetic field distributions using a computer simulation comprises designing a detector physical geometry on a computer using a three-dimensional computer aided design program; the photodetector comprising components of different materials that are treated as subdomains;
   inputting input parameters of materials for each subdomain used in the computer simulation; and
   defining material properties of subdomains and physical relations between boundaries of the sub domains.

10. The method of claim 1 wherein the determining of a quantum efficiency spectrum at the desired wavelength or wavelength range for the at least one configuration geometry comprises using the electromagnetic field distributions for a plurality of configurations and computing the quantum efficiency for a plurality of configurations.

11. The method of claim 1 wherein the determining a quantum efficiency spectrum at the desired wavelength or wavelength range for the at least one configuration geometry comprises integrating the electromagnetic field according to a formula $$\eta = \frac{n\alpha}{AE_0^2} \int_V |E_z(\vec{r})|^2 d^3r$$

where n is refractive index of the detector material, "alpha" is absorption coefficient of detector material, A is detector area, $E_0$ is incident electric field of light in free space, V is detector active volume, $E_z$ is electric field vertical to the material layers, r is spatial coordinate; and wherein to solve for $E_z$ numerically a numerical finite element solver is utilized.

* * * * *